United States Patent
Frey et al.

(10) Patent No.: US 10,420,207 B2
(45) Date of Patent: *Sep. 17, 2019

(54) PATTERNED SUBSTRATES WITH DARKENED CONDUCTOR TRACES

(71) Applicant: 3M INNOVATIVE PROPERTIES COMPANY, St. Paul, MN (US)

(72) Inventors: Matthew H. Frey, Cottage Grove, MN (US); Ta-Hua Yu, Woodbury, MN (US); Kari A. McGee, New Brighton, MN (US); Hui Luo, Woodbury, MN (US); William B. Kolb, Stillwater, MN (US); Brant U. Kolb, Afton, MN (US); Moses M. David, Woodbury, MN (US); Lijun Zu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 136 days.

This patent is subject to a terminal disclaimer.

(21) Appl. No.: 15/636,264

(22) Filed: Jun. 28, 2017

(65) Prior Publication Data

US 2017/0303393 A1    Oct. 19, 2017

Related U.S. Application Data

(63) Continuation of application No. 13/979,710, filed as application No. PCT/US2012/023466 on Feb. 1, 2012, now Pat. No. 9,736,928.

(60) Provisional application No. 61/438,800, filed on Feb. 2, 2011.

(51) Int. Cl.
| | |
|---|---|
| *B82Y 99/00* | (2011.01) |
| *H05K 1/09* | (2006.01) |
| *H05K 1/02* | (2006.01) |
| *H05K 9/00* | (2006.01) |
| *H05K 3/06* | (2006.01) |
| *H05K 3/46* | (2006.01) |
| *G06F 3/041* | (2006.01) |
| *G02B 1/116* | (2015.01) |
| *G02B 27/14* | (2006.01) |
| *H05K 1/03* | (2006.01) |
| *B82Y 20/00* | (2011.01) |
| *B82Y 30/00* | (2011.01) |
| *H03K 17/96* | (2006.01) |

(52) U.S. Cl.
CPC .......... *H05K 1/0274* (2013.01); *G02B 1/116* (2013.01); *G02B 27/142* (2013.01); *G06F 3/041* (2013.01); *H05K 1/0306* (2013.01); *H05K 1/09* (2013.01); *H05K 3/061* (2013.01); *H05K 3/4644* (2013.01); *H05K 9/0096* (2013.01); *B82Y 20/00* (2013.01); *B82Y 30/00* (2013.01); *B82Y 99/00* (2013.01); *H03K 17/962* (2013.01); *H05K 9/0086* (2013.01); *H05K 2201/0108* (2013.01); *H05K 2201/09681* (2013.01); *Y10S 977/755* (2013.01)

(58) Field of Classification Search
None
See application file for complete search history.

(56) References Cited

U.S. PATENT DOCUMENTS

| | | | |
|---|---|---|---|
| 2,445,962 | A | 7/1948 | Mell |
| 4,767,964 | A | 8/1988 | McGlothlan |
| 5,694,701 | A | 12/1997 | Huelsman |
| 6,030,708 | A | 2/2000 | Ishibashi |
| 6,297,811 | B1 | 10/2001 | Kent |
| 6,522,375 | B1 | 2/2003 | Jang et al. |
| 7,032,324 | B2 | 4/2006 | Kolb |
| 7,129,935 | B2 | 10/2006 | Mackey |
| 7,288,946 | B2 | 10/2007 | Hargreaves |
| 7,368,161 | B2 | 5/2008 | McGurran |
| 7,883,837 | B2 | 2/2011 | Yamada et al. |
| 8,933,906 | B2 * | 1/2015 | Frey .................. G06F 3/041 345/174 |

(Continued)

FOREIGN PATENT DOCUMENTS

| | | |
|---|---|---|
| CN | 101887324 | 11/2010 |
| EP | 1781077 | 5/2007 |

(Continued)

OTHER PUBLICATIONS

Brown, "The physical and chemical properties of electroless nickel-phosphorus alloys and low reflectance nickel-phosphorus black surfaces", J. Mater. Chem., 2002, vol. 12, No. 9, pp. 2749-2754.

(Continued)

*Primary Examiner* — Sheeba Ahmed
(74) *Attorney, Agent, or Firm* — Clifton F. Richardson

(57) ABSTRACT

The present disclosure provides an article having a substrate having a first nanostructured surface and an opposing second surface; and a conductor micropattern disposed on the first surface of the substrate, the conductor micropattern formed by a plurality of traces. The micropattern may have an open area fraction greater than 80%. The traces of the conductor micropattern may have a specular reflectance in a direction orthogonal to and toward the first surface of the substrate of less than 50%. The nanostructured surface may include nanofeatures having a height from 50 to 750 nanometers, a width from 15 to 200 nanometers, and a lateral spacing from 5 to 500 nanometers. The articles are useful in devices such as displays, in particular, touch screen displays useful for mobile hand held devices, tablets and computers. They also find use in antennas and for EMI shields.

20 Claims, 20 Drawing Sheets

(56) References Cited

U.S. PATENT DOCUMENTS

| | | | |
|---|---|---|---|
| 9,320,136 B2* | 4/2016 | Frey | H05K 9/0096 |
| 9,736,928 B2* | 8/2017 | Frey | H05K 9/0096 |
| 2002/0130605 A1 | 9/2002 | Muellner | |
| 2002/0145797 A1 | 10/2002 | Sales | |
| 2004/0041795 A1 | 3/2004 | Lin et al. | |
| 2006/0267485 A1 | 11/2006 | Wood et al. | |
| 2007/0229817 A1 | 10/2007 | Wang | |
| 2008/0062140 A1 | 3/2008 | Hotelling | |
| 2008/0212921 A1 | 9/2008 | Gaylord et al. | |
| 2009/0030084 A1 | 1/2009 | Kurosu | |
| 2009/0194344 A1 | 8/2009 | Harley | |
| 2009/0213367 A1 | 8/2009 | Green | |
| 2009/0218310 A1 | 9/2009 | Zu | |
| 2009/0219257 A1 | 9/2009 | Frey | |
| 2009/0219258 A1 | 9/2009 | Geaghan | |
| 2009/0316417 A1 | 12/2009 | Chari | |
| 2010/0028564 A1 | 2/2010 | Cheng | |
| 2010/0040842 A1 | 2/2010 | Everaerts | |
| 2010/0073323 A1 | 3/2010 | Geaghan | |
| 2010/0123670 A1 | 5/2010 | Philipp | |
| 2010/0136265 A1 | 6/2010 | Everaerts | |
| 2010/0136288 A1 | 6/2010 | Tanaka et al. | |
| 2010/0156840 A1 | 6/2010 | Frey | |
| 2010/0165469 A1 | 7/2010 | Hwang | |
| 2010/0170710 A1 | 7/2010 | Sasaki | |
| 2010/0180428 A1 | 7/2010 | Jones et al. | |
| 2010/0300729 A1 | 12/2010 | Matsuda | |
| 2010/0300773 A1 | 12/2010 | Cordeiro | |
| 2010/0302201 A1 | 12/2010 | Ritter | |
| 2010/0310875 A1 | 12/2010 | Hao | |
| 2010/0328248 A1 | 12/2010 | Mozdzyn | |
| 2011/0007011 A1 | 1/2011 | Mozdzyn | |
| 2011/0014878 A1 | 1/2011 | Choudhury | |
| 2011/0069029 A1 | 3/2011 | Ryu | |
| 2011/0089160 A1 | 4/2011 | Kuriki | |
| 2011/0095997 A1 | 4/2011 | Philipp | |
| 2011/0102361 A1 | 5/2011 | Philipp | |
| 2011/0111182 A1 | 5/2011 | Stay | |
| 2011/0124252 A1 | 5/2011 | Shimomura et al. | |
| 2011/0310489 A1 | 12/2011 | Kajiya | |
| 2012/0105385 A1 | 5/2012 | Sasagawa | |
| 2012/0162232 A1 | 6/2012 | He | |

FOREIGN PATENT DOCUMENTS

| | | |
|---|---|---|
| EP | 2278850 | 1/2011 |
| EP | 2286992 | 2/2011 |
| JP | 2006-339526 | 12/2006 |
| JP | 2006-344163 | 12/2006 |
| JP | 2007-308761 | 11/2007 |
| JP | 2007-335729 | 12/2007 |
| JP | 2008-117955 | 5/2008 |
| JP | 2009-212545 | 9/2009 |
| JP | 2010-108878 | 5/2010 |
| JP | 2010-160927 | 7/2010 |
| JP | 2010-186566 | 8/2010 |
| JP | 2010-205432 | 9/2010 |
| KR | 2010-048931 | 5/2010 |
| KR | 2010-048932 | 5/2010 |
| KR | 2010-0080368 | 7/2010 |
| WO | WO 2003-094253 | 11/2003 |
| WO | WO 2003-105248 | 12/2003 |
| WO | WO 2005-121940 | 12/2005 |
| WO | WO 2008-128073 | 10/2008 |
| WO | WO 2009-108765 | 9/2009 |
| WO | WO 2009-114683 | 9/2009 |
| WO | WO 2009-139458 | 11/2009 |
| WO | WO 2009-142150 | 11/2009 |
| WO | WO 2010-07871 | 1/2010 |
| WO | WO 2010-013679 | 2/2010 |
| WO | WO 2010-019528 | 2/2010 |
| WO | WO 2010-078346 | 7/2010 |
| WO | WO 2010-099132 | 9/2010 |
| WO | WO 2011-002617 | 1/2011 |
| WO | WO 2011-069114 | 6/2011 |
| WO | WO 2007-114196 | 10/2011 |
| WO | WO 2011-139593 | 11/2011 |
| WO | WO 2012-106424 | 8/2012 |
| WO | WO 2013-106241 | 7/2013 |
| WO | WO 2013-116103 | 8/2013 |

OTHER PUBLICATIONS

Cho, "A Black Metal-dielectric Thin Film for High-contrast Displays", Journal of Korean Physical Society, Aug. 2, 2009, vol. 55, No. 2, pp. 501-507.

Cui, "The physical and electrochemical properties of electroless deposited nickel-phosphorus black coatings", Surface & Coatings Technology, Aug. 1, 2006, vol. 200, No. 24, pp. 6808-6814.

Hsiao, "Antireflection coating on metallic substrates for solar energy and display applications", Proceedings of SPIE, Jan. 2011, vol. 7786, pp. 77860N-1-77860N-9.

Krasnov, "High-contrast organic light-emitting diodes on flexible substrates", Applied Physics Letters, May 20, 2002, vol. 80, No. 20, pp. 3853-3855.

Layani, "Transparent Conductive Coatings by Printing Coffee Ring Arrays Obtained at Room Temperature", ACS Nano, 2009, vol. 3, No. 11, pp. 3537-3542.

Poitras, "Black Layer Coatings for the Photolithographic Manufacture of Diffraction Gratings", Applied Optics, Jun. 2002, vol. 41, No. 16, pp. 3306-3311.

Schönberger, "Large-area fabrication of stochastic nano-structures on polymer webs by ion- and plasma treatment", Surface and Coatings Technology, Jul. 25, 2011, vol. 205, Supplement 2, pp. S495-S497.

Wendling, "Creating Anti-Reflective Nanostructures on Polymers by Initial Layer Deposition before Plasma Etching", Plasma Processes and Polymers, Jun. 2009, vol. 6, No. 1, pp. S716-S-721.

International Search Report for PCT International Application No. PCT/US2012/023466, dated Aug. 7, 2012, 4 pages.

* cited by examiner

PATTERNED SUBSTRATES WITH DARKENED CONDUCTOR TRACES

CROSS REFERENCE TO RELATED APPLICATION

This application is a continuation of U.S. patent application Ser. No. 13/979,710, which claims the benefit of U.S. Provisional Patent Application No. 61/438,800, filed Feb. 2, 2011, the disclosure of which is incorporated by reference herein in its entirety. This application is related to assignee's U.S. Provisional Patent Application No. 61/593,666, filed Feb. 2, 2011 which is incorporated by reference in its entirety.

BACKGROUND

The use of metal-based conductor mesh for application where light transmission and electrical conductance are needed is known in the art. Examples of such applications include shielding for electromagnetic interference for displays. In the industry, a mesh is typically understood to mean a pattern geometry having connected traces that are separated by open area to form cells.

It has been observed in the current work that some mesh designs, when integrated into a display and viewed under reflected, collimated light (such as in direct sunlight), may produce undesirable visual effects. Illustrative undesirable visual effects include, e.g., a starburst pattern for reflected light and bands of colored reflected light (similar to a rainbow) caused by light interference, each being observable when a mesh containing linear traces and a repeating cell geometry is disposed an unmodified substrate, such as a plastic film or glass. Illustrative examples of meshes with linear traces include those having hexagonal and square cells. Sparkle, which is an undesirable visual appearance of points of reflected light, can also appear for linear traced-based conductor meshes.

Some skilled in the art have attempted to reduce the visual appearance of overlaid mesh micropatterns by using wavy traces in producing a display, such as a touch screen display. See, e.g., PCT International Publication No. WO 2010/099132 A2 describing articles such as antennas, electromagnetic interference shields and touch screen sensors having a light transparent substrate and two conductive meshes, each having linear traces, where the first mesh overlays a second mesh in a certain configuration so as to minimize the traces' visibility.

Others have attempted to use ambient light reducing members such as an optical interference member. See PCT International Publication No. WO 2003/105248 disclosing an optical interference member including a semi-absorbing member layer for reflecting a portion of incident ambient light, a substantially transparent layer for phase shifting another portion of ambient light and a reflective layer for reflecting the phase shifted ambient light such that the two reflected portions of light are out-of-phase and thereby destructively interfere.

SUMMARY

There is a desire to improve the visual appearance of the metal-based conductor meshes, in terms of reducing their visibility, when the mesh is integrated into a display and viewed under reflected, collimated light, such as in direct sunlight.

The present disclosure provides articles using substrates having nanostructured surface in combination with designs of conductor micropatterns. When integrated into a display or device, the combination reduces the undesirable visual effects, such as starburst, sparkle, halo and rainbow, when the display or device is viewed under light, including but not limited to collimated or nearly collimated light, such as sunlight.

Useful substrates have a nanostructured surface formed by several methods discussed herein. These methods include reactive ion etching a first major surface of the substrate or forming a structured particulate coating on a major surface of the substrate. Useful conductor micropattern designs include those having linear traces and non-linear traces, or those having non-repeating cells, or those where the cells of the micropattern do not lie on an array or those that have a uniform distribution of trace orientation, which are described herein.

In one aspect, the present disclosure provides for an article comprising: (a) a substrate having a first nanostructured surface that is antireflective when exposed to air and an opposing second surface and (b) a metallic conductor disposed on the first surface of the substrate, the conductor formed by a plurality of traces defining a plurality of open area cells, wherein each cell has an open area fraction greater than 80% and a uniform distribution of trace orientation, wherein the traces of the conductor have a specular reflectance in a direction orthogonal to and toward the first surface of the substrate of less than 50%, and wherein each of the traces has a width from 0.5 to 10 micrometer.

In another aspect, the present disclosure provides for an article comprising a transparent substrate having a first nanostructured surface and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness of greater than 50 nanometers.

In yet another aspect, the present disclosure provides a method of making a micropattern comprising the steps of: (a) providing a substrate having a first surface and an opposing second surface; (b) modifying the first surface of the substrate to include nanofeatures having a height from 50 to 750 nanometers, a width from 15 to 200 nanometers, and a lateral spacing from 5 to 500 nanometers conductor with an average thickness of greater than 50 nanometers; (c) depositing a metallic conductor on the first surface including the nanofeatures; (d) printing a self-assembled monolayer micropattern on the conductor using an elastomeric stamp; and (e) etching the conductor not covered by the self-assembled monolayer micropattern to yield a conductor micropattern according to the self-assembled monolayer micropattern.

In yet another aspect, the present invention provides an article comprising a transparent substrate having a first nanostructured surface and a conductor in the form of a micropattern disposed on the first nanostructured surface; wherein the first nanostructured surface comprises nanofeatures having a height from 75 to 250 nanometers, a width from 15 to 150 nanometers, and a lateral spacing from 10 to 150 nanometers; wherein the metallic conductor has an average thickness of greater than 50 nanometers; wherein the micropattern is formed by a plurality of traces defining a plurality of open area cells; wherein the micropattern has an open area fraction greater than 80%; wherein each of the traces has a width from 0.5 to 3 micrometers; wherein the nanostructured surface comprises a matrix and a nanoscale dispersed phase; wherein the nanoscale dispersed phase comprises nanoparticles having particle size from 10 to 250 nanometers; and wherein the nanoparticles are present in the matrix at a volume percent from 10 to 75%.

BRIEF DESCRIPTION OF THE DRAWINGS

The disclosure can be further described with reference to the following drawings, wherein.

Figure 1:
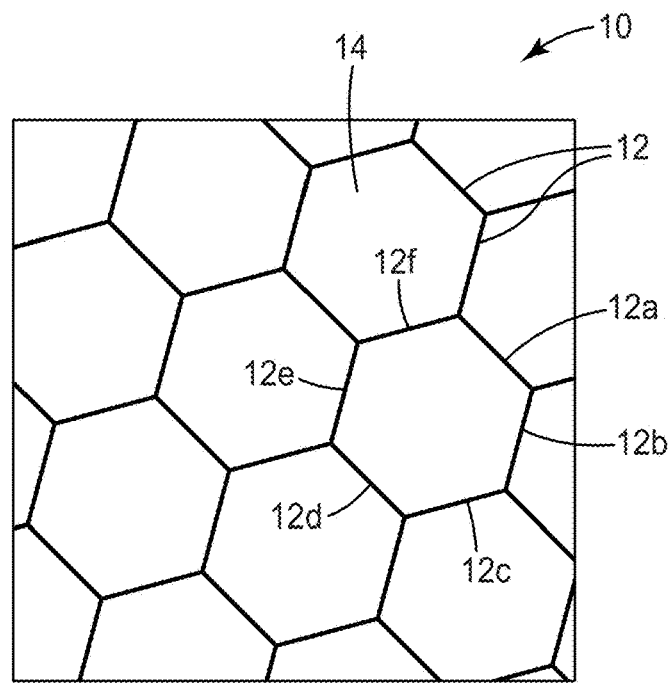
FIG. 1 is a top plan view of a schematic of a regular hexagonal micropattern.

These figures are not drawn to scale and are intended for illustrative purposes.

DETAILED DESCRIPTION

Unless otherwise indicated, all numbers expressing feature sizes, amounts and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art using the teachings disclosed herein.

The recitation of numerical ranges by endpoints includes all numbers within that range (e.g., 1 to 5 includes, 1, 1.5, 2, 2.75, 3, 3.80, 4 and 5) and any range within that range.

As used herein "micropattern" refers to an arrangement of dots, traces, filled shapes, or a combination thereof, each having a dimension (e.g. trace width) of no greater than 1 mm. In preferred embodiments, the micropattern is a mesh formed by a plurality of traces defining a plurality of cells, each trace having a width of at least 0.5 microns and typically no greater than 20 microns. The dimension of the micropattern features can vary depending on the micropattern selection. In some favored embodiments, the micropattern feature dimension (e.g. trace width) is less than 10, 9, 8, 7, 6, or 5 micrometers (e.g. 1 to 3 micrometers). Linear and non-linear traces are useful in the present disclosure.

As used herein, "visible light transparent" refers to the level of transmission of the unpatterned substrate or of the article comprising the micropatterned substrate being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or traces with minimum dimension, e.g. width, between 0.5 and 10 micrometers, between 0.5 and 5 micrometers, or between 1 and 5 micrometers) that block light locally to less than 60 percent transmission (e.g., 0 percent); however, in such cases, for an approximately equiaxed area including the microscopic feature and measuring 1000 times the minimum dimension of the microscopic feature in width, the average transmittance is greater than 60 percent. The term "visible" in connection with "visible light transparent" is modifying the term "light," so as to specify the wavelength range of light for which the substrate or micropatterned article is transparent.

As used herein, "open area fraction" (or open area or percentage of open area) of a conductor micropattern, or region of a conductor micropattern, is the proportion of the micropattern area or region area that is not shadowed by the conductor. The open area is equal to one minus the area fraction that is shadowed by the conductor micropattern, and may be expressed conveniently, and interchangeably, as a decimal or a percentage. Area fraction that is shadowed by conductor micropattern is used interchangeably with the density of a conductor micropattern (e.g., density of traces that define a mesh). Illustrative open area fraction values useful in the present disclosure are those greater than 50%, greater than 75%, greater than 80%, greater than 90%, greater than 95%, greater than 96%, greater than 97%, greater than 98%, greater than 99%, 99.25 to 99.75%, 99.8%, 99.85%, 99.9% and even 99.95. In some embodiments, the open area of a region of the conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

As used herein, "trace" refers to the geometric element given by the intersection of two planes or by the intersection of a plane and a non-planar surface. The geometric element given by the intersection of two planes is described herein as linear (or, as a linear trace). The geometric element given by the intersection of a plane and a non-planar surface is described herein as non-linear (or, as a non-linear trace). A linear trace has zero curvature, or stated differently it has infinite radius of curvature. A non-linear trace has non-zero curvature, or stated differently it has a finite radius of curvature. Curvature or radius of curvature can be determined for any point along a trace, as is known in analytic geometry. Also, a normal can be constructed at a point that lies on a linear or non-linear trace, as is also known in analytic geometry.

As used herein, "antireflective" refers to the behavior of a surface or coating that reduces Fresnel light reflection at the interface between a material and a surrounding medium to which the material is exposed, and enhances light transmission through the interface. When the medium surrounding a material is air, and the surface or coating reduces the reflection at the interface that the material makes with air, such surfaces are described herein to be antireflective when exposed to air. In the absence of an antireflective surface or coating, Fresnel reflection is governed by the difference between refractive indices of the material and the surrounding medium, as is known in the art.

As used herein, "nanostructured" refers to a surface that includes topography in the form of nanofeatures, wherein the nanofeatures comprise material that define the surface, and wherein at least one of the height of nanofeatures or the width of nanofeatures is less than about a micron (i.e., a micrometer, or 1000 nanometers).

Micropattern Designs

A number of different geometries or designs can be used for conductor micropatterns useful for present disclosure. The classes of mesh micropattern design include: (A) those with repeating cell geometry, (B) those with non-repeating cell geometry, (C) those with cells having centroids that do not lie on a repeating array, (D) those that have cells where the traces have a uniform distribution of trace orientation. These classes are not mutually exclusive. Within each of these classes, the traces can be linear or non-linear (i.e., having some finite radius of curvature). The mesh micropatterns described below are not limited with respect to the width of traces or the sizes of cells. In some embodiments, the traces have a width in the range of 0.1 to 20 micrometers, in some embodiments in the range of 0.5 to 10 micrometers, in some embodiments in the range of 0.5 to 5 micrometers, in some embodiments in the range of 0.5 to 4 micrometers, in some embodiments in the range of 0.5 to 3 micrometers, in some embodiments in the range of 0.5 to 2 micrometers, in some embodiments from 1 to 3 micrometers, in some embodiments in the range of 0.1 to 0.5 micrometers. In some embodiments, the open area of a region of the mesh conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

(A) Micropatterns with Repeating Cells

A characteristic of repeating cell geometries is that the cells lie on a repeating array. For cells to lie on a repeating array, what meant is that the centroids of the cells lie no greater than a short distance away from positions that define the array (under the limit that there be only one array position per cell). This description of the positional relationship of cells focuses on the open areas (or openings) of the mesh cells, not on the traces or the trace junctions (vertices) of the mesh. In some instances where cells lie on a repeating array, the centroids of the cells lie precisely on the array of points (i.e., positions). By arrays, what is meant is an arrangement of positions in two-dimensions (i.e., in the plane of the micropattern) characterized by discrete translational symmetry for a unit cell comprising no more than positions. The translational symmetry of the array is defined in terms of one or more basis vectors that define the minimum translation within the plane of the micropattern over which the array is invariant. In this context, arrays can include square arrays (or square lattices), rectangular arrays (or rectangular lattices), or triangular arrays (or triangular lattices), for example. By a short distance, as this term relates to the allowance for centroids of a mesh comprising cells that are described herein to lie on a repeating array to be displaced from the precise positions of the array, what is meant is a distance less than 50% of the value given by taking the length of the shortest array basis vector that can be constructed in the orientation of the displacement and dividing that length by the number of array positions in the unit cell that is associated with that basis vector. In some embodiments where the cells lie on a repeating array, the distance by which the centroids are displaced from the positions of the array is less than 25% of the value given by taking the length of the shortest array basis vector that can be constructed in the orientation of the displacement and dividing that length by the number of array positions in the unit cell that is associated with that basis vector. Illustrative examples of these types of micropatterns are shown in FIGS. 1, 3, 4 and 14.

Turning now to the figures, FIG. 1 shows a top plan view of an illustrative geometry of a regular hexagonal conductor micropattern 10 that is formed by a plurality of linear traces 12. Six traces, 12a through 12f, form a cell 14 having an open area. As shown, each trace is of substantially equal length and each of the six internal angles is of substantially 120°. The centroids of the mesh cells lie on a triangular lattice (or array). The distance from the centerline of a trace defining one edge of the hexagonal cell to the centerline of the (parallel) trace defining the opposite edge of the hexagonal cell is, for example, 200 micrometers.

Figure 3:
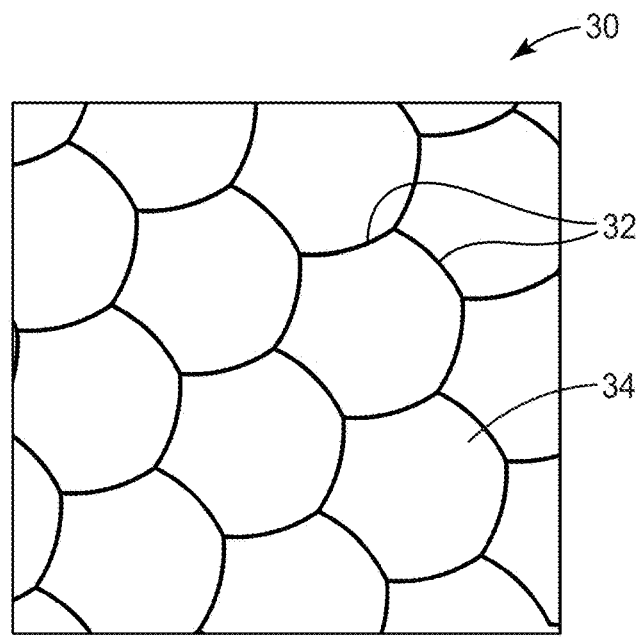
FIG. 3 is a top plan view of a schematic of a first illustrative non-linear micropattern design, based on a regular hexagon, and referred to herein as a partially curved hexagon micropattern.
Figure 3A:
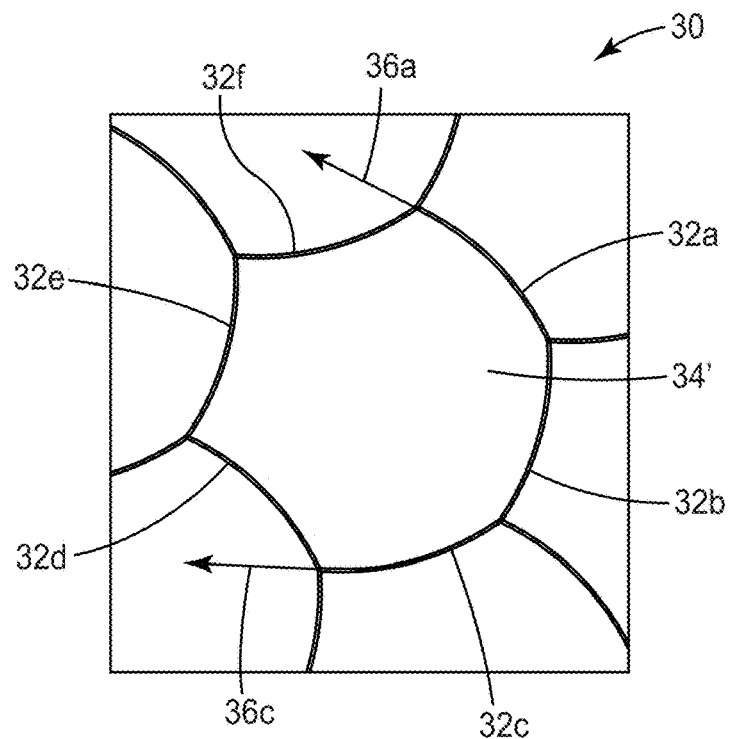
FIG. 3a is an exploded view of a few cells of the micropattern of FIG. 3.

FIG. 3 shows a top plan view of an illustrative geometry of a non-linear design, i.e., a partially curved hexagonal conductor micropattern 30 formed by a plurality of curved traces 32 defining a plurality of open area cells 34. In one method, this micropattern design can be generated starting from the regular hexagonal micropattern design shown in FIG. 1 and displacing the midpoint of each trace by some distance, e.g., by 10 micrometers, and allowing the trace to bow. FIG. 3a shows a magnified cell 34' with six traces, 32a through 32f shown. One characteristic of the micropattern 30 is that tangents 36a and 36c for traces 32a and 32c respectively are generally not parallel to one another. Similarly to the mesh micropattern of FIG. 1, the centroids of the mesh cells of FIG. 3 lie on a triangular lattice of points (i.e., array of points).

Figure 4:
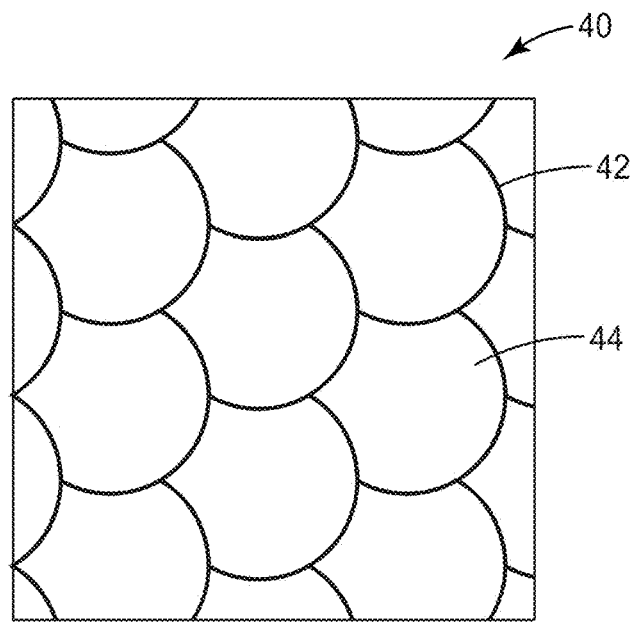
FIG. 4 is a top plan view of a schematic of a second illustrative non-linear micropattern design, based on a regular hexagon, and referred to herein as a fully curved hexagon micropattern.
Figure 4A:
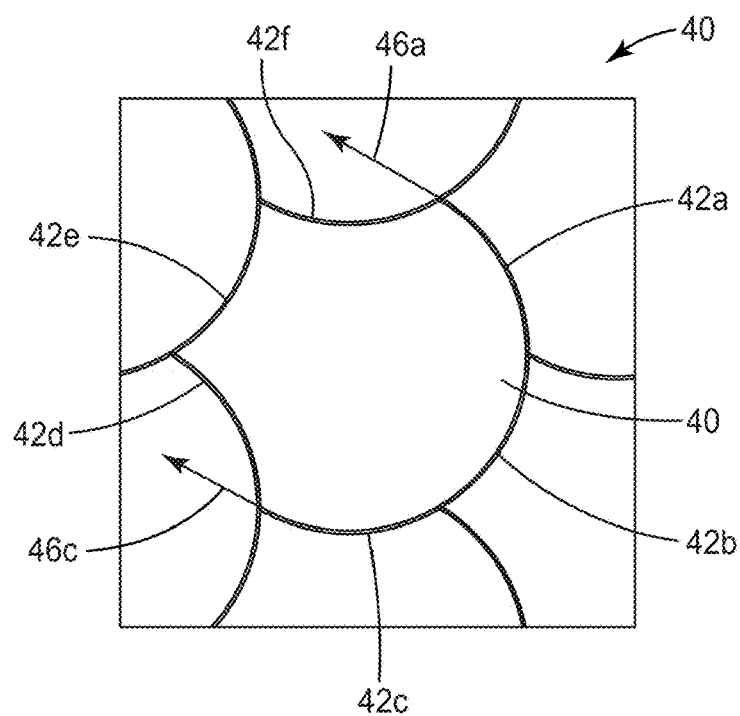
FIG. 4a is an exploded view of a few cells of the micropattern of FIG. 4.

FIG. 4 shows a top plan view of an illustrative geometry of another non-linear design, a fully curved hexagonal conductor micropattern 40 formed by a plurality of curved traces 42 defining a plurality of cells 44. In one method, this micropattern design can be generated by decreasing the radius of curvature of the traces shown in FIG. 3 by, e.g., further displacing the midpoints of each trace. FIG. 4a shows a magnified cell 44' with six traces, 42a through 42f. One characteristic of the micropattern 40 is that tangents 46a and 46c for traces 42a and 42c respectively are generally parallel to one another. Similarly to the mesh micropattern of FIG. 1, the centroids of the mesh cells of FIG. 4 lie on a triangular lattice of points (i.e., array of points).

Figure 14:
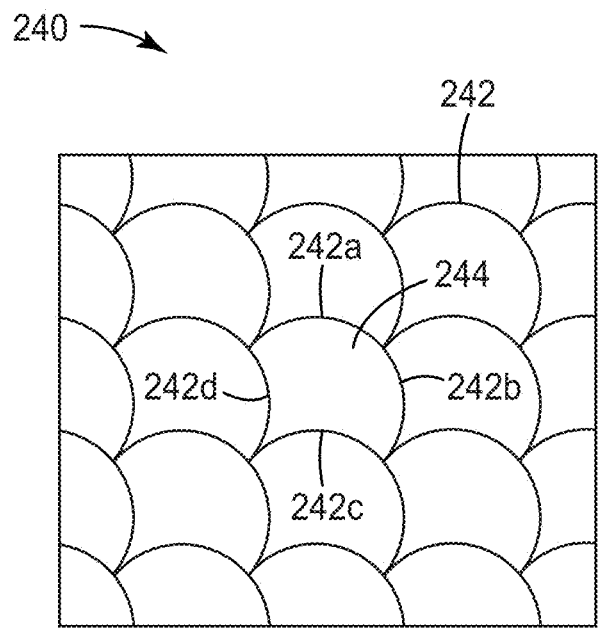
FIG. 14 is a top plan view of a third illustrative non-linear micropattern, referred to herein as a fully curved square micropattern.

FIG. 14 shows another exemplary non-linear micropattern design 240 that can be generated starting from a square and displacing the midpoint of each side of the square by some distance, and allowing the trace to bow. Four traces, 242a to 242d are shown defining open area cells 244. The centroids of the mesh cells of FIG. 14 lie on a square lattice (i.e., array of points).

(B) Micropatterns with Non-Repeating Cells

For mesh micropatterns having a non-repeating cell geometry, the cells may lie on a repeating array (e.g., a rectangular array, a square array, or a triangular array) or they may not. In this cell geometry, the cells are not of the same size and the same shape. An illustrative example of this type of cell geometry is shown in FIG. 2.

Figure 2:
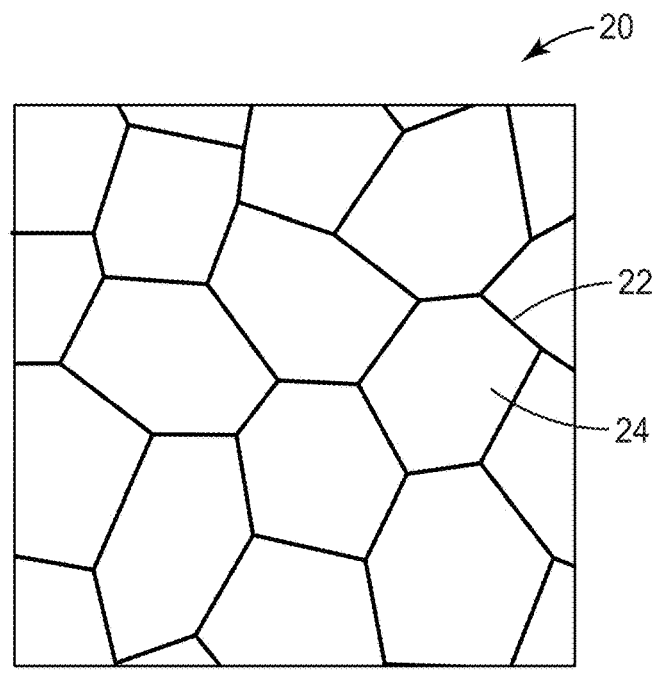
FIG. 2 is a top plan view of a schematic of a portion of a polygonal micropattern, referred to herein as a pseudorandom hexagonal micropattern.

FIG. 2 shows a top plan view of an illustrative geometry of a pseudorandom hexagonal conductor micropattern 20 formed by plurality of linear traces 22 defining a plurality of cells 24. In one method, this micropattern design can be generated by starting from the regular hexagonal pattern design shown in FIG. 1 and displacing the vertices in a randomized direction and by a randomized distance less than the edge length of the original hexagonal cell, and maintaining linear traces. One characteristic of the micropattern 20, when generated by displacing vertices by a distance less than the edge length of the original hexagonal cell (e.g., by a distance less than half of the edge length), is that the centroids of the cells lie within a short distance from the points of an array defined by the original centroid locations of the cells of the mesh of FIG. 1. More specifically the centroids of the cells of the mesh of FIG. 2 lie within a distance equal to 50% of the minimum separation between array positions defined by the centroids of the original mesh of FIG. 1 (i.e., 50% of the length of a basis vector in the direction of the displacement, for triangular lattice defined by the hexagonal mesh cell centroids). This result is due to the fact that the centroid of each original mesh cell opening of FIG. 1 has not been displaced substantially by the procedure of slightly moving the vertices. In this case, the cells are referred to herein as lying on an array. In some embodiments disclosed later herein, the locations of centroids (not just the locations of vertices) are also specified to be randomized.

(C) Micropatterns with Cells not on an Array

As defined above, if the cells of a mesh micropattern are arranged in two dimensions in such a way that the centroids of the cells lie no greater than a short distance from positions that define an array, then the mesh cells are regarded herein to lie on a repeating array (or on an array). In some instances where cells lie on a repeating array, the centroids of the cells lie precisely on the array of points. A characteristic of a micropattern having cells not on a repeating array (i.e., not lying on a repeating array), as the term is used herein, is that the centroids of the mesh cells (i.e., centroids of the cell openings) are arranged in such a way that no array of positions can be constructed using a unit cell comprising four or fewer positions, such that all of the centroids of the mesh lie within a distance less than 50% of the value given by taking the length of the shortest array basis vector that can be constructed in the orientation of the displacement and dividing by the number of array positions in the unit cell that is associated with that basis vector (under the additional limitation that there be only one array position per mesh cell). For this mesh micropattern, the cells are generally not of the same size and shape. Of the three micropatterns discussed thus far (A, B, and C), the C-type micropattern has a higher degree of disorder. An illustrative example of this type of cell geometry is shown in FIG. 5.

Figure 5:
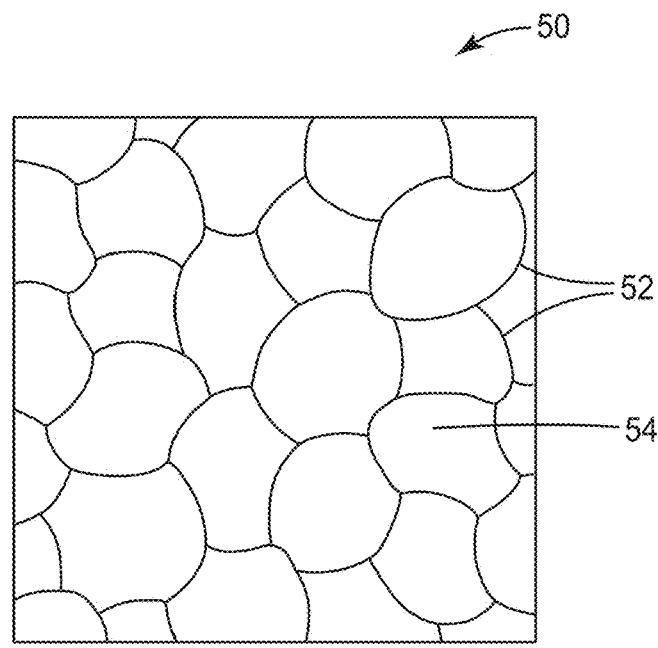
FIG. 5 is a top plan view of a third illustrative non-linear micropattern, a pseudorandom curved design.

FIG. 5 shows a top plan view of a portion of yet another non-linear design, a pseudorandom curved conductor micropattern 50 formed by a plurality of traces 52 defining a plurality of open area cells 54. This geometry includes cells defined by curved conductive traces, each having an exemplary width of 2 micrometers. The cells of a conductor micropattern with the pseudorandom curved design may have a varying number of edges or traces that define the cells, e.g., from four to eight edges. The sizes of the cells vary from an area of 10,000 square micrometers to an area of 70,000 square micrometers. For reference, the area of the regular hexagonal micropattern of FIG. 1 is 35,000 square micrometers. The positions of the cells, e.g., as defined by the centroid of each cell, do not lie on a regularly spaced array.

D. Micropatterns with Uniform Distribution of Trace Orientation

A characteristic of this type of micropattern is that it is not limited in terms of a cell geometry or in terms of the position of the centroids of cells. To better describe this type of micropattern geometry, the concept of angular distribution of trace orientation is used.

Angular Distribution of Trace Orientations

Each trace design can be characterized by an angular distribution of trace orientations, as further described herein. The angular distribution of trace orientations for the pseudorandom curved designs herein, as measurable according to a procedure described herein and over an area of 1 centimeter by 1 centimeter, is substantially uniform. For example, in some embodiments, with respect to the uniformity of the distribution, no reference orientation can be established within the plane of the micropattern for which there are no normals to trace segments in the micropattern that exist within plus or minus 10 degrees of that reference orientation. In some cases, no reference orientation can be established within the plane of the micropattern for which there are no normals to trace segments in the micropattern that exist within plus or minus 5 degrees of that reference orientation. In some cases, no reference orientation can be established within the plane of the micropattern for which there are no normals to trace segments in the micropattern that exist within plus or minus 2 degrees of that reference orientation. Further with respect to the uniformity of the distribution, over, e.g., 1 centimeter by 1 centimeter area, there are no two 20° ranges of orientation in the plane of the micropattern for which the integrated density of the normals to the trace segments in the two ranges is different by more than 50% of the smaller of the two integrated density values. In some cases, over, e.g., 1 centimeter by 1 centimeter area, there are no two 20° ranges of orientation in the plane of the micropattern for which the integrated density of the normals to the trace segments in the two ranges is different by more than 25% of the smaller of the two integrated density values. In some cases, over, e.g., 1 centimeter by 1 centimeter area, there are no two 20° ranges of orientation in the plane of the micropattern for which the integrated density of the normals to the trace segments in the two ranges is different by more than 10% of the smaller of the two integrated density values. In some cases, over, e.g., 1 centimeter by 1 centimeter area, there are no two 10° ranges of orientation in the plane of the micropattern for which the integrated density of the normals to the trace segments in the two ranges is different by more than 10% of the smaller of the two integrated density values. In some cases, over, e.g., 1 centimeter by 1 centimeter area, there are no 5° ranges of orientation in the plane of the micropattern for which the integrated density of the normals to the trace segments in the two ranges is different by more than 10% of the smaller of the two integrated density values.

The micropatterns of the present disclosure provide for the simultaneous minimization of a large number of potentially undesirable visual features with have been observed for other micropatterns, especially when combined with an information display (e.g., on a mobile phone, smart phone, tablet computer, laptop computer, desktop computer monitor, reading device, automotive display, or retail display). These potentially undesirable visual features include starburst, rainbow, and sparkle, as already described. The potentially undesirable features that are mitigated by the micropattern designs also include moiré interference with the pixel pattern of the display. The potentially undesirable features that are mitigated by the micropattern designs also include substantial blockage (e.g., 25%, 50%, or even 75%) of the viewability of individual pixels of the display (obscuring the information, but not necessarily leading to a moiré pattern). It is within the scope of this disclosure for the micropattern to be tilted (e.g., rotated or biased) with respect to a display, in order to optimize the mitigation of one or more of the potentially undesirable visual features. Tilting of the micropattern can be especially useful for minimizing moiré interference with a pixilated display. In some cases, a four-sided cell geometry, distributed on a square array of positions (e.g., fully curved square cell geometry) is convenient for minimization of moiré interference though tilting.

The orientations of the population of traces useful in the present disclosure can be quantified as a distribution that describes the relative concentration, presence, or abundance of trace segments of different orientations within the micropattern. This distribution can be used to describe the orientations of the population of traces in micropatterns that comprise linear traces or non-linear traces. Also, it can be used to describe the orientations of the population of traces in micropatterns that comprise repeating geometries (e.g., as in the case of a square or hexagonal micropattern) or in micropatterns that comprise non-repeating geometries (e.g., as in the case of pseudorandom micropattern designs comprising linear (as in FIG. 2) or non-linear (as in FIG. 5) traces. The descriptor is the integrated micropattern trace length per unit area of micropattern, as a function of the orientation of a normal to the trace. Stated in another way, the descriptor can be expressed as the frequency distribution of orientations for trace segments (or the distribution of orientations of normals to the trace segments) that form a conductor micropattern. By "integrated," what is meant is the summation of total trace width for traces within a defined area that have the specified orientation.

In order to collect the above described frequency characteristics for orientations within conductor micropatterns having non-linear traces, the following procedure can be used. The procedure includes a series of manual drawing and measurement steps for a magnified print of the micropattern design on, for example, 11 inch by 17 inch paper. The characterization procedure include the steps of (a) printing a magnified rendering of the micropattern on paper, (b) partitioning the traces of the micropattern into at least 200 segments of approximately equal path length, (c) manually drawing a normal to each segment, (d) establishing an orientation frame of reference by establishing a 0° direction, and then (e) measuring the orientation of every normal with respect to the 0° direction (e.g., using a protractor). The traces, and thus the normals to the traces, can be specified using 180° of angular range for the following reason. A trace that runs straight up and down can be arbitrarily described to be oriented up or down. A trace or its normal that is oriented upward is no different from a trace or its normal that is oriented downward. Thus, one cannot generate a trace that is oriented upward in any way different from a trace that is oriented downward (i.e., there is no meaning to a suggestion that the upward trace is different from the downward trace). Thus, the full range of possible trace segment orientations requires only 180° of angular range.

Figure 6:
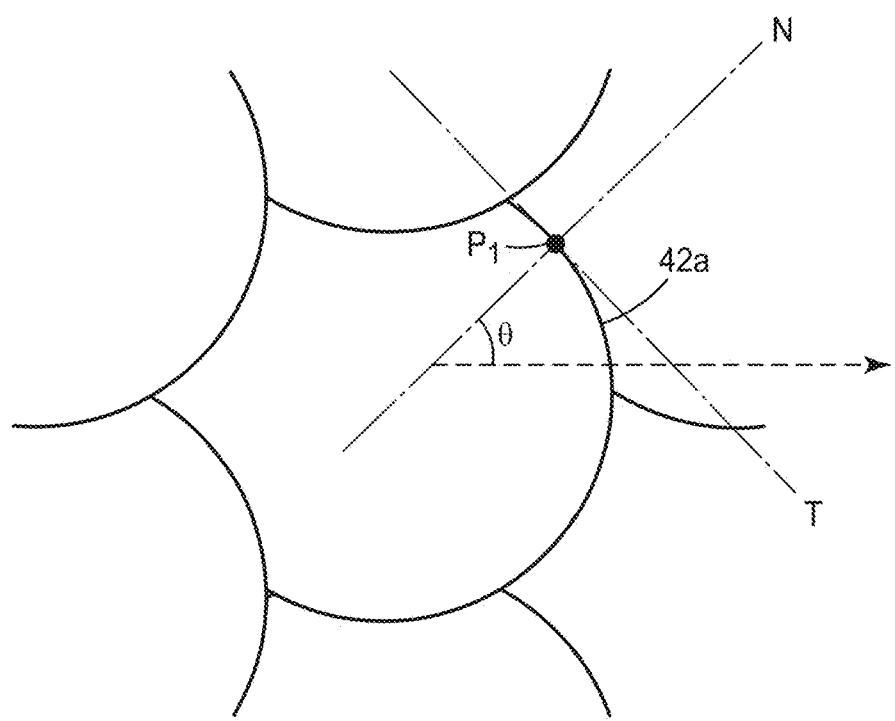
FIG. 6 shows a cell in a micropattern illustrating a measurement method to determine an orientation of a trace.

FIG. 6 shows a diagram of one full cell of the embodiment of FIG. 4 where angle of a normal to a trace orientation is being measured at trace segment $P_1$. For purposes of simplicity, only one of the 200 segments is shown. A normal line N to the trace segment $P_1$ is drawn as shown in the figure. A tangent line T is drawn intersecting both trace segment $P_1$ and normal line N. A reference zero degree line is drawn as shown by a dashed arrow. An angle theta ($\theta$) can then be measured to determine the angle between the reference line and the normal line. This measurement is then repeated multiple times for segments similar to $P_1$ along each of the six traces. An arbitrary, but sufficiently large number of segments (in this case, 200 segments for statistically significant measurement) can be drawn for the cell. An approximately equal number of segments is drawn for each of the six traces.

The so-measured distribution of the orientation of the normal to a trace segment can be rendered by plotting a histogram of the orientation measurements. It should be noted that the distribution of the orientation of the normal to a trace segment provides a direct correlation to the distribution of the orientation of the trace segment itself. For micropatterns herein, the procedure was carried out for the traces making up at least one complete cell of the micropattern. For micropatterns having a single cell shape and size, replicated in two directions in order to yield a two-dimensional micropattern, characterization of the traces that make up a single cell is adequate to determine the distribution of trace orientations for the two dimensional micropattern over larger areas (for example over areas covering 10, 100, or even 1000 cells). For example, characterization of the traces that make up a single regular hexagonal cell measuring 200 micrometers in diameter is adequate to determine the distribution of trace orientations for a regular hexagonal micropattern of such cells measuring 1 millimeter by 1 millimeter, 1 centimeter by 1 centimeter, or even 1 meter by 1 meter. For micropatterns having multiple cell shapes or sizes, a sufficient number of cells should be characterized in order to determine the distribution of trace orientations for the overall micropattern with useful accuracy (e.g., where the so-measured distribution of trace orientations exhibits an $R^2$ correlation coefficient of at least 0.8, at least 0.9, at least 0.95, or even at least 0.99 when compared with the actual distribution of trace orientations over an area of the actual conductor micropattern of 1 millimeter by 1 millimeter, 1 centimeter by 1 centimeter, or even 1 meter by 1 meter).

Once the orientations of normals (represented by the angle θ) to the trace segments are measured, they can be binned into two micron bins thereby generating 90 bins from 0 to 180 degrees. Each bin includes an integer representing the number of measurements that yielded an orientation within the bin's two degree angular range. This binning procedure produces a discrete distribution of orientations. Finally, the standard deviation of the frequency values (standard deviation of measured frequency per 2 degree bin) can be calculated. For some distributions of the normal to the trace segment, and thus the distribution of trace orientation described herein to be considered uniform, the so calculated standard deviation is less than four. For some distributions of trace orientations described herein as uniform, the so calculated standard deviation is less than three. For some distributions of trace orientations described herein as uniform, the so calculated standard deviation is less than two. For some distributions of trace orientations therein uniform, the so calculated standard deviation is less than one.

Figure 7:
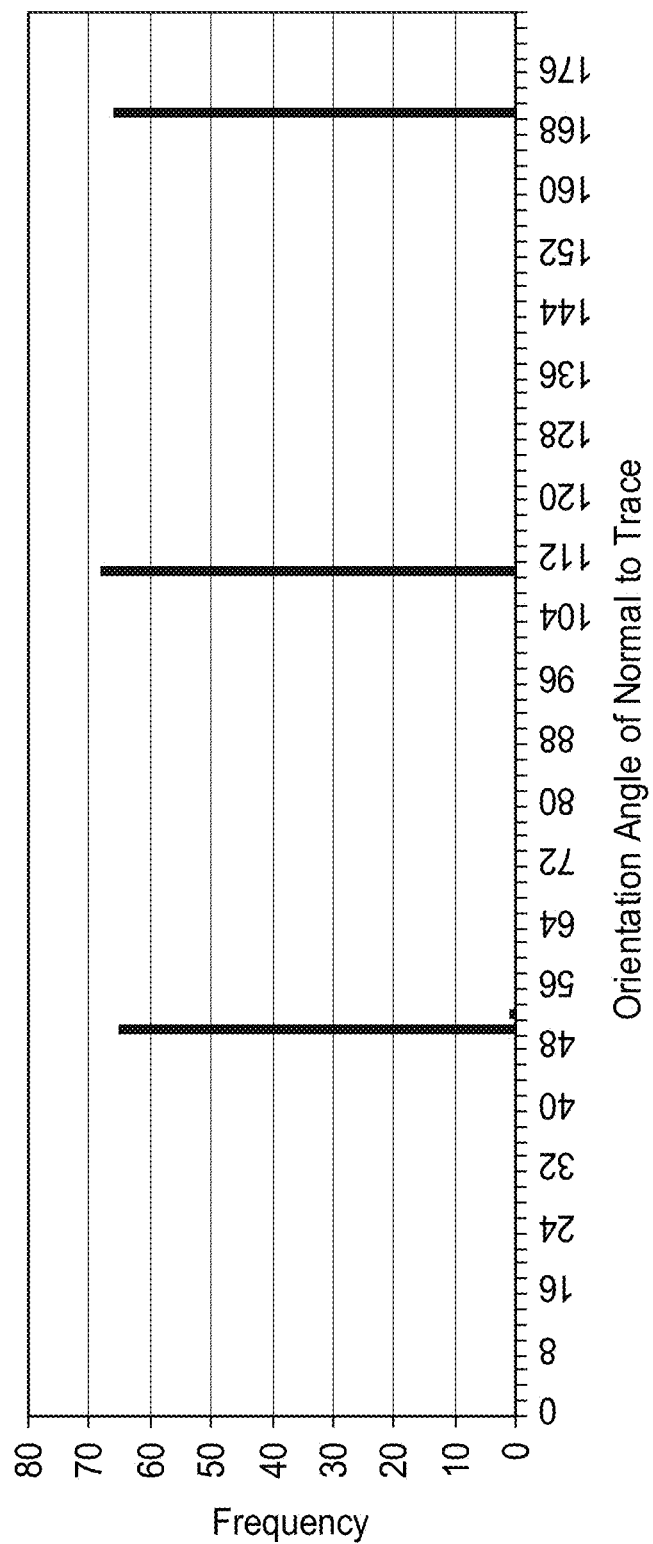
FIG. 7 shows a histogram of the orientation of normals to the trace segments for the micropattern of FIG. 1.

FIG. 7 shows a histogram of the angle θ for the multiple trace segments of the micropattern of FIG. 1, regular hexagon. Three distinct peaks result at three angles, each angle being about 60 degree apart from the other peak. It should be noted that the absolute value of the angle shown on the x-axis of the histogram is arbitrary in that the three peaks can occur at other angles, such as 40°, 100° and 160°, so long as they are about 60° apart. The three peaks result because, with reference to FIG. 1, the orientation angle for the normals would be the same for traces 12a as 12d, 12b as 12e and 12c as 12f. For this micropattern, the standard deviation of measured frequency per 2 degree bin was measured as 11.6, a direct indication of the highly non-uniform.

Figure 8:
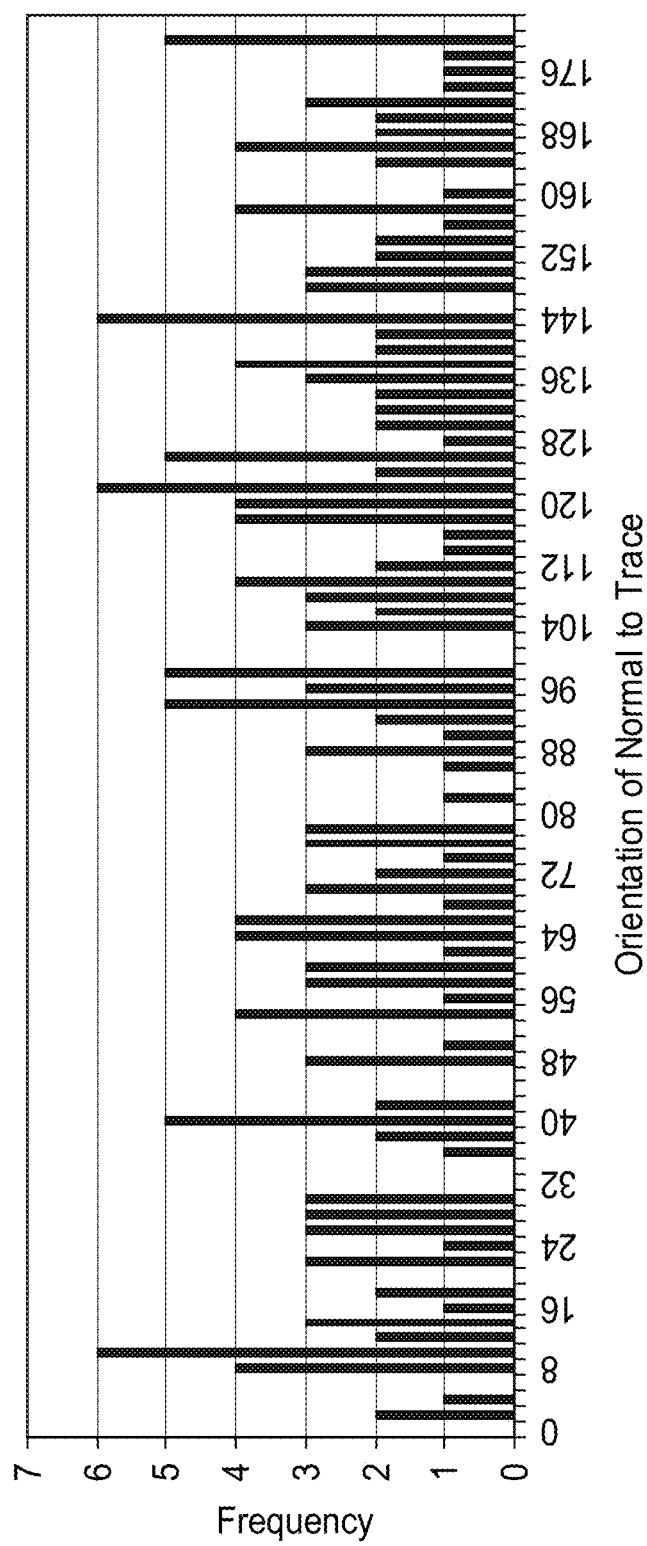
FIG. 8 shows a histogram of the orientation of normals to the trace segments for the pseudorandom hexagonal micropattern, a portion of which is illustrated in FIG. 2.
Figure 9:
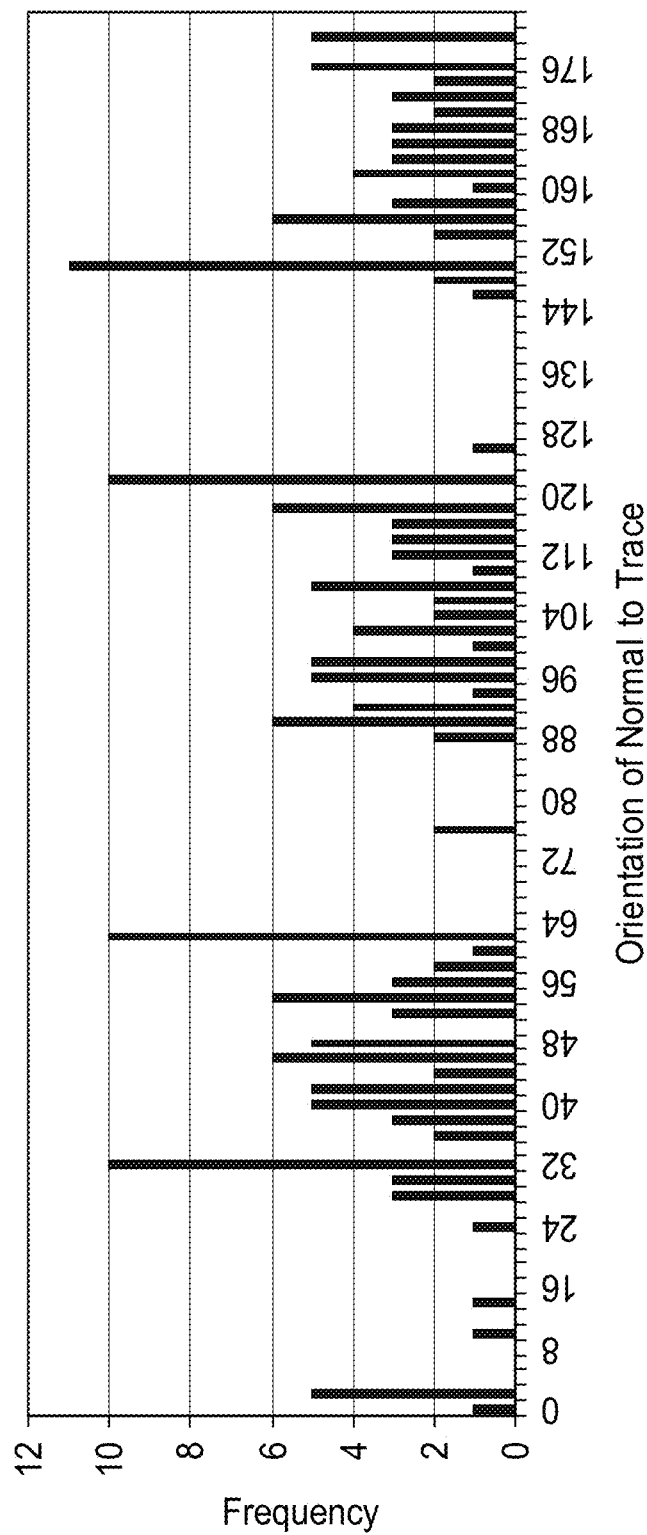
FIG. 9 shows a histogram of the orientation of normal to the trace segments for the partially curved hexagonal micropattern, a portion of which is shown in FIG. 3.
Figure 10:
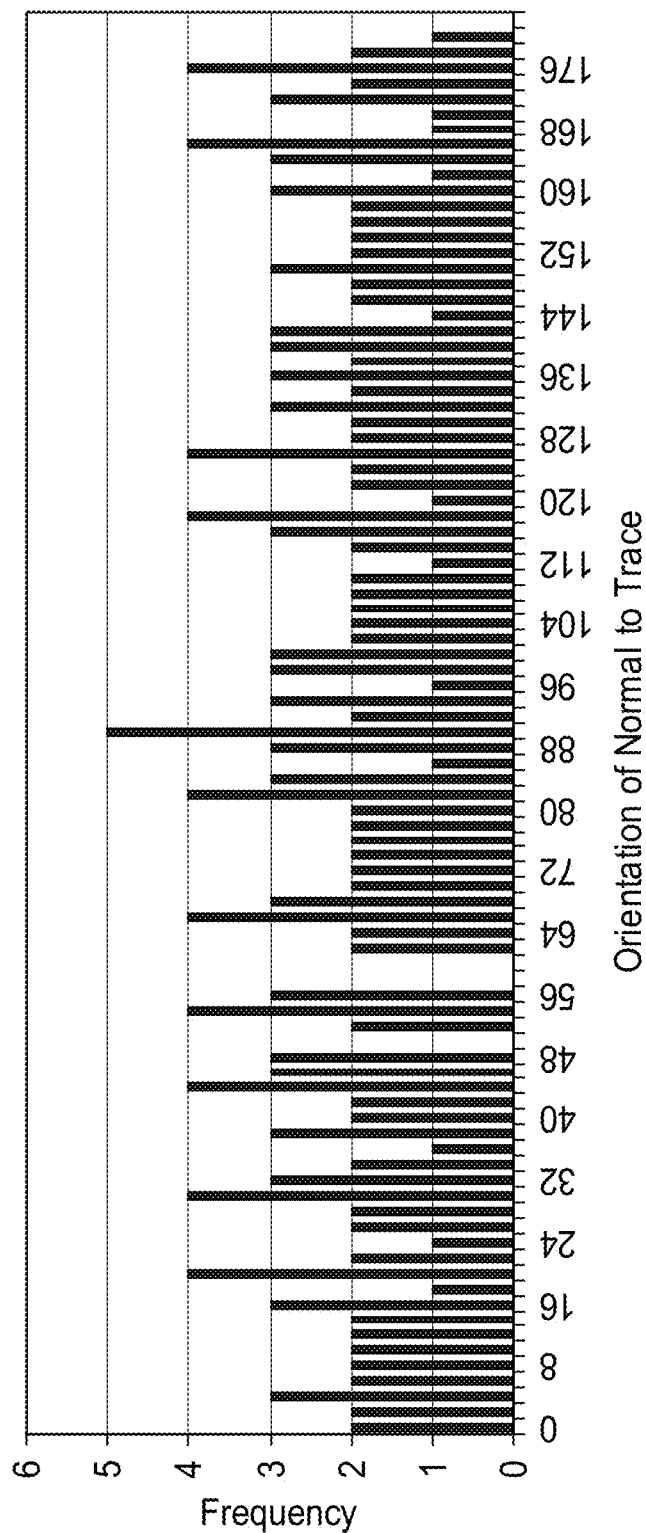
FIG. 10 shows a histogram of the angular distribution of the trace orientations for the fully curved hexagonal micropattern, a portion of which is shown in FIG. 4.

FIGS. 8, 9 and 10 show histograms of the angle θ for the pseudorandom hexagon micropattern of FIG. 2, the partially curved micropattern of FIG. 3, and the fully curved micropattern of FIG. 4 respectively. Each of these histograms has a broader distribution of angle θ as compared to the histogram for the micropattern of FIG. 1, with the histogram of FIG. 10 having the most uniform distribution of the four micropatterns. Furthermore, the standard deviation of these histograms is 1.6 (FIG. 8), 2.6 (FIG. 9) and 1.0 (FIG. 10).

Further describing the distribution of trace segment orientations within a conductor micropattern having non-linear traces, it is within the scope of a micropattern described herein to have a uniform distribution and yet have some orientations or small ranges of orientations not represented in the distribution. That is, a micropattern having an absolutely uniform distribution of trace or trace segment orientations across all 180° of possible orientations within a given area of the micropattern would not be removed from the scope of micropatterns described herein to have a "uniform distribution" by removal of a single trace (or trace segment) or by removal of all traces within a narrow range of angles, for example over a 5° range of angles, or for example over a 2° range of angles.

With reference to the procedure described above for measuring (approximately 200 measurements) and binning (2° bins) the frequencies of fractional trace segment orientations, the pseudorandom curved micropattern (FIG. 5) may have a standard deviation of measured frequency per 2° bin of less than 5, less than 3, less than 2, 1, or even less than 1.

In addition to the uniformity of the distribution of trace segment orientations, the geometry of the conductor micropatterns of the present disclosure can be described in terms of the radius of curvature of the traces. In some cases, the radii of curvature for traces comprising a micropattern are less than 1 centimeter. In some cases the radii of curvature for substantially all of the traces comprising the mesh pattern are less than 1 centimeter. In some cases the radii of curvature for traces comprising a micropattern are less than 1 millimeter. In some cases, the radii of curvature for substantially all of the traces comprising the micropattern are less than 1 millimeter. In some cases, the radii of curvature for traces comprising a mesh pattern are between 50 microns and 1 millimeter. In some cases, the radii of curvature for substantially all of the traces comprising the micropattern are between 50 microns and 1 millimeter. In some cases, the radii of curvature for traces comprising a micropattern are between 75 microns and 750 microns. In some cases, the radii of curvature for substantially all of the traces comprising the micropattern are between 75 microns and 750 microns. In some cases, the radii of curvature for traces comprising a mesh pattern are between 100 microns and 500 microns. In some cases, the radii of curvature for substantially all of the traces comprising the micropattern are between 100 microns and 500 microns. In some cases, the radii of curvature for traces comprising a micropattern are between 150 microns and 400 microns. In some cases the radii of curvature for substantially all of the traces comprising the micropattern are between 150 microns and 400 microns.

Conductor Types

We turn now to the types of conductors useful for the present disclosure. Examples of useful metals for forming the electrically conductive micropattern include gold, silver, palladium, platinum, aluminum, copper, molybdenum, nickel, tin, tungsten, alloys, and combinations thereof. Optionally, the conductor can also be a composite material, for example a metal-filled polymer.

Conductive micropatterns may comprise dots, traces, filled shapes, or combinations thereof with defined specular reflectance, e.g., measured at angle normal to the micropattern. When a conductor micropattern is disposed on a substrate surface that is nanostructured and antireflective (and preferably very low haze, e.g., less than 4%, less than 3%, less than 2%, less than 1%, or even less than 0.5%), the incidence of certain potentially undesirable visual features from the micropattern can be substantially diminished. The diminution can be especially notable for viewing, imaging, or measurement of the micropattern from the direction facing the substrate nanostructured surface. The reflectance of the conductor micropattern can also be diminished by disposition on the substrate surface that is nanostructured and antireflective (and preferably very low haze as described above), as compared with the reflectance for the identically fabricated micropattern on a flat, reflective substrate surface (surface of typical PET film). Furthermore, the conductor can be patterned using microcontact printing (e.g., printing of a self-assembled monolayer pattern using an elastomeric stamp, followed by wet chemical etching) after disposition on the substrate surface that is nanostructured and antireflective (and preferably very low haze as described above), contrary to literature reports that suggest that a smooth substrate surface is critical for such a process. The specular reflectance of smooth thin film metals such as silver or aluminum may exceed 90% in the visible spectrum. In some embodiments, the reflectance of traces for micropatterns formed by a plurality of traces defining a plurality of cells (e.g., to define a micropattern) is less than 90%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 90%, measured at normal incidence and in a direction oriented away from the surface of a substrate onto which the traces are disposed. In some embodiments, the reflectance of traces for micropatterns formed by a plurality of traces defining a plurality of cells (e.g., to define a mesh) is less than 50%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 50%, measured at normal incidence and in a direction oriented away from the surface of a substrate onto which the traces are disposed. In some embodiments, the reflectance of traces for micropatterns formed by a plurality of traces defining a plurality of cells (e.g., to define a mesh) is less than 20%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 10%, measured at normal incidence and in a direction oriented toward the surface of a substrate onto which the traces are disposed. Specific means for reducing the reflectance (i.e., darkening or blackening) of a non-transparent metallic conductor pattern are the subject of the present disclosure. The means solve the problem of high reflectance for metallic deposits on substrates when the metallic deposit is of relatively high optical density (i.e., metallic deposit that is not transparent, for example that transmits less than 5% visible light or even less than 1% visible light), and thus render the otherwise reflective, non-transparent metallic coatings, deposits, or micropatterns darkened, dark, or blackened at their interface with their substrate. The degree of darkening is indicated herein by the measured reflectance from the non-transparent metal, and in particular its interface with a supporting substrate (e.g., nanostructured substrate), with lower reflectance from the non-transparent metal indicating greater darkening, and even blackening. These specific means have been found to be optimally combined with micropattern design parameters (e.g., trace width from 0.5 to 10 micrometers, from 0.5 to 5 micrometers, from 0.75 to 4 micrometers, or from 1 to 3 micrometers), conductor thickness (e.g., from greater than 0.05 to 2 micrometer, from greater than 0.05 to 1 micrometer, 0.075 to 0.5 micrometer, or from 0.1 to 0.25 micrometer), and certain micropattern fabrication methods. The new means disclosed herein solve the challenge of reducing the reflectance of metallic micropatterns having these designs. The presently disclosed designs and methods differ from other known approaches for reducing the reflectance of metallic deposits, e.g., partially reacting a metal surface to convert it chemically to a light-absorbing compound. One example of the latter, known approaches is partial conversion of a silver micropattern surface to silver sulfide by exposure to hydrogen sulfide gas or sulfurated potash (liver of sulfur) solution. Similar procedures can be carried out to convert a copper surface to a black sulfide reaction product. The partial chemical conversion of metallic conductor deposits (e.g., metallic conductor micropatterns) to a light-absorbing reaction product is a general approach that is most suited for metallic conductor coatings or patterns having thicknesses greater than 2 micrometers or even greater than 5 micrometers, but poses challenges when attempted for the substantial darkening of thinner metallic deposits. Although the nanostructured substrate designs described herein have been found to be particularly well-suited for reducing the reflectance of conductor mesh micropatterns described above (trace width from 0.5 to 10 micrometers, from 0.5 to 5 micrometers, 0.5 to 4 micrometers, from 0.5 to 3 micrometers, or from 1 to 3 micrometers; conductor thickness from greater than 0.05 to 2 micrometer, from greater than 0.05 to 1 micrometer, from 0.075 to 0.5 micrometer, or from 0.1 to 0.25 micrometer), they are also suitable for mesh micropatterns of metallic conductors wherein the mesh comprises traces with conductor thickness of from about 2 to about 30 micrometer, or from about 3 to about 10 micrometers. Also, they are suitable for mesh micropatterns of metallic conductors wherein the mesh comprises traces having width greater than 10 micrometers, for example 10 to 20 micrometers, in combination with open area fraction greater than 80 percent., greater than 90%, greater than 95%, greater than 96%, greater than 97%, greater than 98%, greater than 99%, 99.25 to 99.75%, 99.8%, 99.85%, 99.9% and even 99.95

In some embodiments, the metallic conductor (e.g., the metallic conductor micropattern) has a thickness greater than 50 nanometers, in some embodiments greater than 55 nanometers, in some embodiments greater than 60 nanometers, in some embodiments greater than 75 nanometers, and in some embodiments greater than 100 nanometers. In some embodiments, the thickness is in the range from 55 nanometers to 20 micrometers, in some embodiments in the range from 60 nanometers to 15 micrometers, in some embodiments in the range of 75 nanometers to 10 micrometers, in some embodiments in the range of 100 nanometers to 1 micrometer, in some embodiments in the range of 125 nanometers to 500 nanometers, and in some embodiments in the range 150 nanometers to 250 nanometers.

Substrates

Useful substrates that can be used in the present disclosure include glass and polymeric materials. Useful polymeric materials include polymeric films. A polymeric "film" substrate is a polymer material in the form of a flat sheet that is sufficiently flexible and strong to be processed in a roll-to-roll fashion. Polymeric films used as substrates in articles described herein are sometimes referred to as base films. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thicknesses, ranging in general from about 5 µm to 1000 µm. In many embodiments, polymeric film thicknesses range from about 25 µm to about 500 µm, or from about 50 µm to about 250 µm, or from about 75 µm to about 200 µm. Roll-to-roll polymeric films may have a width of at least 12 inches, 24 inches, 36 inches, or 48 inches. Useful polymeric film substrates include, for example, poly(ethyleneterephthalate), poly(ethylenenaphthalate), polycarbonate, or cellulose triacetate.

The substrate surface can be modified to be nanostructured and antireflective when exposed to air by any suitable means. A nanostructured surface that is antireflective may be formed using a number of methods, including embossing, molding, or interference lithography, as is known in the art. A particularly effective method for modifying a surface to be nanostructured and antireflective when exposed to air is discussed below and uses a Reactive Ion Etching process.

Reactive Ion Etched Substrates

A particularly useful nanostructured surface prepared using a first method, a reactive ion etching process to produce a random anisotropic nanostructured surface. Not all nanostructured surfaces are antireflective. And, not all nanostructured surfaces have low haze. Some nanostructured surfaces are strongly light-scattering, leading to haze (e.g., transmitted haze of greater than 5%).

Figure 15:
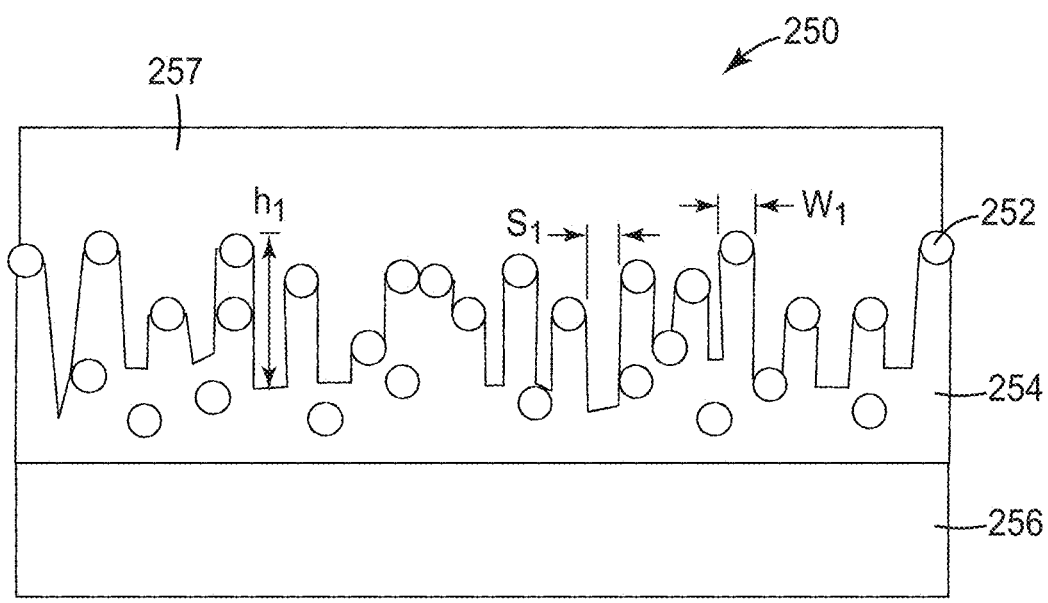
FIG. 15 shows a schematic cross section of metallized nanostructured substrate surface made via reactive ion etching.

FIG. 15 depicts a schematic cross section view of a metallized nanostructured substrate 250 made via reactive ion etching where $S_1$ depicts the spacing between two nanofeatures defined by the reactive ion etching process and the positions of nanoparticles (dispersed phase) 252 in a matrix 254, both of which are disposed on a surface of a substrate 256. The width of a nanofeature is identified as $W_1$, and the height of a nanofeature is identified as $H_1$. FIG. 15 includes a metallic conductor 257 disposed upon (and penetrating the open, negative space of) the nanostructured substrate surface.

In one embodiment of a nanostructured surfaces that are antireflective when exposed to air, the nanostructured articles (e.g., substrates) comprise a composite surface that is nanostructured and antireflective when exposed to air can be formed with a matrix phase and a dispersed phase. For a material or article to comprise a composite surface, what is meant is that the portion of the material that defines the surface (and thus includes a finite volume or material that is inside the surface) is a composite material (i.e., a material comprising multiple phases, for example a matrix phase and a dispersed phase). For an article to comprise a composite surface, the article may consist entirely of the composite material or, for example, the article may comprise one material that is not a composite (e.g., a polymeric base film), with a composite coating disposed thereon. The matrix, or continuous phase, can comprise polymeric material, inorganic material, or alloys or solid solutions (including miscible polymers). Reactive Ion Etching of a material or coating comprising a matrix and a dispersed nanoparticle phase yields can yield a nanostructured surface that is anisotropic (height of protrusive features is greater than lateral dimension of protrusive features) and random (positions of protrusive features are not defined, for example periodic).

Useful polymeric materials include thermoplastics and thermosetting resins.

Suitable thermoplastics include, but are not limited to, polyethylene terephthalate (PET), polystyrene, acrylonitrile butadiene styrene, polyvinyl chloride, polyvinylidene chloride, polycarbonate, polyacrylates, cellulose acetate, thermoplastic polyurethanes, polyvinyl acetate, polyamide, polyimide, polypropylene, polyester, polyethylene, poly(methylmethacrylate), polyethylene naphthalate, styrene acrylonitrile, silicone-polyoxamide polymers, fluoropolymers, cyclic olefin copolymers, thermoplastic elastomers, and the like.

Suitable thermosetting resins include, but are not limited to, allyl resin (including (meth)acrylates, polyester acrylates, urethane acrylates, epoxy acrylates and polyether acrylates), epoxies, thermosetting polyurethanes, silicones or polysiloxanes, and the like. These resins can be formed from the reaction product of polymerizable compositions comprising the corresponding monomers and or oligomers. As used in this document, the term (meth)acrylate means acrylate or methacrylate.

In one embodiment, the polymerizable compositions includes at least one monomeric or oligomeric (meth)acrylate, preferably a urethane (meth)acrylate. Typically, the monomeric or oligomeric (meth)acrylate is multi(meth)acrylate. The term "(meth)acrylate" is used to designate esters of acrylic and methacrylic acids, and "multi(meth)acrylate" designates a molecule containing more than one (meth)acrylate group, as opposed to "poly(meth)acrylate" which commonly designates (meth)acrylate polymers. Most often, the multi(meth)acrylate is a di(meth)acrylate, but it is also contemplated to employ tri(meth)acrylates, tetra(meth)acrylates and so on.

Suitable monomeric or oligomeric (meth)acrylates include alkyl (meth)acrylates such as methyl acrylate, ethyl acrylate, 1-propyl acrylate, methyl methacrylate and t-butyl acrylate. The acrylates may include (fluoro)alkylester monomers of (meth)acrylic acid, the monomers being partially and or fully fluorinated, such as, trifluoroethyl (meth)acrylate.

Examples of commercially available multi(meth)acrylate resins include the DIABEAM series from Mitsubishi Rayon Co., LTD.; the DINACOL series from Nagase & Company, Ltd.; the NK ESTER series from Shin-Nakamura Chemical Co., Ltd.; the UNIDIC series from Dainippon Ink & Chemicals, Inc., the ARONIX series from Toagosei Co., LTD.; the BLENMER series manufactured by NOF Corp.; the KAYARAD series from Nippon Kayaku Co., Ltd., the LIGHT ESTER series and LIGHT ACRYLATE series from Kyoeisha Chemical Co., Ltd.

Oligomeric urethane multi(meth)acrylates may be obtained commercially, for example from Sartomer under the trade designation "Photomer 6000 Series", such as "Photomer 6010" and "Photomer 6020", and also under the trade designation "CN 900 Series", such as "CN966B85", "CN964" and "CN972". Oligomeric urethane (meth)acrylates are also available from Surface Specialties, such as available under the trade designations "Ebecryl 8402", "Ebecryl 8807" and "Ebecryl 4827". Oligomeric urethane (meth)acrylates may also be prepared by the initial reaction of an alkylene or aromatic diisocyanate of the formula OCN—R3-NCO with a polyol. Most often, the polyol is a diol of the formula HO—R4-OH wherein R3 is a C2-100 alkylene or an arylene group and R4 is a C2-100 alkylene group. The intermediate product is then a urethane diol diisocyanate, which subsequently can undergo reaction with a hydroxyalkyl (meth)acrylate. Suitable diisocyanates include 2,2,4-trimethylhexylene diisocyanate and toluene diisocyanate. Alkylene diisocyanates are generally preferred. A particularly preferred compound of this type may be prepared from 2,2,4-trimethylhexylene diisocyanate, poly(caprolactone)diol and 2-hydroxyethyl methacrylate. In at least some cases, the urethane (meth)acrylate is preferably aliphatic.

The polymerizable compositions can be mixtures of various monomers and or oligomers, having the same or differing reactive functional groups. Polymerizable compositions comprising two or more different functional groups may be used, including the following; (meth)acrylate, epoxy and urethane. The differing functionality may be contained in different monomeric and or oligomeric moieties or in the same monomeric and or oligomeric moiety. For example, a resin composition may comprise an acrylic or urethane resin having an epoxy group and or a hydroxyl group in the side chain, a compound having an amino group and, optionally, a silane compound having an epoxy group or amino group in the molecule.

The thermosetting resin compositions are polymerizable using conventional techniques such as thermal cure, photocure (cure by actinic radiation) and or e-beam cure. In one embodiment, the resin is photopolymerized by exposing it to ultraviolet (UV) and or visible light. Conventional curatives and or catalyst may be used in the polymerizable compositions and are selected based on the functional group(s) in the composition. Multiple curatives and or catalysts may be required if multiple cure functionality is being used. Combining one or more cure techniques, such as thermal cure, photocure and e-beam cure, is within the scope of the present disclosure.

Furthermore, the polymerizable resins can be compositions comprising at least one other monomer and or oligomer (that is, other than those described above, namely the monomeric or oligomeric (meth)acrylate and the oligomeric urethane (meth)acrylate). This other monomer may reduce viscosity and/or improve thermomechanical properties and/or increase refractive index. Monomers having these properties include acrylic monomers (that is, acrylate and methacrylate esters, acrylamides and methacrylamides), styrene monomers and ethylenically unsaturated nitrogen heterocycles.

Also included are (meth)acrylate esters having other functionality. Compounds of this type are illustrated by the 2-(N-butylcarbamyl)ethyl (meth)acrylates, 2,4-dichlorophenyl acrylate, 2,4,6-tribromophenyl acrylate, tribromophenoxylethyl acrylate, t-butylphenyl acrylate, phenyl acrylate, phenyl thioacrylate, phenylthioethyl acrylate, alkoxylated phenyl acrylate, isobornyl acrylate and phenoxyethyl acrylate. The reaction product of tetrabromobisphenol A diepoxide and (meth)acrylic acid is also suitable.

The other monomer may also be a monomeric N-substituted or N,N-disubstituted (meth)acrylamide, especially an acrylamide. These include N-alkylacrylamides and N,N-dialkylacrylamides, especially those containing C1-4 alkyl groups. Examples are N-isopropylacrylamide, N-t-butylacrylamide, N,N-dimethylacrylamide and N,N-diethylacrylamide. The term "(meth)acrylamide" means acrylamide and methacrylamide.

The other monomer may further be a polyol multi(meth)acrylate. Such compounds are typically prepared from aliphatic diols, triols, and/or tetraols containing 2-10 carbon atoms. Examples of suitable poly(meth)acrylates are ethylene glycol diacrylate, 1,6-hexanediol diacrylate, 2-ethyl-2-hydroxymethyl-1,3-propanediol triacylate (trimethylolpropane triacrylate), di(trimethylolpropane) tetraacrylate, pentaerythritol tetraacrylate, the corresponding methacrylates and the (meth)acrylates of alkoxylated (usually ethoxylated) derivatives of said polyols. Monomers having two or more (ethylenically unsaturated groups can serve as a crosslinker.

Styrenic compounds suitable for use as the other monomer include styrene, dichlorostyrene, 2,4,6-trichlorostyrene, 2,4,6-tribromostyrene, 4-methylstyrene and 4-phenoxystyrene. Ethylenically unsaturated nitrogen heterocycles include N-vinylpyrrolidone and vinylpyridine.

Constituent proportions in the radiation curable materials can vary. In general, the organic component can comprise about 30-100% monomeric and or oligomeric (meth)acrylate or oligomeric urethane multi(meth)acrylate, with any balance being the other monomer and or oligomer.

Commercially available liquid-resin based materials (typically referred to as "hardcoats") may be used as the matrix or as a component of the matrix. Such materials include the PERMANEW series from California Hardcoating Co., San Diego, Calif. and the UVHC series harcoats from Momentive Performance Materials, Albany, N.Y. Additionally, commercially available nanoparticle filled matrix may be used, such as NANOCRYL and NANOPDX from Nanoresins AG, Geesthacht Germany.

Additionally, nanoparticulate containing hardcoat films, such as THS series from Toray Advanced Films Co., Ltd., Tokyo, Japan; the Opteria Hardcoated Films for FPD from Lintec Corp., Tokyo, Japan; the Sony Optical Film from Sony Chemical & Device Corp., Tokyo, JP; the Hardcoated Film from SKC Haas, Seoul, Korea and the Terrappin G film from Tekra Corp., Milwaukee, Wis., may be used in this disclosure.

Surface leveling agents may be added to the matrix. The leveling agent is preferably used for smoothing the matrix resin. Examples include silicone-leveling agents, acrylic-leveling agents and fluorine-containing-leveling agents. In one embodiment, the silicone-leveling agent includes a polydimethyl siloxane backbone to which polyoxyalkylene groups are added.

Useful inorganic materials for the matrix include, for example, glasses, metals, metal oxides, and ceramics.

The dispersed phase (e.g., a nanoparticle dispersed phase) is a discontinuous phase dispersed (e.g., randomly) within the matrix. The nanoscale dispersed phase can comprise nanoparticles (for example, nanospheres), nanotubes, nanofibers, caged molecules, hyperbranched molecules, micelles, reverse micelles, or the like. Preferably, the dispersed phase comprises nanoparticles or caged molecules; more preferably, the dispersed phase comprises nanoparticles. It is within the scope of the present disclosure for the dispersed phase to exhibit some degree of order or organization within the matrix, for example at least segregation (e.g., in a coating) toward a substrate base film or away from a substrate base film.

Nanoparticles as the dispersed phase in a composite material suitable for reactive ion etching preferably have a mean diameter in the range from about 1 nm to about 200 nm, in some embodiments in the range from about 10 nm to 200 nm. In some embodiments, the nanoparticles have a mean diameter in the range from about 20 to 100 nm. In some embodiments, the nanoparticles have a mean diameter of 5 nm, 20 nm, or 75 nm. Nanoparticles for the dispersed phase preferably comprise metal oxides, carbides, nitrides, borides, halides, fluorocarbon solids, or the like, or mixtures thereof. Preferred materials include $SiO_2$, $ZrO_2$, $TiO_2$, $ZnO$, calcium carbonate, magnesium silicate, indium tin oxide, antimony tin oxide, carbon, poly(tetrafluoroethylene), and the like. Preferably, the nanoparticles comprise $SiO_2$.

Nanoparticles can be present in the matrix in an amount from about 1% to about 75%, or from about 5% to about 20% by volume. The relative contents of the matrix phase and the dispersed phase in a composite material can be expressed in volume percent or in weight percent, as is known in the art. Conversion of weight percent composition descriptions to volume percent composition descriptions requires an accounting for the density of each of the phases, as is readily done by those of ordinary skill in the art. Note that compositions of composite materials are described herein in terms of the relative contents of the solid material phases only, with no accounting for the possibility of pores (open or closed). It is within the scope of the compositions of composites described herein for there also to be pores present. The expressions herein of the compositions of composites are limited to description of only the solid phases contained in the composite, but there may also be pores present. Silicas for use in the materials of the present disclosure are commercially available from Nalco Chemical Co., Naperville, Ill. under the trade designation "Nalco Colloidal Silicas" such as products 1040, 1042, 1050, 1060, 2327 and 2329. Suitable fumed silicas include for example, products commercially available from Evonik under the trade designation, "Aerosil series OX-50", as well as product numbers –130, –150, and –200. Other colloidal silica can be also obtained from Nissan Chemicals under the designations "IPA-ST", "IPA-ST-L", and "IPA-ST-ML". Fumed silicas are also commercially available from Cabot Corp., Tuscola, Ill., under the designations "CAB-O-SPERSE 2095", "CAB-O-SPERSE A105", and "CAB-O-SIL M5". Zirconias for use in composition and articles of the invention are available from Nalco Chemical Co. under the trade designation "Nalco OOSSOO8".

Surface-treating the nano-sized particles can provide a stable dispersion in the polymeric resin. Preferably, the surface-treatment stabilizes the nanoparticles so that the particles will be well dispersed in the polymerizable resin and result in a substantially homogeneous composition. Furthermore, the nanoparticles can be modified over at least a portion of its surface with a surface treatment agent so that the stabilized particles can copolymerize or react with the polymerizable resin during curing.

The nanoparticles are preferably treated with a surface treatment agent. In general, a surface treatment agent has a first end that will attach to the particle surface (covalently, ionically or through strong physisorption) and a second end that imparts compatibility of the particle with the resin and/or reacts with resin during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particles or nanoparticle surface before incorporation into the resins. The required amount of surface modifier is dependent on several factors such as particle size, particle type, molecular weight of the modifier, and modifier type.

Representative embodiments of surface treatment agents include compounds such as, for example, isooctyl trimethoxy-silane, N-(3-triethoxysilylpropyl)methoxyethoxyethoxyethyl carbamate (PEG3TES), N-(3-triethoxysilylpropyl)methoxyethoxyethoxyethyl carbamate (PEG2TES), 3-(methacryloyloxy)propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyOmethyldimethoxysilane, 3-(methacryloyloxy)propyldimethylethoxysilane, vinyldimethylethoxysilane, pheyltrimethaoxysilane, n-octyltrimethoxysilane, dodecyltrimethoxysilane, octadecyltrimethoxysilane, propyltrimethoxysilane, hexyltrimethoxysilane, vinylmethyldiactoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltrisisobutoxysilane, vinyltriisopropenoxysilane, vinyltris(2-methoxyethoxy)silane, styrylethyltrimethoxysilane, mercaptopropyltrimethoxysilane, 3-glycidoxypropyltrimethoxysilane, acrylic acid, methacrylic acid, oleic acid, stearic acid, dodecanoic acid, 2-(2-(2-methoxyethoxy)ethoxy)acetic acid (MEEAA), beta-carboxyethylacrylate, 2-(2-methoxyethoxy)acetic acid, methoxyphenyl acetic acid, and mixtures thereof. Furthermore, a proprietary silane surface modifier, commercially available from OSI Specialties, Crompton South Charleston, W. Va., under the trade designation "Silquest A1230" is also suitable.

The surface modification of the particles in the colloidal dispersion can be accomplished in a variety of ways. The process involves the mixture of an inorganic dispersion with surface modifying agents. Optionally, a co-solvent can be added at this point, such as for examples, 1-methoxy-2-propanol, ethanol, isopropanol, ethylene glycol, N,N-dimethylacetamide and 1-methyl-2-pyrrolidinone. The co-solvent can enhance the solubility of the surface modifying agents as well as the surface modified particles. The mixture comprising the inorganic sol and surface modifying agents is subsequently reacted at room or an elevated temperature, with or without mixing. In one method, the mixture can be reacted at about 85° C. for about 24 hours, resulting in the surface modified sol. In another method, where metal oxides are surface modified the surface treatment of the metal oxide can preferably involve the adsorption of acidic molecules to the particle surface. The surface modification of the heavy metal oxide preferably takes place at room temperature.

The surface modification of $ZrO_2$ with silanes can be accomplished under acidic conditions or basic conditions. In one case the silanes are heated under acid conditions for a suitable period of time. At which time the dispersion is combined with aqueous ammonia (or other base). This method allows removal of the acid counter ion from the $ZrO_2$ surface as well as reaction with the silane. In another method the particles are precipitated from the dispersion and separated from the liquid phase.

A combination of surface modifying agents can be useful, wherein at least one of the agents has a functional group co-polymerizable with a hardenable resin. For example, the polymerizing group can be ethylenically unsaturated or a cyclic function subject to ring opening polymerization. An ethylenically unsaturated polymerizing group can be, for example, an acrylate or methacrylate, or vinyl group. A cyclic functional group subject to ring opening polymerization generally contains a heteroatom such as oxygen, sulfur or nitrogen, and preferably a 3-membered ring containing oxygen such as an epoxide.

Useful caged molecules for the nanodispersed phase include polyhedral oligomeric silsesquioxane molecules, which are cage-like hybrid molecules of silicone and oxygen. Polyhedral oligomeric silsesquioxane (POSS) molecules are derived from a continually evolving class of compounds closely related to silicones through both composition and a shared system of nomenclature. POSS molecules have two unique features (1) the chemical composition is a hybrid, intermediate ($RSiO_{1.5}$) between that of silica ($SiO_2$) and silicone ($R_2SiO$), and (2) the molecules are physically large with respect to polymer dimensions and nearly equivalent in size to most polymer segments and coils. Consequently, POSS molecules can be thought of as the smallest particles (about 1-1.5 nm) of silica possible. However unlike silica or modified clays, each POSS molecule contains covalently bonded reactive functionalities suitable for polymerization or grafting POSS monomers to polymer chains. In addition, POSS acrylate and methacrylate monomers are suitable for ultraviolet (UV) curing. High functionality POSS acrylates and methacrylates (for example, MA0735 and MA0736) are miscible with most of the UV-curable acrylic and urethane acrylic monomers or oligomers to form mechanically durable hardcoat in which POSS molecules form nano-phases uniformly dispersed in the organic coating matrix.

Carbon can also be used in the nanodispersed phase in the form of graphite, carbon nanotubes, bulky balls, or carbon black such as described in U.S. Pat. No. 7,368,161 (McGurran et al.). Additional materials that can be used in the nanodispersed phase include Irgastat™ P18 (available from Ciba Corporation, Tarrytown, N.Y.) and Ampacet LR-92967 (available from Ampacet Corporation, Tarrytown, N.Y.).

The dispersed phase is typically present in the matrix at concentrations between about 1 volume % and about 75 volume %; preferably between about 5 volume % and about 20 volume %. The nanostructured articles of the invention may have a nanostructure that is anisotropic. The nanostructured anisotropic surface typically comprises nanofeatures having a height to width ratio of about 2:1 or greater; preferably about 5:1 or greater. In some embodiments, the height to width ratio is even 50:1 or greater, 100:1 or greater, or 200:1 or greater. The nanostructured anisotropic surface can comprise nanofeatures such as, for example, nano-pillars or nano-columns, or continuous nano-walls comprising nano-pillars or nano-columns. Preferably, the nanofeatures have steep side walls that are roughly perpendicular to the substrate. In some embodiments, the majority of the nanofeatures are capped with dispersed phase material. The concentration of the dispersed phase at the surface (versus in the interior of the matrix) can be between about 1 volume % and about 75 volume %; preferably between about 5 volume % and about 20 volume %. In some embodiments, the concentration of the dispersed phase is higher at the surface of the matrix than within the matrix. The nanostructured surface typically comprises nanofeatures that have a height of from 50 to 750 nanometers, in some cases from 75 to 300 nanometers, and in some cases 100 to 200 nanometers. Once metallized (e.g., by sputtering), the nanostructured surface can be penetrated with metal by an extent approximately equal to the height of the nanofeatures. The nanostructured surface typically comprises nanofeatures that have width (e.g., at about half their height) of from 15 to 200 nanometers, in some cases from 50 to 125 nanometers. The nanostructure surface typically comprises nanofeatures that have lateral spacing (i.e., spacing at about half the height of the nanofeatures, in the plane of the nanostructured major surface) of from 5 to 500 nanometers, in some cases from 15 to 100 nanometers. The lateral spacing at about half the height of the nanofeatures, in the plane of the nanostructured major surface, can be determined microscopically by sectioning the nanostructured surface normal to the major surface and measuring the distance (e.g., by transmission electron microscopy). The nanostructured surface typically comprises nanofeatures that have a height to width ratio of 2 to 1, in some cases from 100 to 1, or greater. The nanostructure surface typically exhibits a reflectance of from 0.05 to 1, in some cases from 0.05 to 0.35. The nanostructure surface typically exhibits a transmitted haze (as measured using a Haze-Gard Plus (BYK-Gardner, Columbia, Md.) of from 0.1 to 1, in some cases from 0.1 to 0.4.

In some embodiments the matrix may comprise materials for static dissipation in order to minimize attraction of dirt and particulate and thus maintain surface quality. Suitable materials for static dissipation include, for example, Stat-Rite™ polymers such X-5091, M-809, S-5530, S-400, S-403, and S-680 (available from Lubrizol, Wickliffe, Ohio); 3,4-polyethylenedioxythiophene-polystyrenesulfonate (PEDOT/PSS) (available from H.C. Starck, Cincinnati, Ohio); polyanaline; polythiophene; and Pelestat™ NC6321 and NC7530 antistatic additives (available from Tomen America Inc., New York, N.Y.).

The nanostructured surface is formed by anisotropically etching the matrix. The matrix comprising the nanoscale dispersed phase can be provided, for example, as a coating on a substrate. The substrate can be, for example, a polymeric substrate, a glass substrate or window, or a function device such as an organic light emitting diode (OLED), a display, a photovoltaic device, or the like. The matrix comprising the dispersed phase can be coated on the substrate and cured using methods known in the art such as, for example, casting cure by casting drum, die coating, flow coating, or dip coating. The coating can be prepared in any desired thickness greater than about 1 micron or preferably greater than about 4 microns. In addition the coating can be cured by UV, electron beam, or heat. Alternatively, the matrix comprising the dispersed phase may be the article itself.

In some embodiments, the surface of the matrix comprising the nanoscale dispersed phase may be microstructured. For example, a substrate with a v-groove microstructured surface can be coated with polymerizable matrix materials comprising a nanodispersed phase and treated by plasma etching to form nanostructures on v-groove microstructured surface. Alternatively, a microstructured article such as Fresnel lens or a microstructured article comprising micro-replicated posts or columns comprising nanodispersed phases can be also treated by plasma etching to form nanostructures on microstructures.

The matrix is anisotropically etched using chemically reactive plasma. The RIE process, for example, involves generating plasma under vacuum by an electromagnetic field. High energy ions from the plasma attack or etch away the matrix material.

A typical RIE system consists of a vacuum chamber with two parallel electrodes, the "powered electrode" (or "sample carrier electrode") and the counter-electrode, which create an electric field that accelerates ions toward. The powered electrode is situated in the bottom portion of the chamber and is electrically isolated from the rest of the chamber. The article or sample to be nanostructured is placed on the powered electrode. Reactive gas species can be added to the chamber, for example, through small inlets in the top of the chamber and can exit to the vacuum pump system at the bottom of the chamber. Plasma is formed in the system by applying a RF electromagnetic field to the powered electrode. The field is typically produced using a 13.56 MHz oscillator, although other RF sources and frequency ranges may be used. The gas molecules are broken and can become ionized in the plasma and accelerated toward the powered electrode to etch the sample. The large voltage difference causes the ions to be directed toward the powered electrode where they collide with the sample to be etched. Due to the mostly vertical delivery of the ions, the etch profile of the sample is substantially anisotropic. Preferably, the powered electrode is smaller than the counter-electrode creating a large voltage potential across the ion sheath adjacent the powered electrode. Preferably, the etching is to a depth greater than about 50 nanometers, more preferably greater than about 75 nanometers, and more preferably yet greater than about 100 nanometers.

The process pressure is typically maintained at below about 20 mTorr (preferably, below about 10 mTorr) but greater than about 1 mTorr. This pressure range is very conducive for generation of the anisotropic nanostructure in a cost effective manner. When the pressure is above about 20 mTorr, the etching process becomes more isotropic because of the collisional quenching of the ion energy. Similarly, when the pressure goes below about 1 mTorr, the etching rate becomes very low because of the decrease in number density of the reactive species. Also, the gas pumping requirements become very high.

The power density of the RF power of the etching process is preferably in the range of about 0.1 to about 1.0 watts/cm³ (preferably, about 0.2 to about 0.3 watts/cm³).

The type and amount of gas utilized will depend upon the matrix material to be etched. The reactive gas species need to selectively etch the matrix material rather than the dispersed phase. Additional gases may be used for enhancing the etching rate of hydrocarbons or for the etching of non-hydrocarbon materials. For example, fluorine containing gases such as perfluoromethane, perfluoroethane, perfluoropropane, sulfurhexafluoride, nitrogen trifluoride, and the like can be added to oxygen or introduced by themselves to etch materials such as SiO₂, tungsten carbide, silicon nitride, amorphous silicon, and the like. Chlorine-containing gases can likewise be added for the etching of materials such as aluminum, sulfur, boron carbide, and the like. Hydrocarbon gases such as methane can be used for the etching of materials such as gallium arsenide, gallium, indium, and the like. Inert gases, particularly heavy gases such as argon can be added to enhance the anisotropic etching process.

Advantageously, the method of the invention can also be carried out using a continuous roll-to-roll process. For example, the method of the invention can be carried out using "cylindrical" RIE. Cylindrical RIE utilizes a rotating cylindrical electrode to provide anisotropically etched nanostructures on the surface of the articles of the invention.

In general, cylindrical RIE for making the nanostructured articles of the invention can be described as follows. A rotatable cylindrical electrode ("drum electrode") powered by radio-frequency (RF) and a grounded counter-electrode are provided inside a vacuum vessel. The counter-electrode can comprise the vacuum vessel itself. Gas comprising an etchant is fed into the vacuum vessel, and plasma is ignited and sustained between the drum electrode and the grounded counter-electrode. The conditions are selected so that sufficient ion bombardment is directed perpendicular to the circumference of the drum. A continuous article comprising the matrix containing the nanodispersed phase can then be wrapped around the circumference of the drum and the matrix can be etched in the direction normal to the plane of the article. The matrix can be in the form of a coating on an article such as, for example, on a film or web, or the matrix can be the article itself. The exposure time of the article can be controlled to obtain a predetermined etch depth of the resulting nanostructure. The process can be carried out at an operating pressure of approximately 10 mTorr.

In some exemplary embodiments that include a composite surface that is nanostructured and that is formed with a matrix phase and a dispersed phase, the portion of the dispersed phase that is exposed through the reactive ion etching of the matrix, and that in part leads to the formation of the nanostructured surface through its action as an etch mask, can be removed. That is, the portion of the dispersed phase that terminate the upper extents of the nanofeatures of FIG. 15 can be removed, for example in a separate etching step (dry plasma etching with a different gas composition from that selected to etch the matrix, or wet etching, for example), after the formerly described reactive ion etching step that removes matrix material anisotropically.

Although the modified substrates disclosed thus far includes a nanostructured and antireflective surface formed by reactive ion etching a composite material comprising a matrix having a dispersed phase therein, it is within the scope of the present disclosure to use a substrate that has no such composite material, but, for example, a nanostructured surface defined by reactive ion etching a substrate that is partially masked by a discontinuous surface deposit of, for example, a single phase material. Such substrates are disclosed in publications such as Plasma Processes and Polymers, Vol. 6, Issue Supplement 1, pp. S716-S-721 (2009) and Surface and Coatings Technology, Vol. 205, Issue Supplement 2, pp. S495-497 (2011).

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness of greater than 50 nanometers.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness in the range from 0.075 to 0.5 micrometer.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness in the range from 0.1 to 0.25 micrometer.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers and wherein the conductor has an average thickness of greater than 50 nanometers.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers and wherein the conductor has an average thickness in the range from 0.075 to 0.5 micrometer.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers and wherein the conductor has an average thickness in the range from 0.1 to 0.25 micrometer.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers and wherein the conductor has an average thickness of greater than 50 nanometers.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers and wherein the conductor has an average thickness in the range from 0.075 to 0.5 micrometer.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers and wherein the conductor has an average thickness in the range from 0.1 to 0.25 micrometer.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness of greater than 50 nanometers, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.075 to 0.5 micrometer, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.1 to 0.25 micrometer., and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 10 to 200 nanometers and wherein the nanoparticles are present in the matrix from 1% to 75% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness of greater than 50 nanometers, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.075 to 0.5 micrometer, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.1 to 0.25 micrometer, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

In some exemplary embodiments, an article comprises a transparent substrate having a first nanostructured surface prepared by reactive ion etching and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 20 to 100 nanometers and wherein the nanoparticles are present in the matrix from 5% to 20% by volume.

For any of the immediately aforementioned exemplary embodiments, the metallic conductor may be present in the form of a mesh micropattern comprising traces with width in the range of 0.1 to 20 micrometers, in some embodiments in the range of 0.5 to 10 micrometers, in some embodiments in the range of 0.5 to 5 micrometers, in some embodiments in the range of 0.5 to 4 micrometers, in some embodiments in the range of 0.5 to 3 micrometers, in some embodiments in the range of 0.5 to 2 micrometers, in some embodiments from 1 to 3 micrometers, in some embodiments in the range of 0.1 to 0.5 micrometers. In some embodiments, the open area of a region of the mesh conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

In one exemplary embodiment, an article comprises a transparent substrate having a first nanostructured surface and a conductor in the form of a micropattern disposed on the first nanostructured surface; wherein the first nanostructured surface comprises nanofeatures having a height from 75 to 250 nanometers, a width from 15 to 150 nanometers, and a lateral spacing from 10 to 150 nanometers; wherein the metallic conductor has an average thickness of greater than 50 nanometers; wherein the micropattern is formed by a plurality of traces defining a plurality of open area cells; wherein the micropattern has an open area fraction greater than 80%; wherein each of the traces has a width from 0.5 to 3 micrometers; wherein the nanostructured surface comprises a matrix and a nanoscale dispersed phase; wherein the nanoscale dispersed phase comprises nanoparticles having particle size from 10 to 250 nanometers; and wherein the nanoparticles are present in the matrix at a volume percent from 20 to 75%.

For any of the immediately aforementioned exemplary embodiments, the metallic conductor may further be connected to a touch sensor drive device, as discussed later.

Substrates Having Structured Particle Coating

As described above, reactive ion etching is one method of making a substrate having a nanostructured surface. A second method is described herein to produce a second type of nanostructured substrate that is useful in the present disclosure, i.e., a substrate having structured particle coating. Such methods and apparatus for making this type of a substrate are fully described in assignee's copending U.S. Provisional Patent Application No. 61/593,666, filed Feb. 2, 2011 and entitled "Nanostructured Materials and Methods of Making the Same", and is incorporated by reference in its entirety.

The second process is directed to polymerization of curable resin and submicrometer particle mixtures in a controlled inhibitor gas environment. Submicrometer, sub micrometer, and submicron are used interchangeably herein. The material can be polymerized using actinic radiation. A solution including radically curable prepolymers, submicrometer particles and solvent (optional) can be particularly well suited to the production of a surface structured article. The solvent can be a mixture of solvents. During the polymerization (first cure) a surface layer is inhibited by the presence of an inhibitor gas (e.g., oxygen and air) while the bulk of the coating is cured. A surface structure comprising protruding submicrometer particles (i.e., nanofeatures) results. The surface region is subsequently polymerized (second cure) yielding a cured structured coating. The subsequent polymerization of the surface layer can occur in the same curing chamber or in at least one additional curing chamber. The time between the first cure and the subsequent cure may be, for example, less 60 seconds (or even less than 45, 30 25, 20, 15, 10, or ever less 5 seconds); in some embodiments almost instantaneous.

Figure 16:
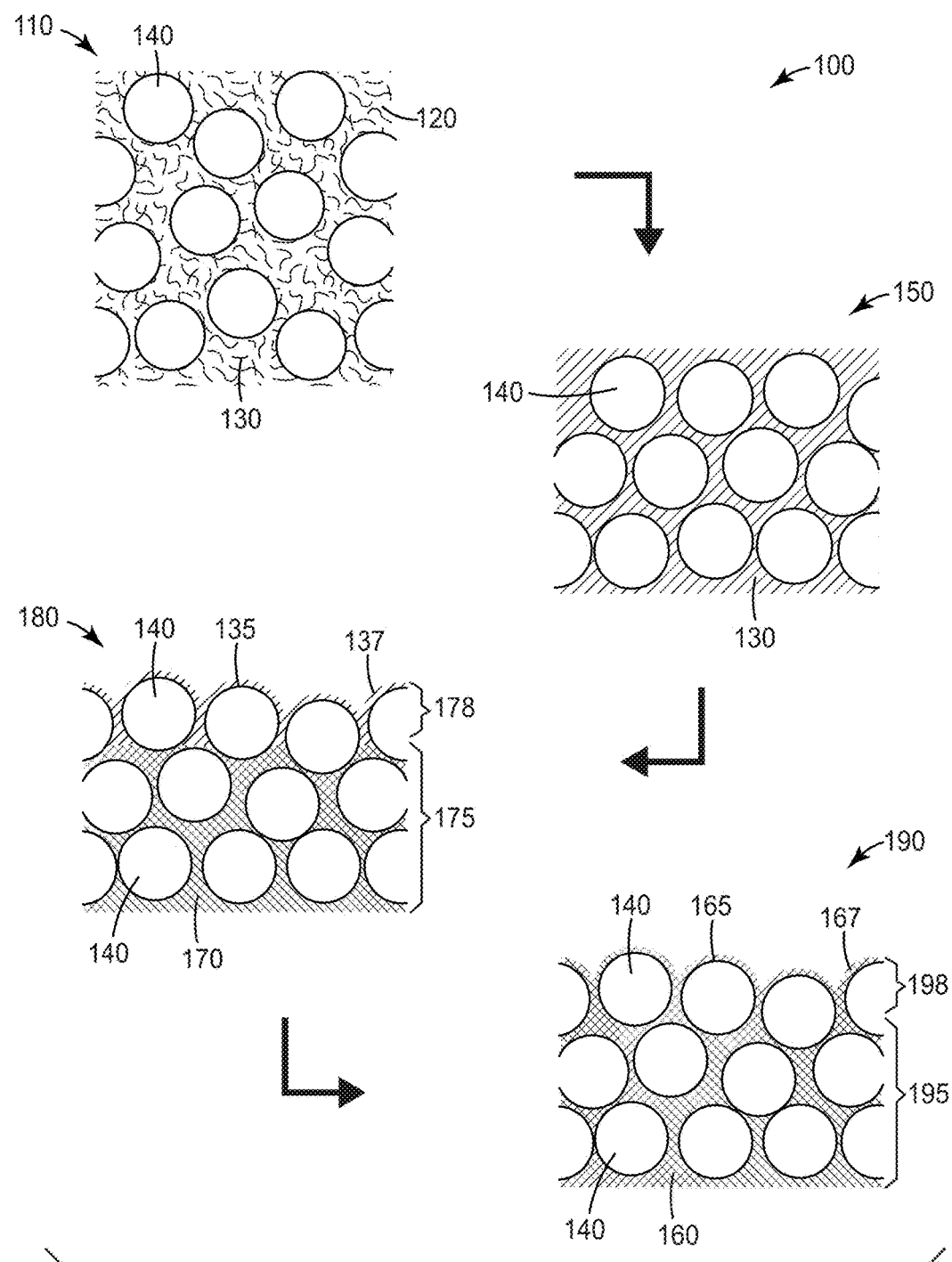
FIG. 16 is a schematic view of an exemplary process for making an exemplary nanostructured substrate comprising a structured particle coating, as described herein.

FIG. 16 is a schematic of exemplary process 100 for forming nanostructured article 180 and 190 according to one aspect of the disclosure. First solution 110 includes polymerizable material 130 and sub micrometer particles 140 in an optional solvent 120. As used herein, the term solution is sometimes applied to liquids that include particles suspended therein, and thus may also be described as suspensions or dispersions. A major portion of the solvent 120 is removed from first solution 110 to form second solution 150 containing substantially polymerizable material 130 and sub micrometer particles 140. Solution 150 is polymerized by actinic radiation curing in the presence of an inhibitor gas to a form nanostructured material 180. Nanostructured material 180 includes first and second integral regions. Second region 175 includes substantially polymerized matrix material 170 and sub micrometer particles 140. First nanostructured region 178 includes polymerizable material 135 and sub micrometer particles 140. First region 178 has outer major surface 137 wherein at least the outer most sub micrometer particles are partially conformally coated by polymerizable material 135. By "partially conformally coated" it is understood and evident, for example, from FIG. 16 that while polymerizable material 135 conformally coats a portion of the outer surface of some sub micrometer particles, some portions of these submicrometer particles have an excess amount of polymerizable material 135 beyond that that conformally coats their outer surfaces. Material 180 is further polymerized by actinic radiation to form the nanostructured material 190. Nanostructured material 190 includes first and second integral regions. Second region 195 includes polymerized matrix material 160 and submicrometer particles 140. First nanostructured region 198 includes polymerized material 165 and submicrometer particles 140. First region 198 has outer major surface 167 wherein at least outer most submicrometer particles are partially conformally coated by and optionally covalently bonded to polymer material 165. At least a portion of the submicrometer particles 140 in region 198 form nanofeatures in the form of particle protrusions (i.e., protrusive particles). Depending on the arrangement of particles, the height of particle protrusions (i.e., the vertical distance from the outermost extent of a protrusive particle to its adjacent recession) may be equal approximately to half the diameter of the particle, the entire diameter of the particle, or greater than an entire diameter of the particle. Once metallized (e.g., by sputtering), the surface of the nanostructured region (i.e., the nanostructured surface) can be penetrated with metal by an extent approximately equal to the height of the nanofeatures. First and second regions, 198 and 195, respectively, have first and second average densities, respectively, and the first average density is less than the second average density. Although not shown in FIG. 16, it is to be understood that first solution 110 can be coated on a substrate (not shown), to form a nanostructured coating on the substrate. In some embodiments, the coating can form an array of close packed partially conformally coated submicrometer particles with up to 10% (in some embodiments, up to 20%, 30%, 40%, 50%, 60%, 70%, 80%, or even at least 90%) of the submicrometer particles protruding.

In some embodiments, the average submicrometer particle center to center spacing is 1.1 (in some embodiments, at least 1:2, 1.3, 1:5, or even at least 2) diameters apart.

In some embodiments, articles described herein (e.g., some embodiments having desirable antireflection properties) have surface gradient density thickness in a range from 50 nm to 200 nm (in some embodiments, 75 nm to 150 nm). A substantially close packed (highly packed) array of protruding submicrometer particles cured into a polymer matrix can result in a durable gradient index surface layer giving rise to anti reflection. Polymerizable material (e.g., 130 in FIG. 16) (i.e., contained in the continuous phase) described herein comprises free radical curable prepolymers. Exemplary free radical curable prepolymers include monomers, oligomers, polymers and resins that will polymerize (cure) via radical polymerization. Suitable free radical curable prepolymers include (meth)acrylates, polyester (meth)acrylates, urethane (meth)acrylates, epoxy (meth)acrylates and polyether (meth)acrylates, silicone (meth)acrylates and fluorinated meth(acrylates). Exemplary radically curable groups include (meth)acrylate groups, olefinic carbon-carbon double bonds, allyloxy groups, alpha-methyl styrene groups, styrene groups, (meth)acrylamide groups, vinyl ether groups, vinyl groups, allyl groups and combinations thereof. Typically the polymerizable material comprises free radical polymerizable groups. In some embodiments, polymerizable material (e.g., 130 in FIG. 16) comprises acrylate and methacrylate monomers, and in particular, multifunctional (meth)acrylate, difunctional (meth)acrylates, monofunctional (meth)acrylate, and combinations thereof.

As used herein, the term "monomer" means a relatively low molecular weight material (i.e., having a molecular weight less than about 500 g/mole) having one or more radically polymerizable groups. "Oligomer" means a relatively intermediate molecular weight material having a molecular weight in a range from about 500 g/mole to about 10,000 g/mole. "Polymer" means a relatively high molecular weight material having a molecular weight of at least about 10,000 g/mole (in some embodiments, in a range from 10,000 g/mole to 100,000 g/mole). The term "molecular weight" as used throughout this specification means number average molecular weight unless expressly noted otherwise.

In some exemplary embodiments, the polymerizable compositions include at least one monomeric or oligomeric multifunctional (meth)acrylate. Typically, the multifunctional (meth)acrylate is a tri(meth)acrylate and/or a tetra(meth)acrylate. In some embodiments, higher functionality monomeric and/or oligomeric (meth)acrylates may be employed. Mixtures of multifunctional (meth)acrylates may also be used.

Exemplary multifunctional (meth)acrylate monomers include polyol multi(meth)acrylates. Such compounds are typically prepared from aliphatic triols, and/or tetraols containing 3-10 carbon atoms. Examples of suitable multifunctional (meth)acrylates are trimethylolpropane triacrylate, di(trimethylolpropane) tetraacrylate, pentaerythritol tetraacrylate, the corresponding methacrylates and the (meth)acrylates of alkoxylated (usually ethoxylated) derivatives of said polyols. Examples of multi-functional monomers include those available under the trade designations "SR-295," "SR-444," "SR-399," "SR-355," "SR494" and "SR-368" "SR-351"SR492", "SR350", SR415, "SR454," "SR499, 501," "SR502," "SR9020 from Sartomer Co., Exton, Pa., and "PETA-K," "PETIA." and "TMPTA-N" from Surface Specialties, Smyrna, Ga. The multi-functional (meth)acrylate monomers may impart durability and hardness to the structured surface. In some exemplary embodiments, the polymerizable compositions include at least one monomeric or oligomeric difunctional (meth)acrylate. Exemplary difunctional (meth)acrylate monomers include diol difunctional(meth)acrylates. Such compounds are typically prepared from aliphatic diols containing 2-10 carbon atoms. Examples of suitable difunctional (meth)acrylates are ethylene glycol diacrylate, 1,6-hexanediol diacrylate, 1,12-dodecanediol dimethacrylate, cyclohexane dimethanol diacrylate, 1,4 butanediol diacrylate, diethylene glycol diacrylate, diethylene glycol dimethacrylate, 1,6-hexanediol dimethacrylate, neopentyl glycol diacrylate, neopentyl glycol dimethacrylate, and dipropylene glycol diacrylate. Difunctional (meth)acrylates from difunctional polyethers are also useful. Examples include polyethylenglycol di(meth)acrylates and polypropylene glycol di(meth)acrylates.

In some exemplary embodiments, the polymerizable compositions include at least one monomeric or oligomeric monofunctional (meth)acrylate. Exemplary monofunctional (meth)acrylates and other free radical curable monomers include styrene, alpha-methylstyrene, substituted styrene, vinyl esters, vinyl ethers, N-vinyl-2-pyrrolidone, (meth)acrylamide, N-substituted (meth)acrylamide, octyl (meth)acrylate, iso-octyl (meth)acrylate, nonylphenol ethoxylate (meth)acrylate, isononyl (meth)acrylate, isobornyl (meth)acrylate, 2-(2-ethoxyethoxy)ethyl (meth)acrylate, 2-ethylhexyl (meth)acrylate, lauryl (meth)acrylate, butanediol mono(meth)acrylate, beta-carboxyethyl (meth)acrylate, isobutyl (meth)acrylate, 2-hydroxyethyl (meth)acrylate, (meth)acrylonitrile, maleic anhydride, itaconic acid, isodecyl (meth)acrylate, dodecyl (meth)acrylate, n-butyl (meth)acrylate, methyl (meth)acrylate, hexyl (meth)acrylate, (meth)acrylic acid, N-vinylcaprolactam, stearyl (meth)acrylate, hydroxy functional polycaprolactone ester (meth)acrylate, hydroxyethyl (meth)acrylate, hydroxymethyl (meth)acrylate, hydroxypropyl (meth)acrylate, hydroxyisopropyl (meth)acrylate, hydroxybutyl (meth)acrylate, hydroxyisobutyl (meth)acrylate, tetrahydrofurfuryl (meth)acrylate, and combinations thereof. The monofunctional (meth)acrylates are useful for, for example, for adjusting the viscosity and functionality of the prepolymer composition.

Oligomeric materials are also useful in making the material comprising submicrometer particles described herein. The oligomeric material contributes bulk optical and durable properties to the cured composition. Representative difunctional oligomers include Ethoxylated (30) bisphenol A diacrylate, polyethylene glycol (600) dimethacrylate, ethoxylated (2) bisphenol A dimethacrylate, ethoxylated (3) bisphenol A diacrylate, ethoxylated (4) bisphenol A dimethacrylate, ethoxylated (6) bisphenol A dimethacrylate, polyethylene glycol (600) diacrylate. Typical useful difunctional oligomers and oligomeric blends include-those available under the trade designations "CN-120", "CN-104", "CN-116", "CN-117," from Sartomer Co. and "EBECRYL 1608", "EBECRYL 3201", "EBECRYL 3700", "EBECRYL 3701", "EBECRYL 608" from Cytec Surface Specialties, Smyrna, Ga. Other useful oligomers and oligomeric blends include-those available under the trade designations "CN-2304", "CN-115", "CN-118", "CN-119", "CN-970A60", "CN-972", "CN-973A80", and "CN-975" from Sartomer Co and "EBECRYL 3200," "EBECRYL 3701," "EBECRYL 3302,"

"EBECRYL 3605," "EBECRYL 608," from Cytec Surface Specialties.

The polymeric matrix can be made from functionalized polymeric materials such as weatherable polymeric materials, hydrophobic polymeric materials, hydrophilic polymeric materials, antistatic polymeric materials, antistaining polymeric materials, conductive polymeric materials for electromagnetic shielding, antimicrobial polymeric materials, or antiwearing polymeric materials. Functional hydrophilic or antistatic polymeric matrix comprises the hydrophilic acrylates such as hydroxyethyl methacrylate (HEMA), hydroxyethyl acrylate (HEA), poly(ethylene glycol) acrylates with different polyethyle glycol (PEG) molecular weights, and other hydrophilic acrylates (e.g., 3-hydroxy propyl acrylate, 3-hydroxy propyl methacrylate, 2-hydroxy-3-methacryloxy propyl acrylate, and 2-hydroxy-3-acryloxy propyl acrylate).

In some embodiments, solvent (see, e.g., 120 in FIG. 16) can be removed from the solution 110 by drying, for example, at temperatures not exceeding the decomposition temperature of either the radiation curable prepolymer (see, e.g., 130 in FIG. 16), or the substrate (if included). In one exemplary embodiment, the temperature during drying is kept below a temperature at which the substrate is prone to deformation (e.g., a warping temperature or a glass-transition temperature of the substrate). Exemplary solvents include linear, branched, and cyclic hydrocarbons, alcohols, ketones, and ethers, including propylene glycol ethers (e.g., 1-methoxy-2-propanol), isopropyl alcohol, ethanol, toluene, ethyl acetate, 2-butanone, butyl acetate, methyl isobutyl ketone, methyl ethyl ketone, cyclohexanone, acetone, aromatic hydrocarbons, isophorone, butyrolactone, N-methylpyrrolidone, tetrahydrofuran, esters (e.g., lactates, acetates, propylene glycol monomethyl ether acetate (PM acetate), diethylene glycol ethyl ether acetate (DE acetate), ethylene glycol butyl ether acetate (EB acetate), dipropylene glycol monomethyl acetate (DPM acetate), iso-alkyl esters, iso-hexyl acetate, isoheptyl acetate, isooctyl acetate, isononyl acetate, isodecyl acetate, isododecyl acetate, isotridecyl acetate, and other iso-alkyl esters), water; and combinations thereof.

The first solution (see. e.g., 110 in FIG. 16) may also include a chain transfer agent. The chain transfer agent is preferably soluble in the monomer mixture prior to polymerization. Examples of suitable chain transfer agents include triethyl silane and mercaptans.

An initiator, such as a photoinitiator, can be used in an amount effective to facilitate polymerization of the prepolymers present in the second solution (see, e.g., 150 in FIG. 16). The amount of photoinitiator can vary depending upon, for example, the type of initiator, the molecular weight of the initiator, the intended application of the resulting nanostructured material (see, e.g., 180 and 190 in FIG. 1) and the polymerization process including, the temperature of the process and the wavelength of the actinic radiation used. Useful photoinitiators include, for example, those available from Ciba Specialty Chemicals under the trade designations "IRGACURE" and "DAROCURE", including "IRGACUR 184" and "IRGACUR 819," respectively.

Submicrometer particles include nanoparticles (e.g., nanospheres, and nanotubes). The sub micrometer particles can be associated or unassociated or both. The submicrometer particles can have spherical, or various other shapes. For example, submicrometer particles can be elongated and have a range of aspect ratios. In some embodiments, the submicrometer particles can be inorganic submicrometer particles, organic (e.g., polymeric) submicrometer particles, or a combination of organic and inorganic submicrometer particles.

In one exemplary embodiment, submicrometer particles can be porous particles, hollow particles, solid particles, or a combination thereof.

In some embodiments, the submicrometer particles are in a range from 5 nm to 1000 nm (in some embodiments, 20 nm to 750 nm, 50 nm to 500 nm, 75 nm to 300 nm, or even 100 nm to 200 nm). Submicrometer particles have a mean diameter in the range from about 10 nm to about 1000 nm. The term "submicrometer particle" can be further defined herein to mean colloidal (primary particles or associated particles) with a diameter less than about 1000 nm. The term "associated particles" as used herein refers to a grouping of two or more primary particles that are aggregated and/or agglomerated. The term "aggregated" as used herein is descriptive of a strong association between primary particles which may be chemically bound to one another. The breakdown of aggregates into smaller particles is difficult to achieve. The term "agglomerated" as used herein is descriptive of a weak association of primary particles which may be held together by charge or polarity and can be broken down into smaller entities. The term "primary particle size" is defined herein as the size of a non-associated single particle. The dimension or size of the submicrometer dispersed phase can be determined by electron microscopy (e.g., transmission electron microscopy (TEM)).

The submicrometer (including nanometer sized) particles can comprise, for example, carbon, metals, metal oxides (e.g., $SiO_2$, $ZrO_2$, $TiO_2$, ZnO, magnesium silicate, indium tin oxide, and antimony tin oxide), carbides (e.g., SiC and WC), nitrides, borides, halides, fluorocarbon solids (e.g., poly(tetrafluoroethylene)), carbonates (e.g., calcium carbonate), and mixtures thereof. In some embodiments, submicrometer particles comprises at least one of $SiO_2$ particles, $ZrO_2$ particles, $TiO_2$ particles, ZnO particles, $Al_2O_3$ particles, calcium carbonate particles, magnesium silicate particles, indium tin oxide particles, antimony tin oxide particles, poly(tetrafluoroethylene) particles, or carbon particles. Metal oxide particles can be fully condensed. Metal oxide particles can be crystalline.

The weight ratio of sub micrometer particles or the modified sub micrometer particles (dispersed phase) to radically curable prepolymer (matrix) is one measure of the particle loading. In some embodiments, particles are present in the matrix in an amount in a range from about 10:90 to 80:20 (in some embodiments, for example, 20:80 to 70:30). In terms of volume percent, in some embodiments, sub micrometer particles are present in the matrix in an amount in the range from about 40 volume percent to 85 volume percent (i.e., 40:60 to 85:15 by volume for particles:matrix). More preferably the particles are present in the matrix in an amount in the range from 45 volume percent to 75 volume percent, even more preferably in a range from 50 volume percent to 70 volume percent. The nanostructured surface typically comprises nanofeatures that have a height of from 50 to 750 nanometers, in some cases from 75 to 300 nanometers, and in some cases 100 to 200 nanometers. Once metallized (e.g., by sputtering), the nanostructured surface can be penetrated with metal by an extent approximately equal to the height of the nanofeatures. The nanostructured surface typically comprises nanofeatures that have width (e.g., at about half their height) of from 15 to 200 nanometers, in some cases from 50 to 125 nanometers. The nanostructure surface typically comprises nanofeatures that have lateral spacing (i.e., spacing at about half the height of the nanofeatures, in the plane of the nanostructured major surface) of from 5 to 500 nanometers, in some cases from 15 to 100 nanometers.

The submicrometer particles can be surface treated using the same process and surface treating agents as described in the Reaction Ion Etching (RIE) process described above. Surface leveling agents disclosed in the RIE process can also be used for this second process of making a substrate having structured particle coating.

The process for creating the nanostructured coatings generally includes (1) providing a coating solution comprising surface modified sub-micron particles, radically curable prepolymers and solvent (optional); (2) supplying the solution to a coating device; (3) applying the coating solution to a substrate by one of many coating techniques; (4) substantially removing the solvent (optional) from coating; (5) polymerizing the material in the presence of a controlled amount of inhibitor gas (e.g., oxygen) to provide a structured surface; and (6) optionally post-processing the dried polymerized coating, for example, by additional thermal, visible, ultraviolet (UV), or e-beam curing. As already described above, the product of these steps yields a composite coating material wherein at least the outer most submicrometer particles are partially conformally coated by polymerizable material. It is within the scope of the present disclosure for the polymerizable material that at least partially conformally coats the outer most submicrometer particles to be subsequently removed, before being metallized, for example by sputtering. Removal of the polymerizable material that at least partially conformally coats the outer most submicrometer particles may include reactive ion etching, as described here.

Figure 17A:
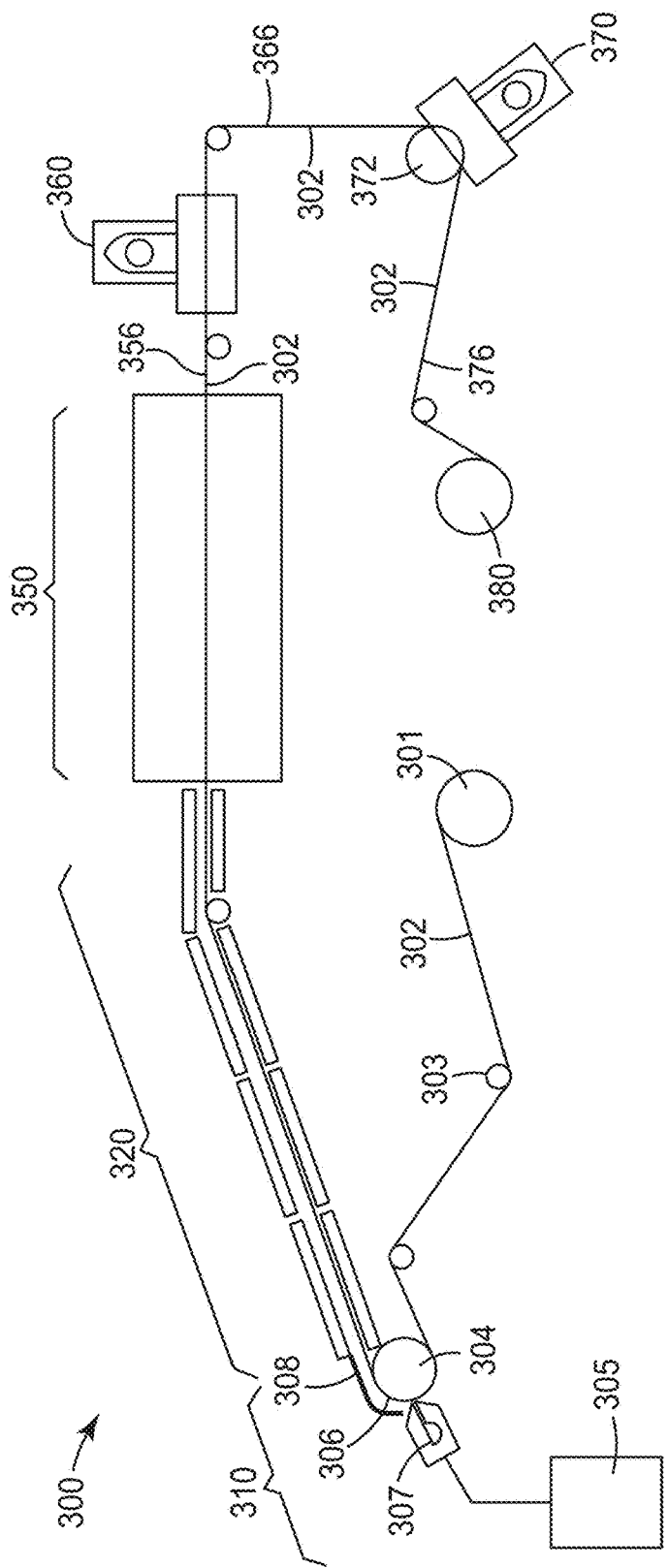
FIG. 17A is a schematic view of an exemplary process for making an exemplary nanostructured material described herein.

FIG. 17A shows a schematic view of exemplary process 300 for making nanostructured coatings 366 and 376 on substrate 302. Process 300 shown in FIG. 17A is a continuous process, although it is to be understood that the process can instead be performed in a stepwise manner (i.e., the steps of coating, removing solvent (optional), and polymerizing described below can be performed on individual substrate pieces in discrete operations to form a nanostructured coating (material).

Process 300 shown in FIG. 17A passes substrate 302 through coating section 310. Process 300 has optional first solvent removal section 320 and optional second solvent removal section 350 to form coating 356 on substrate 302. Coating 356 on substrate 302 then passes through polymerization section 360 to form nanostructured coating 366 on substrate 302, and optional second polymerization section 370 to form nanostructured coating 376 on substrate 302 which is then wound up as output roll 380. Optional polymerization section 370 can be provided with temperature controlled backup roll 372. In some embodiments, process 300 includes additional processing equipment common to the production of web-based materials, including idler rolls; tensioning rolls; steering mechanisms; surface treaters (e.g., corona or flame treaters); and lamination rolls. In some embodiments, process 300 utilizes different web paths, coating techniques, polymerization apparatus, positioning of polymerization apparatus, and drying ovens, where some of the sections described are optional.

Substrate 302 is unwound from input roll 301, passes over idler rolls 303 and contacts coating roll 304 in coating section 310. First solution 305 passes through coating die 307 to form first coating 306 of first solution 305 on substrate 302. First solution 305 can include solvents, polymerizable materials, submicrometer particles, photoinitiators, and any of the other first solution components described herein. Shroud 308 positioned between coating die 307 in coating section 310, and first solvent removal section 320 protects coating 306 from ambient conditions in the room and reduces any undesirable effects on the coating. Shroud 308 can be, for example, a formed aluminum sheet that is positioned in close proximity to first coating 306 and provides a seal around coating die 307 and coating roll 304. In some embodiments, shroud 308 can be optional.

First optional solvent removal section, can be a gap dryer apparatus described, for example, in U.S. Pat. No. 5,694,701 (Huelsman et al.) and U.S. Pat. No. 7,032,324 (Kolb et al.). A gap dryer can provide greater control of the drying environment, which may be desired in some applications. Optional second solvent removal section 350 can further be used to ensure that a major portion (i.e., greater than 90% (in some embodiments, greater than 80%, 70%, 60%, or even greater than 50%) by weight) of the solvent is removed. Solvent can be removed, for example, by drying in a thermal oven that can include, for example, air floatation/convection, vacuum drying, gap drying, or a combination of drying techniques. The choice of drying technique may depend, for example, on the desired process speed, extent of solvent removal, and expected coating morphology.

Figure 17B:
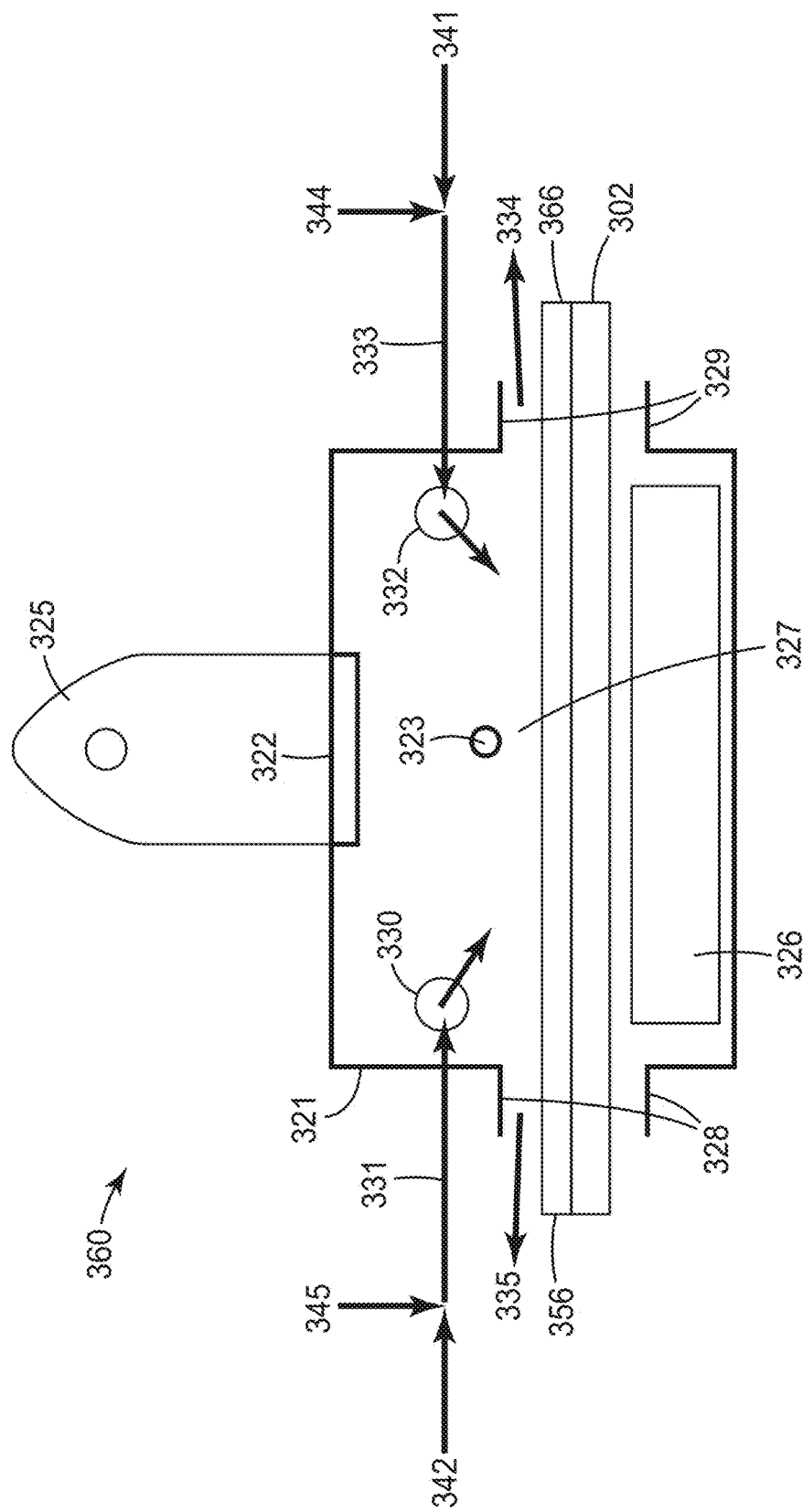
FIG. 17B is a schematic view of a polymerization section of FIG. 17A.
Figure 17C:
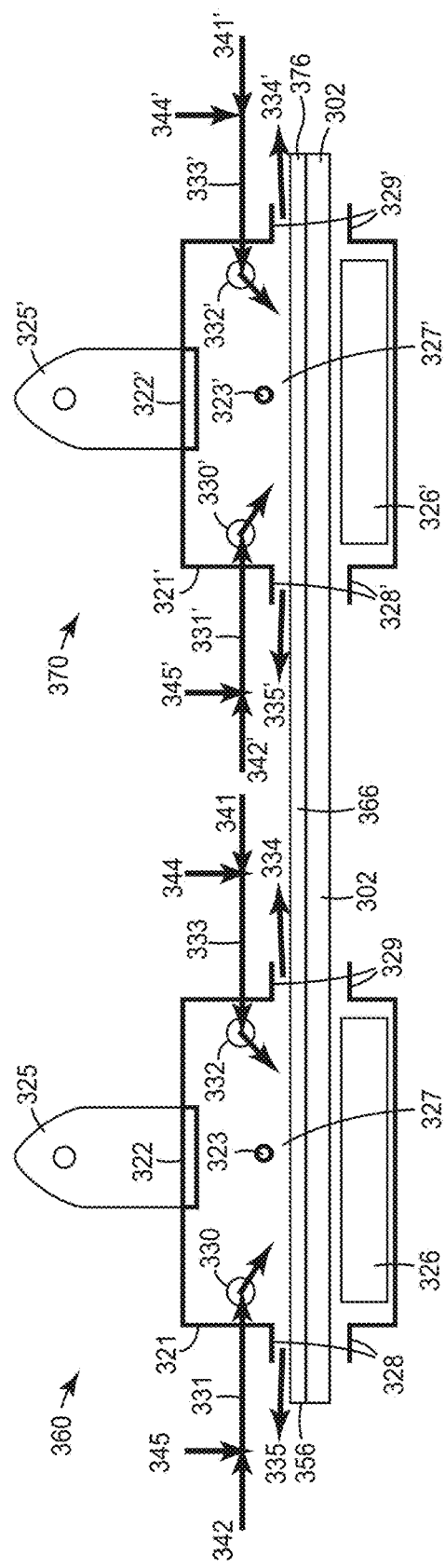
FIG. 17C is a schematic view of two uncoupled polymerization sections in series of FIG. 17A.
Figure 18:
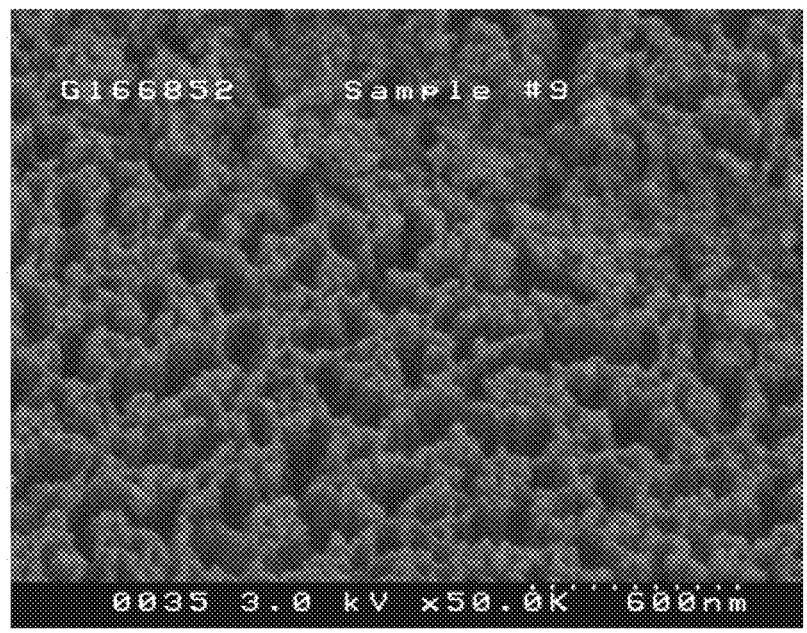
FIG. 18 is a plan view scanning electron photomicrograph of the nanostructured surface of the substrate of Example 15 (before metallization), prepared by reactive ion etching.
Figure 19:
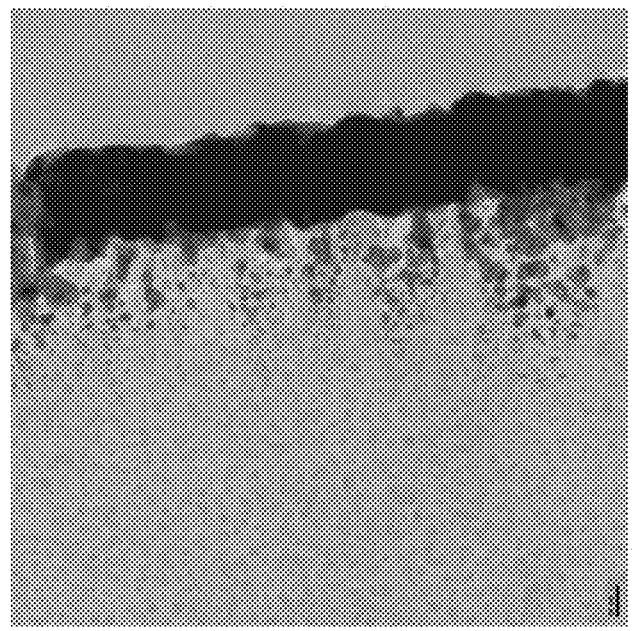
FIG. 19 is a cross-sectional transmission electron photomicrograph of the metallized nanostructured surface of the substrate of Example 15 (after metallization)
Figure 20:
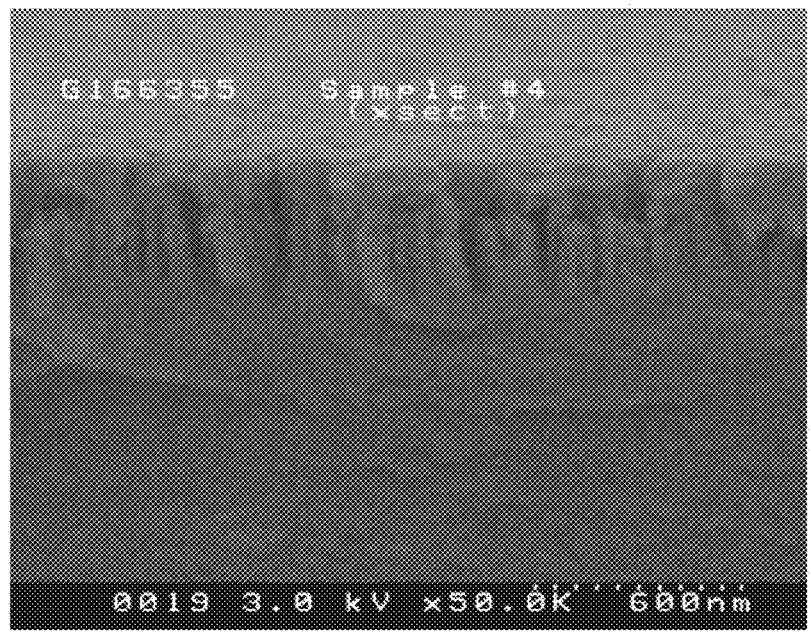
FIG. 20 is a cross-sectional scanning electron photomicrograph of the metallized nanostructured surface of the substrate of Example 15 (after metallization)
Figure 21:
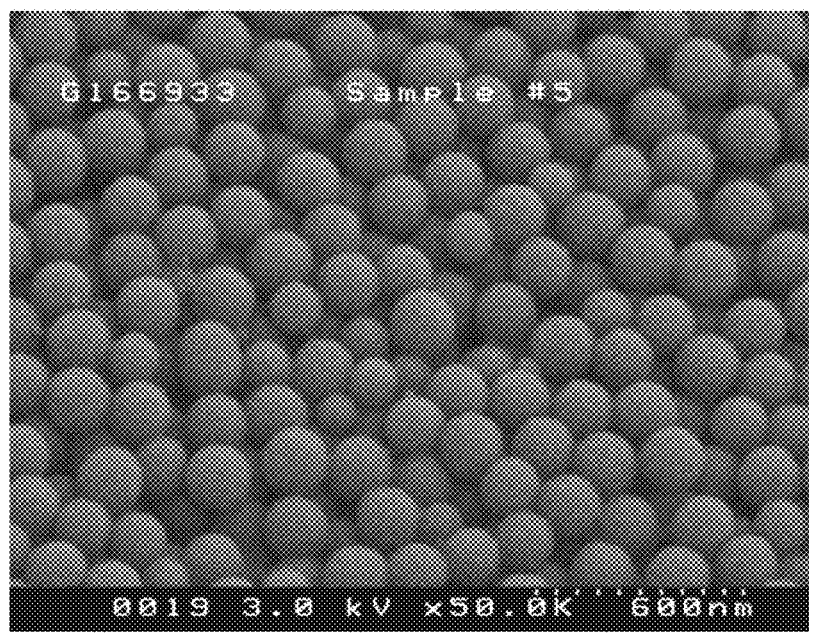
FIG. 21 is a plan view scanning electron photomicrograph of the nanostructured surface of the substrate of Example 112 (before metallization)
Figure 22:
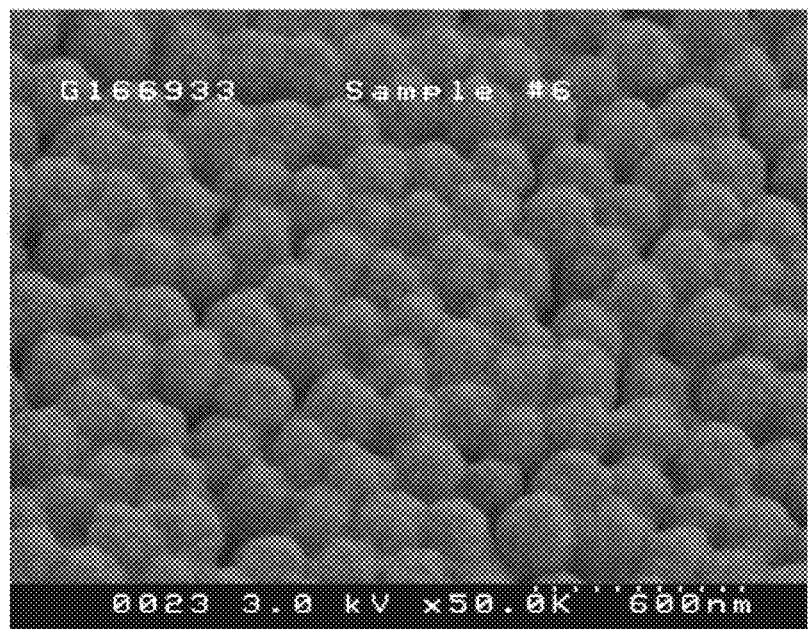
FIG. 22 is a plan view scanning electron photomicrograph of the nanostructured surface of the substrate of Example 112 (after metallization)
Figure 23:
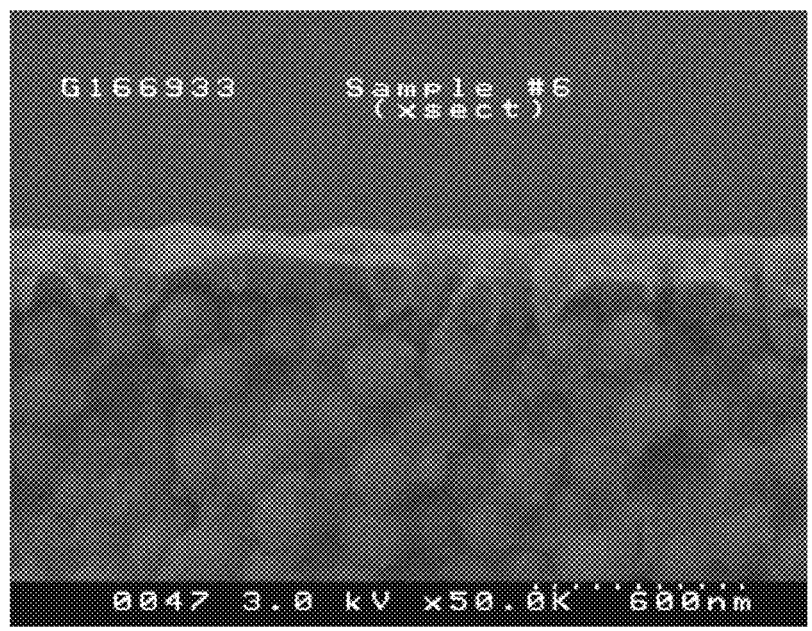
FIG. 23 is a cross-sectional view scanning electron photomicrograph of the nanostructured surface of the substrate of Example 112 (after metallization)
Figure 24:
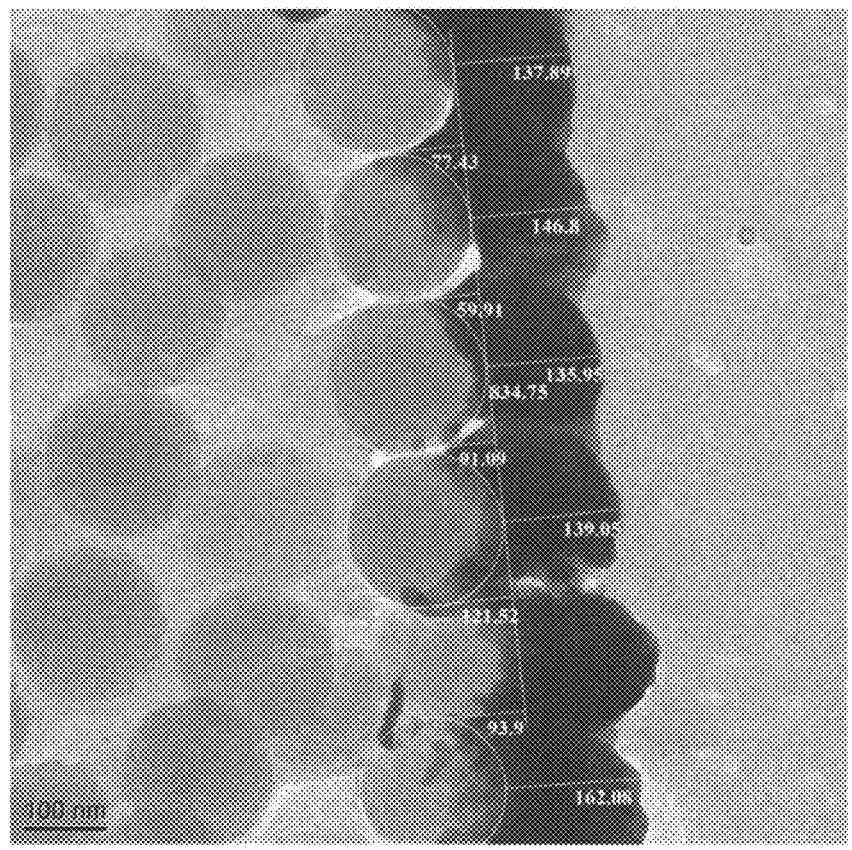
FIG. 24 is a cross-sectional view transmission electron photomicrograph of the nanostructured surface of the substrate of Example 112 (after metallization), including measurements of silver metallization overlayer thickness and penetration.

FIG. 17B is a schematic view of polymerization section 360 (and 370) of process 300 shown in FIG. 17A. FIG. 17B shows a cross-section of a polymerization section 360 (and 370) as viewed along an edge of substrate 302. Polymerization section 360 includes housing 321 and quartz plate 322 that provide boundaries between radiation source 325 and cure chamber environment 327. Cure chamber environment 327 partially surrounds first coating 356 and (at least partially) polymerized coating 366 on substrate 302. At least partially polymerized coating 366 includes nanostructures described herein.

Controlled cure chamber environment 327 will now be described. Housing 321 includes entrance aperture 328 and exit aperture 329 that can be adjusted to provide any desired gap between substrate 302, coating 356 on substrate 302, and the respective aperture. Controlled cure chamber environment 327 and first and second coatings 356 and 366 temperatures can be controlled by the temperature of platen 326 (or temperature controlled roll for cure chamber 370) (which can be fabricated from metal that is cooled by, for example, either air or water to control the temperature by removing the generated heat) and appropriate control of the temperature, composition, pressure and flow rate of first input gas 331, second input gas 333, first output gas 335 and second output gas 334. Appropriate adjustment of the sizes of entrance and exit apertures 328, 329, respectively, can aid control of the pressure and flow rate of first and second output gases 335, 334 respectively. The inhibitor gas content is monitored through port 323 in chamber housing 321.

First input gas manifold 330 is positioned within housing 321 proximate entrance aperture 328, to distribute first input gas 331 uniformly across the width of first coating 356. Second input gas manifold 332 is positioned within housing 321 proximate exit aperture 329, to distribute second input gas 333 uniformly across the width of second coating 366. First and second input gases 331, 333, respectively, can be the same or they can be different, and can include inert gasses 341 and 342 (e.g., nitrogen and carbon dioxide) combined with inhibition gasses 344 and 345 (e.g., oxygen and air), which can be combined to control the concentration of inhibition gas in input gas 331 and 333. The relative compositions, flow rates, flow velocities, flow impingement or orientation on the coating, and temperature of each of first and second input gases 331, 333, respectively, can be controlled independently, and can be adjusted to achieve the desired environment in the radiation cure chamber. In some embodiments, only one of first and second input gases 331, 333, respectively, may be flowing. Other configurations of input gas manifolds are also possible.

Nanostructured coating 366 on substrate 302 exits polymerization section 360 and then passes through optional second polymerization section 370 to form an optionally second nanostructured coating 376 on substrate 302. Optional second polymerization section can increase the extent of cure of nanostructured coating 366. In some embodiments, increasing the extent of cure can include polymerizing remaining polymerizable material (i.e., remaining polymerizable material (see, e.g., 135 in FIG. 16)). Nanostructured coating 376 on substrate 302 exits optional second polymerization section 370 and is then wound up as an output roll 380. In some embodiments, output roll 380 can have other desired films (not shown) laminated to the nanostructured coating and simultaneously wound on the output roll 380. In other embodiments, additional layers (not shown) can be coated, cured, and dried on either nanostructured coating 366 and 376 or substrate 302.

Radiation source 325 can be any of a variety of actinic radiation sources (e.g., UV LEDs, visible LEDs, lasers, electron beams, mercury lamps, xenon lamps, carbon arc lamps, tungsten filament lamps, flashlamps, sunlight, and low intensity ultraviolet light (black light)). In some embodiments, radiation source 325 is capable of producing UV radiation. A combination of radiation sources emitting at different wavelengths can be used to control the rate and extent of the polymerization reaction. The radiation sources can generate heat during operation, and heat extractor 326 can be fabricated from aluminum that is cooled by either air or water to control the temperature by removing the generated heat.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness of greater than 50 nanometers.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness in the range from 0.075 to 0.5 micrometer.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers and wherein the conductor has an average thickness in the range from 0.1 to 0.25 micrometer.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers and wherein the conductor has an average thickness of greater than 50 nanometers.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers and wherein the conductor has an average thickness in the range from 0.075 to 0.5 micrometer.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers and wherein the conductor has an average thickness in the range from 0.1 to 0.25 micrometer.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers and wherein the conductor has an average thickness of greater than 50 nanometers.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers and wherein the conductor has an average thickness in the range from 0.075 to 0.5 micrometer.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers and wherein the conductor has an average thickness in the range from 0.1 to 0.25 micrometer.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness of greater than 50 nanometers, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.075 to 0.5 micrometer, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.1 to 0.25 micrometer., and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 50 to 250 nanometers and wherein the nanoparticles are present in the matrix from 40% to 85% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness of greater than 50 nanometers, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.075 to 0.5 micrometer, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 50 to 750 nanometers, a width from 15 to 200 nanometers, and a lateral spacing from 5 to 500 nanometers, wherein the conductor has an average thickness in the range from 0.1 to 0.25 micrometer., and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 75 to 300 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness of greater than 50 nanometers, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.075 to 0.5 micrometer, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

In some exemplary embodiments, an article comprises a transparent substrate having a first nanostructured surface in the form of a structured particle coating and a metallic conductor disposed on the first nanostructured surface, wherein the first nanostructured surface comprises nanofeatures having a height from 100 to 200 nanometers, a width from 50 to 125 nanometers, and a lateral spacing from 15 to 100 nanometers, wherein the conductor has an average thickness in the range from 0.1 to 0.25 micrometer, and wherein the nanostructured surface comprises a matrix and a nanoscale dispersed phase that comprises nanoparticles having a particle size from 100 to 200 nanometers and wherein the nanoparticles are present in the matrix from 45% to 75% by volume.

For any of the immediately aforementioned exemplary embodiments, the metallic conductor may be present in the form of a mesh micropattern comprising traces with width in the range of 0.1 to 20 micrometers, in some embodiments in the range of 0.5 to 10 micrometers, in some embodiments in the range of 0.5 to 5 micrometers, in some embodiments in the range of 0.5 to 4 micrometers, in some embodiments in the range of 0.5 to 3 micrometers, in some embodiments in the range of 0.5 to 2 micrometers, in some embodiments from 1 to 3 micrometers, in some embodiments in the range of 0.1 to 0.5 micrometers. In some embodiments, the open area of a region of the mesh conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

For any of the immediately aforementioned exemplary embodiments, the metallic conductor may further be connected to a touch sensor drive device, as discussed later.

Method of Making the Conductor Micropatterns

Conductor micropatterns having the disclosed designs can be prepared using any suitable method. Examples of methods for preparing conductor micropatterns include subtractive or additive methods. Exemplary subtractive methods include placement of a patterned mask on a metallic coating disposed on a substrate (e.g., a visible light transparent substrate), followed by selective etching (with metal being removed from regions of the metallic coating that are not covered by the mask, and with metal remaining in regions of the metallic coating that are covered by the mask). Suitable masks include photoresist (patterned by photolithography, as is known in the art), printed polymers (patterned by, for example, gravure, flexographic, or inkjet printing), or printed self-assembled monolayers (for example, printed using microcontact printing with an elastomeric relief stamp). Other exemplary subtractive methods include initial placement of a patterned lift-off mask on a substrate (e.g., a visible light transparent substrate), blanket coating of masked and unmasked regions with a metallic conductor (e.g., thin film metal), and washing of the lift-off mask and any metal disposed thereon. Exemplary additive processes include printing of electroless deposition catalyst on a substrate (e.g., visible light transparent substrate) in the form of the desired micropattern geometry, followed by patterned electroless metal deposition (e.g., copper or nickel).

Preferred methods for generating the conductor micropatterns include microcontact printing. As compared with other means for reducing the reflectance of conductor patterns (coating with a carbon black-filled material or partially reacting the metal to form an absorbing reaction product such as a sulfide), the means described herein were found to be particularly well-suited for combination with a patterning approach based on microcontact printing and etching, thus enabling specific micropattern design parameters (e.g., trace width from 0.5 to 10 micrometers, from 0.5 to 5 micrometers, from 0.5 to 4 micrometers, from 0.5 to 3 micrometers, or from 1 to 3 micrometers) and conductor thickness (e.g., from 0.025 to 2 micrometer, from greater than 0.05 to 2 micrometer, from greater than 0.05 to 1 micrometer, 0.075 to 0.5 micrometer, or from 0.1 to 0.25 micrometer) to be fabricated. The placement of carbon black-filled materials on micron scale features is impractical. The partial chemical conversion of sub-micron thick metals (e.g., 0.075 to 0.5 micrometer, or from 0.1 to 0.25 micrometer) to an absorptive reaction product is not effective for substantially reducing the reflectance without also substantially reducing the electrical conductance of the layer.

In the case of the substrate (e.g., visible light transparent) comprising nanostructured surface that is antireflective when exposed to air: a substrate is provided that includes a surface that is nanostructured and that is antireflective when exposed to air; a metallic conductor is deposited (e.g., by sputtering or by evaporation) onto the surface; a self-assembled monolayer (SAM) is printed in a pattern using an elastomeric stamp; and finally the metal is etched from deposited metal regions not having the SAM and not etched from deposited metal regions that include the SAM.

Method of Making a Making an Article Using Micropattern Conductors

A conductor micropattern disposed on a surface of a substrate is useful for making a number of different articles. Components that comprise transparent conductive patterns include touch sensor panels for touch displays. Some touch sensor panels for touch displays, for example some touch sensor panels that are suitable for combination with electronics that utilize mutual capacitance mode detection and that may include multi-touch resolution capability, include two or more conductor patterns that are overlaid. Two or more conductor patterns that are overlaid can be generated by laminating two substrates together with a clear adhesive, each substrate having disposed on one its major surfaces a conductor micropattern according to the present disclosure. Such laminated articles can be visible light transparent when the substrates are transparent and when the conductor micropattern have high open area fraction. Examples of suitable substrates for forming laminated constructions include the polymeric film substrates listed above.

Examples of suitable adhesive materials for forming laminated constructions are optically clear adhesive that exhibit an optical transmission of at least about 90%, or even higher, and a haze value of below about 5% or even lower. Optical transmission and haze can be measured by disposing it between a 25 micrometer Melinex® polyester film 454 (from DuPont Company, Wilmington, Del.) and a A 75×50 millimeter plain micro slide (a glass slide from Dow Corning, Midland, Mich.) using a Model 9970 BYK Gardner TCS Plus Spectrophotometer (from BYK Gardner, Columbia, Md.). Suitable optically clear adhesive may have antistatic properties, is compatible with metal-based conductors, may be able to be released from the glass substrate by stretching the adhesive described in Illustrative optically adhesive include those described in PCT International Publication No. WO 2008/128073 relating to antistatic optically pressure sensitive adhesive, U.S. Patent Application Publication Nos. US 2009-030084 A1 relating to stretch releasing optically clear pressure sensitive adhesive, US 2010-0028564 A1 relating to antistatic optical constructions having optically transmissive adhesive, PCT International Publication Nos. WO 2009/114683 relating to optically clear stretch release adhesive tape, WO 2010/019528 relating to adhesives compatible with corrosion sensitive layers, and WO 2010/078346 stretch release adhesive tape. In one embodiment, the optically clear adhesive has a thickness of about 5 μm or less.

A substrate having the conductor micropattern disposed thereon, or alternatively a laminate comprising two or more substrates having the conductor micropatterns disposed thereon, can be further laminated to a display, for example a liquid crystal display (LCD), an organic light-emitting diode (OLED) display, a plasma display panel (PDP), an electophoretic display (EP), or an electrowetting display. Such a substrate or laminate can be laminated to the display using the referenced adhesive materials. A substrate having the conductor micropattern disposed thereon, or alternatively a laminate comprising two or more substrates having the conductor micropatterns disposed thereon, can be further laminated to another material, for example a rigid support such as a thick (e.g., 1 millimeter) polymer sheet or glass sheet. Examples of rigid supports include the lenses of mobile handheld devices such as mobile phones or smart phones.

In some embodiments, a conductor micropattern as described herein is disposed on more than one side of a substrate, for example on each major surface of a flat substrate that may be flexible or rigid, as already described. For applications that require two conductor micropatterns that are nominally parallel in orientation and spaced apart in the direction normal to the micropatterns, it may be advantageous for the two micropatterns to be disposed on each side of the same flat substrate, for example on each side of a polymer film.

Applications

In some embodiments, the articles described herein comprise a conductor micropattern comprising non-linear traces defining an open micropattern of a cell geometry disposed on or in a visible light transparent substrate. In some such embodiments, the conductor micropattern forms at least a portion of an EMI shield. In some such embodiments, the conductor micropattern forms at least a portion of an antenna. In some such embodiments, the conductor micropattern forms at least a portion of a touch sensor (for example a touch screen sensor). In some embodiments, the conductor micropattern forms at least a portion of a projected capacitive touch screen sensor. For example, two overlaying micropatterns (e.g., disposed on opposite sides of the same substrate or on separate substrates, laminated together), in the form of contiguous mesh elements in the shapes of row and column bars in the respective micropatterns can form a transparent matrix of sensor elements that can be driven with electronics (i.e., touch sensor drive device) that allow detection of touch events to the sensor through measurements of self-capacitance or mutual capacitance of the elements, as is known in the art (and as elaborated upon in a later example). Examples of touch sensor drive devices are given in U. S. Patent Publication No. US2010/073323, PCT Patent Publication No. WO2011/069114, and U.S. Pat. No. 7,288,946. In some such embodiments, the conductor micropattern forms at least a portion of a display electrode, for example a counterelectrode, for example a counterelectrode in an electrophoretic display.

In some embodiments, the articles described herein comprise a first conductor micropattern comprising non-linear traces defining a first open micropattern of a cell geometry disposed on or in a visible light transparent substrate and a second conductor micropattern comprising non-linear traces defining a second open micropattern of a cell geometry electrically isolated from the first conductor micropattern. The second conductor micropattern may be disposed on the same substrate as the first conductor micropattern, or it may be disposed on another substrate. The second conductor micropattern overlays the first conductor micropattern.

In some embodiments, both conductor micropatterns form at least a portion of a touch sensor, for example a touch screen sensor.

In some embodiment, both conductor micropatterns form at least a portion of an electrophoretic display.

Alternatively, in another embodiment, one of the conductor micropatterns forms at least a portion of a touch sensor, for example a touch screen sensor, and the other conductor micropattern may function as an antenna for wireless communication.

In yet another embodiment, one of the conductor micropatterns forms at least a portion of a touch sensor, for example a touch screen sensor, and the other conductor micropattern may function as an electromagnetic interference (EMI) shield.

In yet another embodiment, one of the conductor micropatterns forms at least a portion of an antenna for wireless communication and the other conductive micropattern may function as an electromagnetic interference (EMI) shield.

EXAMPLES

Substrates

Two different substrates were used in this example section.

A first substrate was a visible light transparent substrate of polyethylene terephthalate ("PET-3") having a thickness of approximately 125 micrometers, commercially available as product number ST504 from E.I. du Pont de Nemours, Wilmington, Del. was used.

A second substrate was a structured triacetate film ("Structured TAC") prepared according to the disclosure of WO 2010/07871 A1. The starting substrate was a cellulose triacetate film having a thickness of 75 micrometers (commercially available from Island Pyrochemical Industries Corp., New York, N.Y.). This TAC film was thus modified to contain a nanostructure on a first surface of the substrate. The nanostructured surface exhibited a reflectance of 0.1-0.2%. The nanostructured surface exhibited a transmitted haze of 0.2-0.4%. The nanostructured surface comprised nanofeatures that were 100 to 250 nanometers in height. The height to width ratio (anisotropy) of the nanofeatures was greater than one.

Conductor

Onto the PET substrate or the Structured TAC substrate was deposited the following conductive coatings:

(1) a "sputtered silver" film, which is a multilayer construction of 5 angstrom thick of titanium disposed directly on the substrate followed by 100 nanometers thick of silver, both deposited using known vacuum sputtering methods, or (2) an "evaporated silver" film, which is a multilayer construction of 5 angstrom thick of titanium disposed directly on the substrate followed 100 nanometer thick of silver, both deposited using known electron-beam evaporation methods;

After deposition of the conductive coating, the substrate has a coated side containing the conductive coating and an opposite side, i.e., side with no conductive coating.

The conductive coating used for each geometry for examples herein was patterned by printing octadecylthiol self-assembled monolayer mask on its surface, followed by wet chemical etching, as described in U.S. Patent Application Publication No. US 2009/0218310.

Characterization of Substrate

The average percent reflection (% R) was used to measure both major surfaces (coated and bare sides) of the substrate (whether PET or Structured TAC) using a BYK Gardner color guide sphere.

One sample of each film was prepared by applying Yamato Black Vinyl Tape #200-38 (commercially available from Yamato International Corporation, Woodhaven, Mich.) to the opposite side of the measuring surface using a roller to minimize trapping air bubbles. To measure the surface total % reflection (specular and diffuse), the non-taped side of the sample was placed against an aperture of BYK Gardiner Color-Guide Sphere. The % reflection was measured at 10° incident angle for the wavelength range of 400 to 700 nm. Note that when reflectivity is measured from the bare side (i.e., opposite the conductor-coated side), the measured reflectivity includes reflection from the interface between the substrate film and air. The % R for the substrates with the conductors are shown in Table 1 below

TABLE 1

Reflectance measurements

| Substrate Type | Conductive Coating Type | Reflectance (%), measured from coated side | Reflectance (%), measured from bare side |
| --- | --- | --- | --- |
| PET-3 | Sputtered Ag | 93.71 | 88.68 |
| PET-3 | Evaporated Ag | 92.65 | 88.89 |
| Structured TAC | Sputtered Ag | 79.44 | 7.52 |

Comparative Example C1

This example was made by using PET substrate and Sputtered Ag conductor using a regular hexagon conductor micropattern. The trace widths were approximately 2 micrometers. The diameter of the hexagonal cells (from face to parallel face) was approximately 200 micrometers. The open area fraction was approximately 98%.

Comparative Example C2

This example was made by using PET substrate and Sputtered Ag conductor using a regular hexagon conductor micropattern. The trace widths were approximately 2 micrometers. The open area fraction was approximately 98%.

Examples 3 Through 6

These examples were made by using the Structured TAC substrate and Sputtered Silver conductor with a regular hexagonal micropattern (Ex. 3), a pseudorandom hexagonal micropattern (Ex. 4), a partially curved hexagonal micropattern (Ex. 5) and a fully curved hexagonal micropattern (Ex. 6). In all cases, the trace widths were approximately 2 micrometers and the open area fractions were approximately 98%.

Example 7

This example can be made using the Structured TAC substrate and Sputtered Silver conductor with a pseudorandom curved micropattern.

In this Example section, there are no examples 8, 9 or 10.

TABLE 2

Summary of the examples

| Example Number | Substrate Type | Conductive Coating Type | Pattern Design Type |
|---|---|---|---|
| C1 | PET | Sputtered Ag | regular hexagon |
| C2 | PET | Sputtered Ag | pseudorandom hexagon |
| 3 | Structured TAC | Sputtered Ag | regular hexagon |
| 4 | Structured TAC | Sputtered Ag | pseudorandom hexagon |
| 5 | Structured TAC | Sputtered Ag | partially curved hexagon |
| 6 | Structured TAC | Sputtered Ag | fully curved hexagon |
| 7 | Structured TAC | Sputtered Ag | pseudorandom curved |

Characterization of the Articles

Laminated articles having one or more conductor micropatterns were evaluated for the conspicuity of their micropatterns under sunlight illumination. The evaluation included visual inspection without magnification (unaided eye). The samples were further imaged using a digital camera (iPhone 3GS, Apple Computer Corp, Cupertino, Calif.). The sunlight illumination upon each sample was first attenuated by passage through a typical commercial architectural double-pane insulated glass unit window having a semi-reflective energy-management film applied, in order to reduce the intensity of light reaching the eye or the camera to a more suitable level for viewing or recording. A number of visual effects contributed to the conspicuity of the various micropatterns. A first such visual effect category is described herein as "starburst," which takes the form of a bright reflective pattern in the shape of a multi-pointed star when illuminated with bright (non-diffuse) sunlight. A regular hexagonal mesh can give rise to a six-pointed starburst. A regular square mesh can give rise to a four-pointed starburst. A second visual effect category is described herein as "rainbow," which takes the form of a band of reflection exhibiting a spectrum of colors along the band when illuminated with bright (non-diffuse) sunlight. A third visual effect category is described herein as "colored halo," which takes the form of diffuse pink and green halos that surround the point of direct specular reflection when illuminated with bright (non-diffuse) sunlight. A fourth visual effect category is described herein as "sparkle," which takes the form of bright points of light across the micropattern when illuminated with bright (non-diffuse) sunlight.

TABLE 3

Results of visual inspection for conductor micropattern examples

| Example Number | Starburst Score | Rainbow Score | Colored Halo Score | Sparkle Score |
|---|---|---|---|---|
| C1 | ⊗ | ⊗ | ⊕ | ⊕ |
| C2 | ⊗ | ⊕ | ⊕ | ⊗ |
| 3 | ⊕ | ⊕ | ⊕ | ⊕ |
| 4 | ⊕ | ⊕ | ⊕ | ⊕ |
| 5 | ⊕ | ⊕ | ⊕ | ⊕ |
| 6 | ⊕ | ⊕ | ⊕ | ⊕ |

The data in TABLE 3 in terms of score for starburst, rainbow, sparkle and colored halo are reported in terms of an acceptable visual appearance score, represented by ⊕ and an unacceptable visual appearance score ⊗. In determining the score, an acceptable score did not imply a total absence of the visual artifact (whether it is a starburst, rainbow, halo or sparkle) but, if present, the level of the artifact is at a level where it may be acceptable to a user (at least, more acceptable than for examples scored with ⊗). For Examples 3-6, as compared with C1 and C2, an improvement in appearance (less conspicuous features of the micropattern) was achieved for evaluation from either direction, relative to the micropattern (i.e., from the substrate film (nanostructure surface) side or from the side opposite the substrate film). The improvement (reduced conspicuity) was greater for evaluation (viewing) from the substrate film side.

Results of electrical and transmitted optical measurements for laminated conductor micropattern examples are reported in Table 4. Entries assigned to TAC and PET were derived from measurements made for each substrate type, laminated to glass as described above (baseline data). The light transmittance (% T), clarity (% C), and transmitted haze (% H) were measured using a Haze-Gard Plus (BYK-Gardner, Columbia, Md.).

TABLE 4

| Example Number | % T Film Side | % H Film Side | % C Film Side | % T Glass Side | % H Glass Side | % C Glass Side | Sheet Resist (ohm/sq) |
|---|---|---|---|---|---|---|---|
| C1 | 90.2 | 2.17 | 99.5 | 90.1 | 2.08 | 99.6 | 30 |
| C2 | 90.1 | 2.59 | 99.5 | 90.1 | 2.64 | 99.5 | 28 |
| 3 | 90.8 | 2.20 | 99.4 | 90.5 | 2.25 | 99.4 | 59 |
| 4 | 90.6 | 2.68 | 99.5 | 90.3 | 2.78 | 99.5 | 100 |
| 5 | 91.1 | 1.89 | 99.5 | 90.9 | 1.82 | 99.5 | 42 |
| 6 | 91.2 | 2.09 | 99.5 | 91.1 | 2.04 | 99.5 | 40 |
| TAC | 93.9 | 0.72 | 100 | 93.9 | 0.69 | 100 | N/A |
| PET | 91.8 | 0.60 | 100 | 91.8 | 0.60 | 100 | N/A |

Results of reflectance measurements for laminated conductor micropattern examples are reported in Table 5. Entries assigned to TAC and PET were derived from measurements made for each substrate type, laminated to glass as described above (baseline data). As shown in Table 5, the micropattern contributes less reflectance when disposed on the nanostructured substrate surface (that is antireflective when exposed to air), as compare with identical micropatterns disposed on standard substrate film (PET), when the former is when viewed and measured from the substrate side of the micropattern.

TABLE 5

| Example Number | % R Film Side | % Reflectance Contribution from Micropattern (Film Side) | % R Glass Side | % Reflectance Contribution from Micropattern (Glass Side) |
|---|---|---|---|---|
| C1 | 10.1 | 1.0 | 10.0 | 0.9 |
| C2 | 10.2 | 1.0 | 10.2 | 1.1 |
| 3 | 7.2 | 0.2 | 8.3 | 1.3 |
| 4 | 7.3 | 0.3 | 8.1 | 1.1 |
| 5 | 7.5 | 0.5 | 8.7 | 1.7 |
| 6 | 7.3 | 0.3 | 8.4 | 1.3 |
| TAC | 7.0 | N/A | 7.0 | N/A |
| PET | 9.2 | N/A | 9.1 | N/A |

Test Methods
Reflectance Test Method 1
(Determination of the Front Surface Reflectance of a Transparent Film)

Average total (diffuse and specular) light reflectance (% R) of a film was measured using a Spectro-Guide Sphere w/Gloss instrument (commercially available as model number CD-6834 from BYK-Gardner USA, Columbia, Md.). Reflectance Test Method 1 included a procedure for removing the contribution to measured reflectance from the backside surface film sample (i.e., the interface that the backside surface makes with air), thereby yielding a measurement result that was associated with the interface between the film front side surface (surface of interest) and air. The backside surface reflectance of the film was removed from the measurement by applying black vinyl tape to the film back side ("black tape, commercially available as Yamato Black Vinyl Tape #200-38, from Yamato International Corporation, Woodhaven, Mich.). The black tape was laminated to the back side of the film using a roller to ensure there were no air bubbles trapped between the black tape and the sample. The % R for the front surface of the film sample was determined by first placing the film front surface against the aperture of the Spectro-Guide and taking the total reflectance reading (average % R from 400 nm to 700 nm wavelength), with black tape applied to the back side. Secondly, the result of this measurement was modified by subtracting the known total reflectance of the film back side interface with black tape, determined separately. The result of this measurement, with the subsequent subtraction of the black tape interface reflectance, is reported herein as "% R substrate front surface" by Reflectance Test Method 1.

Reflectance Test Method 2
(Determination of the Front Surface Reflectance of a Transparent Film)

Reflectance was measured using a HunterLab Ultrascan PRO (Hunter Associates Laboratory Inc., Reston, Va.). Sample films were placed directly over the instrument aperture and illuminated using a d/8° geometry under D65 illuminant condition. Samples were placed with the base film front (nanostructured) surface against the aperture. A light trap was placed against the sample and in alignment with the instrument aperture. In order to isolate the reflectance from the nanostructured substrate front surface, the reflectance from the substrate back side surface was subtracted. A reflectance value equal to half of the base film reflectance (no additional coatings or nanostructure) was taken to be the reflectance of the back side of the nanostructured substrate. Results were recorded at 5 nm intervals between 350 and 1050 nm. Total reflectance (% R) is reported as an average of the reflectance values between 400 and 700 nm. The result of this measurement is reported herein as "% R substrate front surface" by Reflectance Test Method 2.

Reflectance Test Method 3
(Determination of the Reflectance of the Interface Between Metallization and Substrate)

This test method is suitable for metallized substrates where the metallization has low or high optical density (i.e., light transmission between 0 and 80%). Average total (diffuse and specular) light reflectance (% R) of a film was measured using a Spectro-Guide Sphere w/Gloss instrument (commercially available as model number CD-6834 from BYK-Gardner USA, Columbia, Md.). The instrument was used to make a measurement of a metallized transparent substrate (e.g., polymer film substrate) from the side opposite the metallization. As such, the measurement method was used to determine the reflectance of the interface between the metallization and the substrate (i.e., reflectance from the metallization, in the direction facing the substrate). Reflectance Test Method 3 included a procedure for minimizing the contribution to measured reflectance from the exposed metal surface, when the metallization is semi-transparent (i.e., from the interface that the exposed thin film metal makes with air). Reflectance Test Method 3 included application of black vinyl tape to the exposed metal surface ("black tape, commercially available as Yamato Black Vinyl Tape #200-38, from Yamato International Corporation, Woodhaven, Mich.). The black tape was laminated to the exposed surface of the metallization using a roller to ensure there are no air bubbles trapped between the black tape and the sample. The % R for the metallized film sample was determined by first placing the substrate (side opposite the metallization) against the aperture of the Spectro-Guide and taking the total reflectance reading (average % R from 400 nm to 700 nm wavelength). Secondly, the result of this measurement (just described) was modified by subtracting the known approximate total reflectance of the exposed substrate interface with air (surface), which was in the optical path between the instrument and the metallization interface with the substrate. The result of this measurement, with the subsequent subtraction of the substrate surface reflectance, is reported herein as "% R metal interface with substrate" by Reflectance Test Method 3.

Reflectance Test Method 4
(Determination of the Reflectance of the Interface Between Metallization and Substrate)

This test method is suitable for metallized substrates where the metallization has high optical density (i.e., low light transmission, for example less than 5%, 2%, or 1%). Average total (diffuse and specular) light reflectance (% R) of a film was measured using a Spectro-Guide Sphere w/Gloss instrument (commercially available as model number CD-6834 from BYK-Gardner USA, Columbia, Md.). The instrument was used to make a measurement of a metallized transparent substrate (e.g., polymer film substrate) from the side opposite the metallization. As such, the measurement method was used to determine the reflectance of the interface between the metallization and the substrate (i.e., reflectance from the metallization, in the direction facing the substrate). The % R for the metallized film sample was determined by first placing the substrate (side opposite the metallization) against the aperture of the Spectro-Guide and taking the total reflectance reading (average % R from 400 nm to 700 nm wavelength). Secondly, the result of this measurement (just described) was modified by subtracting the known approximate total reflectance of the exposed substrate interface with air (surface), which was in the optical path between the instrument and the metallization interface with the substrate. The result of this measurement, with the subsequent subtraction of the substrate surface reflectance, is reported herein as "% R metal interface with substrate" by Reflectance Test Method 4.

Reflectance Test Method 5
(Determination of the Reflectance of the Exposed Surface of a Metallization on a Substrate)

This test method is suitable for metallized substrates where the metallization has high or low optical density (i.e., light transmission between 0 and 80%). Average total (diffuse and specular) light reflectance (% R) of a film was measured using a Spectro-Guide Sphere w/Gloss instrument (commercially available as model number CD-6834 from BYK-Gardner USA, Columbia, Md.). The instrument was used to make a measurement of a metallized transparent substrate (e.g., polymer film substrate) from the side of the metallization. As such, the measurement method was used to determine the reflectance of the exposed surface of the metallization. Reflectance Test Method 5 included a procedure for minimizing the contribution to measured reflectance from the back film interface, when the metallization is semi-transparent (i.e., from the interface that the exposed film makes with air). Reflectance Test Method 5 included application of black vinyl tape to the exposed metal surface ("black tape, commercially available as Yamato Black Vinyl Tape #200-38, from Yamato International Corporation, Woodhaven, Mich.). The black tape was laminated to the surface of the polymer film opposite the metallization using a roller to ensure there are no air bubbles trapped between the black tape and the sample. The % R for the metallized film sample was determined by first placing the substrate (side that includes the metallization) against the aperture of the Spectro-Guide and taking the total reflectance reading (average % R from 400 nm to 700 nm wavelength). The result of this measurement is reported herein as "% R metal exposed surface" by Reflectance Test Method 5.

Reflectance Test Method 6
(Determination of the Reflectance of the Exposed Surface of a Metallization on a Substrate)

This test method is suitable for metallized substrates where the metallization has high optical density (i.e., low light transmission, for example less than 5%, 2%, or 1%). Average total (diffuse and specular) light reflectance (% R) of a film was measured using a Spectro-Guide Sphere w/Gloss instrument (commercially available as model number CD-6834 from BYK-Gardner USA, Columbia, Md.). The instrument was used to make a measurement of a metallized transparent substrate (e.g., polymer film substrate) from the side of the metallization. As such, the measurement method was used to determine the reflectance of the exposed surface of the metallization. The % R for the metallized film sample was determined by first placing the substrate (side that includes the metallization) against the aperture of the Spectro-Guide and taking the total reflectance reading (average % R from 400 nm to 700 nm wavelength). The result of this measurement is reported herein as "% R metal exposed surface" by Reflectance Test Method 6.

Conductance Test Method

To determine electrical conductance (expressed in Siemens (S) or Mhos; inverse of sheet resistance), a sample of metallized substrate measuring at least 5 cm×5 cm in area was placed in the measurement region of a non-contact conductance meter (commercially available as Model 717 from Delcom Instruments, Prescott, Wis.). The conductance is symbolized herein by the small-case greek letter sigma, $\sigma$. The sample was spaced upward from the base of the instrument in the measurement region by inclusion of a standard index card. This test method was used both for blanket metallized (i.e., non-patterned) substrates and for substrate with conductor micropatterns present thereon. In some examples where the conductance of a metallized, nanostructured substrate is reported below, conductance was also measured for the same metallization applied to a non-nanostructured ("flat") substrate (PET-2 or -6). The conductance value for the same metallization on the flat substrate is reported below ("$\sigma$ PET"), for such cases. Additionally, a value labeled below as "fraction retained $\sigma$" was calculated. The fraction retained conductance is the quantity given by dividing the measured conductance for the metallization applied to the nanostructure substrate surface by the measured conductance for the same metallization applied to a flat substrate.

Transmitted Light Optical Property Test Method

To determine the visible light transmittance (% T), haze (% H), and clarity (% C) of a sample, it was placed in the measurement region of a transmittance, haze, and clarity instrument (commercially available as Haze-Gard Plus (illuminant C) from BYK-Gardner USA, Columbia, Md.). The instrument was used for the characterization of substrates, substrates with conductor micropatterns thereon, or laminated constructions that included substrates (with or without conductor micropatterns thereon).

Nanostructure Depth Measurement by TEM

Selected substrates having a surface nanostructure and a metallization disposed thereon were examined in cross section by transmission electron microscopy (TEM). The samples were prepared by standard room temperature ultramicrotomy at 90 nm thickness. Samples were cut and then dried with He to avoid silver oxide growth. The sectioned samples were examined using a Hitachi H-9000 TEM at 300 kV. Measurements were made on calibrated bright field images. The extent of penetration of metal into the surface of the substrate was taken to be the depth of the nanostructure of the substrate. Results from this procedure were found to be consistent with nanostructure depth measurement by TEM or scanning electron microscopy (SEM) for substrate cross sections before metallization.

Nanostructure Depth Measurement by AFM

Selected substrates having a surface nanostructure were examined by atomic force microscopy (AFM). The instrument used for this analysis was a Digital Instruments (Bruker) Dimension Icon System with a Nanoscope V controller. The probes used were OTESPA or ScanAsyst Air. The data were analyzed using Nanoscope Analysis. The images were plane fitted to remove z-offset and tilt. Peak force tapping mode was used in order to obtain detailed images and more accurate mapping of the nanostructure topography. A statistical distribution of elevation was determined across a sample region measuring 2 micrometers by 2 micrometers. The elevation range associated with approximately 99% of the sampled area (i.e., removing outlier extremes in protrusion height and nanostructure depth) was taken as the nanostructure depth.

Estimation of Volume and Weight % by Electron Microscopy

As the loading of silica particles is not provided as received from the supplier, for Examples 11-27 the volume and weight % of silica particles in the matrix was estimated by electron microscopic analysis.

Substrate Materials

The following examples include a variety of materials and chemicals. Regarding substrates, base films of poly(ethyleneterephthalate) ("PET") and cellulose triacetate ("TAC") were used. A variety of PET substrates were used, according to the tables below. Abbreviations are used in order to identify specific base film substrate that was used for each example, according to the following descriptions:

PET-1: 125 micrometer thick, hardcoated PET, commercially available from Toray Plastics (America), Inc., North Kingstown, R.I.) as product name Toray Tuftop THS.

PET-2: 50 micrometer thick, bare PET, prepared internally by conventional extrusion processing methods.

PET-3: 125 micrometer thick, heat-stabilized PET with adhesion promotion coating on one side (side which was coated in the following examples, when coated with nanoparticle-filled materials), commercially available from Dupont Teijin Films (Chester, Va.) as product name "ST504."

PET-4: 50 micrometer thick PET with adhesion promotion coating on one side (side which was coated in the following examples, when coated with nanoparticle-filled materials), commercially available from Dupont Teijin Films (Chester, Va.) as product name "618."

PET-5: 50 micrometer thick PET with adhesion promotion coating on both sides, commercially available from Dupont Teijin Films (Chester, Va.) as product name "617."

PET-6: 75 micrometer thick heat-stabilized PET with adhesion promotion coating on one side (side which was coated in the following examples, when coated with nanoparticle-filled materials), commercially available from Dupont Teijin Films (Chester, Va.) as product name "ST580."

PET-7: 50 micrometer thick primed PET (further details available).

PET-8: 50 micrometer thick PET (further details available).

TAC: 75 micrometer thick TAC, commercially available from Island Pyrochemical Industries Corp. (New York, N.Y.).

PC: 125 micrometer thick polycarbonate (further details available).

The examples that follow include three types:
1. Nanostructured substrates with metallic conductor coatings disposed thereon, useful for the preparation of further articles of types 2 and 3;
2. Nanostructured substrates with metallic conductor micropatterns disposed thereon, useful for preparation of further articles of type 3;
3. Transparent touch sensor components comprising nanostructured substrates with metallic conductor micropatterns disposed thereon.

TABLE 6

Abbreviations and trade designations

| Abbreviation or Trade Designation | Description |
|---|---|
| MPS | 3-(methacryloyloxy)propyltrimethoxy silane obtained from Alfa Aesar, Ward Hill, MA |
| A1230 | Nonionic silane dispersing agent with no radically reactive double bond functionality; obtained under the trade designation "SILQUEST A1230" obtained from Momentive Performance Materials, Wilton, CT |
| DI water | De-ionized water |
| Radical Inhibitor | A radical inhibitor obtained under the trade designation PROSTAB 5198" from BASF Corporation, Tarrytown, NY |
| 1-methoxy-2-propanol | An alcohol obtained from Aldrich Chemical, Milwaukee, WI |
| NALCO 2327 | Colloidal silica having a nominal particle size of 20 nm particle size obtained under the trade designation "NALCO 2327" from Nalco Company |
| NALCO 2329 | Colloidal silica having a nominal particle size of 75 nm particle size obtained under the trade designation "NALCO 2329" from Nalco Company |
| NALCO 2329+ | Colloidal silica having a nominal particle size of 115 nm particle size obtained under the trade designation "NALCO 2329+" from Nalco Company |
| MP4540 | Colloidal silica having a nominal particle size of 440 nm particle size obtained under the trade designation "MP4540" from Nissan Chemical, Houston, TX |
| MP2040 | Colloidal silica nominal having a particle size of 190 nm obtained under the trade designation "MP2040" from Nissan Chemical |
| MP1040 | Colloidal silica having a nominal particle size of 100 nm obtained under the trade designation "MP1040" from Nissan Chemical |
| SR238 | 1,6 hexanediol diacrylate obtained under the trade designation "SR238" from Sartomer, Exton, PA |
| SR506 | isobornyl acrylate obtained under the trade designation "SR506" from Sartomer |
| SR295 | Pentaerythritol tetraacrylate obtained under the trade designation "SR295" from Sartomer |
| SR351 | Trimethylolpropane triacrylate obtained under the trade designation "SR351" from Sartomer |
| SR492 | Propoxylated trimethylolpropane triacrylate obtained under the trade designation "SR492" from Sartomer |
| SR440 | Isooctyl acrylate obtained under the trade designation "SR440" from Sartomer |
| IR 184 | A photoinitiator obtained under the trade designation "IGACURE 184" from BASF Corporation, Tarrytown, NY |
| IPA | Isopropyl alcohol obtained from Aldrich Chemical |
| MEK | Methyl ethyl ketone obtained from Aldrich Chemical |
| TEGORAD 2250 | Silicone polyether acrylate obtained under the trade designation "TEGO ® Rad 2250" from Evonik Goldschmidt Corp., Hopewell, VA |
| TEGORAD 2300 | substrate wetting, slip and flow additive obtained under the trade designation "TEGO ® Rad 2300" from Evonik Goldschmidt Corp. |
| HFPO | Prepared as Copolymer B in US2010/0310875 A1, Hao et. al. |

Examples C3, 11 Through 68

Examples 11-68 include nanostructured substrates with metallic conductor coatings disposed thereon. Comparative Example C3 is a commercially available poly(ethylene terephthalate) film. Table 7 summarizes the parameters that describe Examples C3, 11 through 68. Examples 11 through 68 include a substrate having a nanostructured major surface. The nanostructured major surfaces were created by reactive ion etching coating deposits on a polymer base films, as described below. The coating deposits included composite compositions comprising a matrix and a nanoscale dispersed phase, as described below. Note that the metallized, nanostructured substrates of Examples 11-68 can be further processed by printing a self-assembled monolayer mask (e.g., by stamping with an elastomeric relief stamp that has been inked with a self-assembled monolayer-forming molecule such as an alkylthiol, such as 1-octadecylthiol) in the form of a micropattern, followed by selectively etching the metal coating from the nanostructured surface in regions not protected by the monolayer. The printing and etching steps yield a metallic conductor micropattern according to the micropattern of self-assembled monolayer, disposed on the nanostructured surface. The micropattern can have geometry or characteristics as described throughout the present application.

For Examples 11 through 27, a visible light transparent, nanoparticle hardcoat film was used (commercially available as Toray THS from Toray Plastics (America), Inc., North Kingstown, R.I.). The hardcoat film included a base substrate of poly(ethyleneterephthalate) and a hardcoat coating comprising a polymer matrix and nanoparticle filler dispersed therein. The hardcoat coating was anisotropically etched with a chemically reactive $O_2$ plasma ("reactive ion etch" step; as described previously in WO2011139593A1) for varying etch times, in order to yield nanostructured surfaces of varying nanostructure depth (i.e., protrusions of varying height). The Toray THS film comprises hardcoat coating on one surface, in the form of a 3 micron micrometer thick coating of a composite material. The hardcoat coating comprises an organic polymeric matrix and a particulate silica dispersed phase with particle size of approximately 15-18 nm, present at a loading of approximately 6 vol % (as determined by transmission electron microscopy). The etched, nanostructured coatings with varying nanostructure depth were deposited with a silver thin film coating ("metallization" step; approximately 5 angstroms of titanium as an adhesion promotion material, followed by silver, both deposited by conventional sputtering methods). The average thickness of silver is given in Table 8. For selected samples, the heights of the protrusive features resulting from reactive ion etching under selected conditions were determined by conventional methods of transmission electron microscopy, and are given in Table 8. For examples 20 through 27, exposed silica nanoparticles were removed between the reactive ion etch step and the metallization step. As noted in Table 7, silica removal in some cases was achieved by exposing (1 minute) the reactive ion etched surface to a solution having hydrofluoric acid (10:1 dilution of etchant that is commercially available as TFT from Transene Company, Inc, Danvers, Mass.). As also noted in Table 7, silica removal in some cases was achieved by exposing (30 sec) the reactive ion etched surface to a $NF_3$ plasma. Lastly silica removal was achieved by exposing (5 minutes) the reactive ion etched surface to a 5 wt % NaOH solution at 90-100° C.

For Examples C3 and 28 through 36, a visible light transparent substrate of polyethylene terephthalate ("PET") having a thickness of approximately 75 micrometers was used (commercially available as product number ST580, DuPont Teijin Films, Chester, Va. Different composite coatings were deposited on pieces of the PET substrate by conventional solvent coating methods. The coatings included a prepolymer blend comprising three monomers: 40% Sartomer 295 (Pentaerythritol Tetraacrylate), 40% Sartomer 238 (1,6 hexanediol diacrylate), and 20% Sartomer 506 (Isobornyl Acrylate), Sartomer, Exton, Pa. The composite coatings further comprised silica nanoparticles with a size (diameter) of approximately 20 nm. Solutions for casting the composite coatings were prepared by dissolving the monomer blend in 1-methoxy-2-propanol solutions of the 20 nm silica particles (40 wt %) (Nalco 2327, Nalco Chemical Company, Naperville, Ill.) that had been surface functionalized with 3-(methacryloyloxy)propyl trimethoxy silane (MPS). Coatings were formulated to give different weight fraction ratios of resin:particles: 98:2, 96:4, 94:6, 92:8, 90:10, 85:15, 80:20, 50:50, 20:80. Irgacure® 184 (Ciba Specialty Chemicals, Tarrytown, N.Y.) was included in all of the formulations at a level of 0.5 wt % of the weight of the final solid components (particles and monomer). All of the solutions were diluted with 1-methoxy-2-propanol to a final % solids of 40%. For each coating, the solution was syringe-pumped through a coating die onto the PET film, dried at 65° C. and cured by using a UV processor equipped with a H-Bulb under a nitrogen atmosphere at 10 fpm. The coated article was further subject to roll-to-roll $O_2$ plasma etch for 90 sec. The nanostructured coatings were deposited with a silver thin film coating ("metallization" step; approximately 5 angstroms of titanium as an adhesion promotion material, followed by silver, both deposited by conventional sputtering methods).

For examples 37 through 68, a visible light transparent substrate of polyethylene terephthalate ("PET") having a thickness of approximately 75 micrometers was used (commercially available as product number ST580, DuPont Teijin Films, Chester, Va. Different composite coatings were deposited on pieces of the PET substrate by hand spread coating. The coatings included a matrix comprising a monomer blend: 75/25 SR351/SR238 (Sartomer, Exton, Pa.). The composite coatings further comprised silica nanoparticles with a size (diameter) of approximately 75 nm. For examples 37 through 58, solutions for casting the composite coatings were prepared by dissolving the monomer blend in IPA solutions of the 75 nm silica particles (40 wt %) (Nalco 2327, Nalco Chemical Company, Naperville, Ill.) that had been surface functionalized with MPS. Coatings were formulated to give different weight fraction ratios of resin:particles: 86:14, 82:18, 78:22, 74:26, 70:30, 65:35. Irgacure® 184 (Ciba Specialty Chemicals, Tarrytown, N.Y.) was included in all of the formulations at a level of 3.0 wt % of the weight of the final solid components (particles and monomer). For examples 59 through 68, solutions for casting the composite coatings were prepared by dissolving the monomer blend in IPA solutions of the 190 nm silica particles (40 wt %) (Nissan MP2040, Nissan Chemical Industries Ltd., Tokyo, Japan) that had been surface functionalized with MPS. Coatings were formulated to give two weight fraction ratios of resin:particles: 75:25 and 65:35. Irgacure® 184 (Ciba Specialty Chemicals, Tarrytown, N.Y.) was included in the formulations at a level of 1.0 wt % of the weight of the final solid components (particles and monomer). All of the solutions were diluted with IPA to a final % solids of 40% and then coated by hand spread coating with #4 Myer Rod. The coated article was further subject to roll-to-roll $O_2$ plasma etch for various durations under oxygen starved conditions at a flow rate of 50 sccm (0.0025 sccm/cm²). The pressure during deposition equilibrated at 4 mTorr. The nanostructured coatings were deposited with a silver thin film coating ("metallization" step; approximately 5 angstroms of titanium as an adhesion promotion material, followed by silver, both deposited by conventional sputtering methods).

Data for the various nanostructured coatings are listed in Tables 7 and 8, including the reflectance of interface between the metallization and the substrate. As compared with reflectance for silver deposited on PET, the nanostructured substrates impart a reduced reflectivity (or darkening) to silver coatings deposited thereon, particularly when measured through transparent substrate (i.e., from the side of the substrate opposite the silver deposit).

In Table 7, the reflectance of the base film front surface, or of a nanostructured surface formed thereon, was measured by different methods. For Examples C3, 11-27 and 37-68, this reflectance was measured by Reflectance Test Method 1. For Examples 28-36, this reflectance was measured by Reflectance Test Method 2. The reflectance of C3 (unmetallized, Tables 7 and 9) was measured by Reflectance Test Method 1 on the unprimed side, that which metallized, yielded the properties given in Tables 8 and 11.

In Table 8, different methods for determining the reflectance of the interface between the metallization and substrate were applied. Additionally, different methods for determining the reflectance of the exposed surface of a metallization on a substrate were applied. For Examples 11-19 Reflectance Test Methods 3 and 5 were used. For the remainder of the Examples, Reflectance Test Methods 4 and 6 were used. The reflectance values for C3 (metallized, Tables 8 and 11) were measured by Reflectance Test Methods 4 and 6. The Ag thickness and nanostructure depth were determined by TEM analysis.

TABLE 7

Composition & experimental parameters for making RIE nanostructured substrates

| Example # | Base Film | SiO₂ size (nm) | SiO₂ loading (wt %) | SiO₂ loading (vol %) | RIE time (sec) | SiO₂ removal | % R, substrate front surface | % T | % H |
|---|---|---|---|---|---|---|---|---|---|
| C3 | PET-6 | — | — | — | — | — | 6.56 | 92.1 | 0.78 |
| 11 | PET-1 | 15-18 | 10 | 6 | 17.6 | — | 2.36 | 94.7 | 0.86 |
| 12 | PET-1 | 15-18 | 10 | 6 | 30 | — | 0.26 | 96.5 | 0.88 |
| 13 | PET-1 | 15-18 | 10 | 6 | 60* | — | 0.17 | 96.4 | 0.94 |
| 14 | PET-1 | 15-18 | 10 | 6 | 90 | — | 0.13 | 96.4 | 0.89 |
| 15 | PET-1 | 15-18 | 10 | 6 | 102.4 | — | 0.14 | 96.4 | 1.03 |
| 16 | PET-1 | 15-18 | 10 | 6 | 60 | — | 0.17 | 96.6 | 1.11 |
| 17 | PET-1 | 15-18 | 10 | 6 | 60 | — | 0.15 | 96.4 | 0.84 |
| 18 | PET-1 | 15-18 | 10 | 6 | 30 | — | 0.70 | 96.2 | 0.84 |
| 19 | PET-1 | 15-18 | 10 | 6 | 90 | — | 0.13 | 96.4 | 0.97 |
| 20 | PET-1 | 15-18 | 10 | 6 | 17.6 | HF | — | 94.0 | 1.43 |
| 21 | PET-1 | 15-18 | 10 | 6 | 30 | HF | — | 95.0 | 1.09 |
| 22 | PET-1 | 15-18 | 10 | 6 | 60 | HF | 0.27 | 95.6 | 1.04 |
| 23 | PET-1 | 15-18 | 10 | 6 | 90 | HF | 0.20 | 95.4 | 0.86 |
| 24 | PET-1 | 15-18 | 10 | 6 | 102.4 | HF | 0.16 | 95.5 | 1.22 |
| 25 | PET-1 | 15-18 | 10 | 6 | 90 | 30 sec NF3 | 0.30 | 96.4 | 1.34 |
| 26 | PET-1 | 15-18 | 10 | 6 | 102.4 | 30 sec NF3 | 0.19 | 96.4 | 1.76 |
| 27 | PET-1 | 15-18 | 10 | 6 | 90 | NaOH | — | — | — |
| 28 | PET-6 | 20 | 2 | 1.1 | 90 | — | 1.87 | 93.8 | 0.97 |
| 29 | PET-6 | 20 | 4 | 2.2 | 90 | — | 1.20 | 94.4 | 1.19 |
| 30 | PET-6 | 20 | 6 | 3.4 | 90 | — | 1.03 | 94.5 | 1.39 |
| 31 | PET-6 | 20 | 8 | 4.6 | 90 | — | 1.21 | 94.3 | 1.26 |
| 32 | PET-6 | 20 | 10 | 5.8 | 90 | — | 1.03 | 94.4 | 1.14 |
| 33 | PET-6 | 20 | 15 | 8.8 | 90 | — | 1.00 | 94.6 | 0.76 |
| 34 | PET-6 | 20 | 20 | 12.1 | 90 | — | 1.13 | 94.4 | 0.72 |
| 35 | PET-6 | 20 | 50 | 35.5 | 90 | — | 1.11 | 94.5 | 0.52 |
| 36 | PET-6 | 20 | 80 | 68.8 | 90 | — | 2.64 | 93.0 | 1.21 |
| 37 | PET-6 | 75 | 14 | 8.5 | 60 | — | 1.55 | 94.5 | 0.38 |
| 38 | PET-6 | 75 | 14 | 8.5 | 90 | — | 1.33 | 94.6 | 0.57 |
| 39 | PET-6 | 75 | 14 | 8.5 | 120 | — | 1.54 | 94.4 | 0.89 |
| 40 | PET-6 | 75 | 14 | 8.5 | 150 | — | 1.60 | 94.1 | 1.92 |
| 41 | PET-6 | 75 | 18 | 11.1 | 60 | — | 1.38 | 94.5 | 0.47 |
| 42 | PET-6 | 75 | 18 | 11.1 | 90 | — | 1.42 | 94.5 | 0.70 |
| 43 | PET-6 | 75 | 18 | 11.1 | 120 | — | 1.69 | 94.4 | 0.88 |
| 44 | PET-6 | 75 | 18 | 11.1 | 150 | — | 1.59 | 94.2 | 1.82 |
| 45 | PET-6 | 75 | 22 | 13.8 | 60 | — | 1.26 | 94.5 | 0.43 |
| 46 | PET-6 | 75 | 22 | 13.8 | 90 | — | 1.54 | 94.5 | 0.84 |
| 47 | PET-6 | 75 | 22 | 13.8 | 120 | — | 1.57 | 94.1 | 1.06 |
| 48 | PET-6 | 75 | 22 | 13.8 | 150 | — | 1.44 | 94.1 | 1.39 |
| 49 | PET-6 | 75 | 26 | 16.6 | 60 | — | 1.29 | 94.8 | 0.47 |
| 50 | PET-6 | 75 | 26 | 16.6 | 90 | — | 1.75 | 94.1 | 0.61 |
| 51 | PET-6 | 75 | 26 | 16.6 | 150 | — | 1.71 | 94.5 | 1.14 |
| 52 | PET-6 | 75 | 30 | 19.6 | 60 | — | 1.33 | 94.7 | 0.45 |
| 53 | PET-6 | 75 | 30 | 19.6 | 90 | — | 1.86 | 94.3 | 0.62 |
| 54 | PET-6 | 75 | 30 | 19.6 | 120 | — | 1.64 | 94.4 | 0.72 |
| 55 | PET-6 | 75 | 30 | 19.6 | 150 | — | 1.71 | 94.1 | 1.26 |
| 56 | PET-6 | 75 | 35 | 23.4 | 60 | — | 1.42 | 94.7 | 0.47 |
| 57 | PET-6 | 75 | 35 | 23.4 | 90 | — | 1.68 | 94.1 | 0.55 |
| 58 | PET-6 | 75 | 35 | 23.4 | 150 | — | 1.56 | 93.9 | 0.83 |
| 59 | PET-6 | 190 | 25 | 15.9 | 50 | — | 1.34 | 95.5 | 1.15 |

TABLE 7-continued

Composition & experimental parameters for making RIE nanostructured substrates

| Example # | Base Film | SiO₂ size (nm) | SiO₂ loading (wt %) | SiO₂ loading (vol %) | RIE time (sec) | SiO₂ removal | % R, substrate front surface | % T | % H |
|---|---|---|---|---|---|---|---|---|---|
| 60 | PET-6 | 190 | 25 | 15.9 | 60 | — | 1.34 | 95.8 | 1.32 |
| 61 | PET-6 | 190 | 25 | 15.9 | 83 | — | 0.96 | 95.2 | 1.17 |
| 62 | PET-6 | 190 | 35 | 23.4 | 50 | — | 1.05 | 95.4 | 4.15 |
| 63 | PET-6 | 190 | 35 | 23.4 | 60 | — | 1.17 | 94.8 | 1.19 |
| 64 | PET-6 | 190 | 35 | 23.4 | 83.3 | — | 0.85 | 95.8 | 1.22 |
| 65 | PET-6 | 190 | 50 | 36.2 | 50 | — | 1.03 | 95.8 | 1.02 |
| 66 | PET-6 | 190 | 50 | 36.2 | 60 | — | 1.01 | 96.1 | 1.03 |
| 67 | PET-6 | 190 | 50 | 36.2 | 83.3 | — | 0.90 | 96.1 | 0.96 |
| 68 | PC | 190 | 67.5 | 53.3 | 20 | — | 0.75 | — | 0.75 |

TABLE 8

Properties and dimensions for metallized RIE nanostructured substrates

| Example # | % R, metal interface with substrate | % R, metal exposed surface | σ (Mhos) | σ, PET (Mhos) | Fraction retained σ | Ag thickness (nm) | Nanostructure depth by TEM (nm) |
|---|---|---|---|---|---|---|---|
| C3 | 79.8 | 89.9 | — | 4.12 | — | 148 | — |
| 11 | 63.9 | 94.7 | 3.71 | 3.34 | 1.11 | 173 | 61 |
| 12 | 43.3 | 95 | 5.91 | 5.00 | 1.18 | — | — |
| 13 | 14.1 | 92.5 | 3.50 | 3.34 | 1.05 | 167 | 132 |
| 14 | 10.9 | 93.4 | 5.61 | 5.00 | 1.12 | 228 | 183 |
| 15 | 9.4 | 80.9 | 2.93 | 3.34 | 0.88 | 172 | 201 |
| 16 | 22.7 | 93.7 | 6.73 | 5.69 | 1.18 | 258 | 142 |
| 17 | 9.3 | 59.0 | 0.47 | 0.98 | 0.48 | 79 | 119 |
| 18 | 30.5 | 90.9 | 1.43 | 1.67 | 0.85 | 110 | 91 |
| 19 | 7.4 | 58.1 | 0.70 | 1.67 | 0.42 | — | — |
| 20 | 28.3 | 95.4 | 6.86 | 7.12 | 0.96 | 155 | — |
| 21 | 8.3 | 93.6 | 6.66 | 7.12 | 0.93 | 155 | — |
| 22 | 5.0 | 81.3 | 5.99 | 7.12 | 0.84 | 155 | — |
| 23 | 1.8 | 63.1 | 4.80 | 7.12 | 0.67 | 155 | — |
| 24 | 1.0 | 58.3 | 4.13 | 7.12 | 0.58 | 155 | — |
| 25 | 1.8 | 36.8 | 0.41 | 6.94 | 0.06 | 150 | — |
| 26 | 1.5 | 42.2 | 0.48 | 6.94 | 0.07 | 150 | — |
| 27 | 5.0 | 72.7 | 5.68 | 7.37 | 0.77 | 185 | — |
| 28 | 6.3 | 46.5 | 1.58 | 6.18 | 0.26 | 175 | — |
| 29 | 3.1 | 55.1 | 1.34 | 6.18 | 0.22 | 175 | — |
| 30 | 5.6 | 69.4 | 3.06 | 6.18 | 0.50 | 175 | — |
| 31 | 7.8 | 77.9 | 4.27 | 6.18 | 0.69 | 175 | — |
| 32 | 8.5 | 81.2 | 4.62 | 6.18 | 0.75 | 175 | — |
| 33 | 24.5 | 87.8 | 5.66 | 6.18 | 0.92 | 175 | — |
| 34 | 42.9 | 88.7 | 5.83 | 6.18 | 0.94 | 175 | — |
| 35 | 76.5 | 89.6 | 6.04 | 6.18 | 0.98 | 175 | — |
| 36 | 78.3 | 89.4 | 5.79 | 6.18 | 0.94 | 175 | — |
| 37 | 9.0 | 72.3 | 2.41 | 5.42 | 0.44 | 145 | — |
| 38 | 3.7 | 64.3 | 1.54 | 5.42 | 0.28 | 145 | — |
| 39 | 3.2 | 60.1 | 0.85 | 5.42 | 0.16 | 145 | — |
| 40 | 2.6 | 52.9 | 0.17 | 5.42 | 0.03 | 145 | — |
| 41 | 5.5 | 76.9 | 3.04 | 5.42 | 0.56 | 145 | — |
| 42 | 5.5 | 77.7 | 2.63 | 5.42 | 0.48 | 145 | — |
| 43 | 5.5 | 75.9 | 2.13 | 5.42 | 0.39 | 145 | — |
| 44 | 6.0 | 71.0 | 1.88 | 5.42 | 0.35 | 145 | — |
| 45 | 5.4 | 85.4 | 3.79 | 5.42 | 0.70 | 177.9 | 142.6 |
| 46 | 7.2 | 81.2 | 3.17 | 5.42 | 0.58 | 145 | — |
| 47 | 7.5 | 81.5 | 3.28 | 5.42 | 0.60 | 145 | — |
| 48 | 6.0 | 72.6 | 2.14 | 5.42 | 0.39 | 145 | — |
| 49 | 7.1 | 91.0 | 4.52 | 5.42 | 0.83 | 164.1 | 159.8 |
| 50 | 13.7 | 88.7 | 4.20 | 5.42 | 0.77 | 145 | — |
| 51 | 16.3 | 88.1 | 3.96 | 5.42 | 0.73 | 145 | — |
| 52 | 16.5 | 94.5 | 4.82 | 5.42 | 0.89 | 145 | — |
| 53 | 21.2 | 93.1 | 4.75 | 5.42 | 0.88 | 145 | — |
| 54 | 19.7 | 91.3 | 4.35 | 5.42 | 0.80 | 145 | — |
| 55 | 31.8 | 93.6 | 4.73 | 5.42 | 0.87 | 145 | — |
| 56 | 29.8 | 95.2 | 5.00 | 5.42 | 0.92 | 145 | — |
| 57 | 22.1 | 94.0 | 4.72 | 5.42 | 0.87 | 145 | — |
| 58 | 23.3 | 92.2 | 4.63 | 5.42 | 0.85 | 145 | — |
| 59 | 14.7 | 65.2 | 2.68 | 5.42 | 0.49 | 145 | — |
| 60 | 11.7 | 66.6 | 2.88 | 5.42 | 0.53 | 155.8 | 160.1 |
| 61 | 13.5 | 69.5 | 2.84 | 5.42 | 0.52 | 145 | — |

TABLE 8-continued

Properties and dimensions for metallized RIE nanostructured substrates

| Example # | % R, metal inferface with substrate | % R, metal exposed surface | σ (Mhos) | σ, PET (Mhos) | Fraction retained σ | Ag thickness (nm) | Nanostructure depth by TEM (nm) |
|---|---|---|---|---|---|---|---|
| 62 | 7.3 | 47.3 | 1.83 | 5.42 | 0.34 | 145 | — |
| 63 | 10.4 | 53.6 | 1.98 | 5.42 | 0.36 | 145 | — |
| 64 | 3.3 | 29.9 | 0.09 | 5.42 | 0.02 | 145 | — |
| 65 | 7.9 | 44.9 | 1.38 | 5.42 | 0.25 | 145 | — |
| 66 | 7.8 | 46.7 | 1.48 | 5.42 | 0.27 | 145 | — |
| 67 | 6.9 | 44.8 | 1.38 | 5.42 | 0.26 | 145 | — |
| 68 | 18.8 | 63.8 | 3.13 | 5.10 | 0.61 | 140 | — |

Examples 69-124

Examples 69-124 include nanostructured substrates with metallic conductor coatings disposed thereon. The nanostructured substrates were prepared by depositing particle-filled composite coatings (i.e., a dispersed phase and a matrix phase) on a major surface of a polymer film. The particle filled composite coatings were coated from coating solutions. The coatings were dried and cured to yield a nanostructured exposed surface. Furthermore, each nanostructured substrate was deposited with a coating of silver on its exposed nanostructured surface (metallization step). The metallization step included sputter depositing an adhesion promotion layer of titanium with average thickness of approximately 5 angstroms, followed by sputter deposition of silver at thicknesses specified below. Each example is defined in terms of the particle composition, particle size, particle loading (wt %, vol %), and particle surface treatment composition, for the particles that were contained in the coating solution, and therefore contained in the resulting composite coating. Each example is further defined in terms of a matrix polymer that makes up a portion of the composite coating. The matrix polymer chemical composition is specified below for each example. The coating solutions also contained photoinitiator, radical inhibitor, and one or more solvents. In some examples, the coating solution also included one or more other additives, as specified below.

The detailed description that follows for Examples 69-124 is divided into two sections. The first section describes preparation of the articles. The second section reports results of characterization of the articles. The first section begins by describing the general steps that were applied in order to make the articles, followed by a listing of specific details that make each example unique. Note that the metallized, nanostructured substrates of Examples 69-124 can be further processed by printing a self-assembled monolayer mask (e.g., by stamping with an elastomeric relief stamp that has been inked with a self-assembled monolayer-forming molecule such as an alkylthiol, such as 1-octadecylthiol) in the form of a micropattern, followed by selectively etching the metal coating from the nanostructured surface in regions not protected by the monolayer. The printing and etching steps yield a metallic conductor micropattern according to the micropattern of self-assembled monolayer, disposed on the nanostructured surface. The micropattern can have geometry or characteristics as described throughout the present application.

Preparation of the Articles
General Preparation of Surface Modified Silica Submicrometer Particle Dispersions Submicrometer silica particles (e.g., nanoparticles) were modified with different ratios of two silane coupling agents, "MPS" and "A1230". Four different surface modifier ratios were used. The molar ratios of MPS:A1230 were as follows: 100:0, 75:25, 50:50 and 25:75. The particles were modified while suspended in liquid medium, yielding silane modified particle dispersions. Silane modified dispersions were prepared by first mixing aqueous colloidal silica dispersion with a solution of 1-methoxy-2-propanol and the silane coupling agent(s). The resulting mixture was then heated to facilitate reaction of the silane with the silica particles. This resulted in a surface modified nanoparticle dispersion with a solids content that was controlled in the range of about 10-21 weight % solids, and a 1-methoxy-2-propanol:water weight ratio that was controlled in the range of about 65:35 to 57:43. The dispersions were further processed in one of two ways to increase the solids content and increase the 1-methoxy-2-propanol:water ratio.

In one procedure for increasing the solids content and the 1-methoxy-2-propanol:water ratio, a solvent exchange process was first used, wherein the surface modified nanoparticle dispersion was concentrated via distillation, followed by back-addition of more 1-methoxy-2-propanol, and then followed again by concentration through distillation. In a second (alternative) procedure, the water and 1-methoxy-2-propanol were evaporated to provide a dried surface modified particle powder. The dried powder was then dispersed in a 1-methoxy-2-propanol:water (88:12 weight ratio) mixture to be used for coating formulations. For either procedure, the solids content of the final dispersion was found to be somewhat variable. In the case of the solvent exchange procedure, the variability is believed to be dependent on the amounts of 1-methoxy-2-propanol and water that were removed in the final distillation step. In the case of the dried powder procedure, the variability is believed to be due to variability in the residual solvent content of the powder from batch to batch. In order to account for this variability and to assure accurate particle loading within example coating dispersions below, particle solids content was gravimetrically determined for surface modified nanoparticles derived from either procedure above, prior to preparation of the coating formulations. A known amount of dispersion (1-4 grams, "wet weight") was charged to a small glass dish (of known weight, "tare weight"). The dish was placed in a forced air oven (120° C.) for 45 minutes. The dish was then weighed again ("dry weight" of submicrometer particle plus tare weight of the dish).

% solids=dry weight/wet weight

General Preparation of Radiation Curable Coating Solution:

The modified particle dispersion (above), a prepolymer blend, solvent (1-methoxy-2-propanol, unless stated otherwise), and 1 or 3% of IR 184 (photoinitiator) were all mixed together to form coating solutions (about 40 wt. % total solids; i.e., weight of surface modified particles, prepolymers, and photoinitiator, divided by total weight, equals 40%). The prepolymer blend comprised either i) pentaerythritol tetraacrylate, 1,6 hexanediol diacrylate, and isobornyl acrylate ("SR295", "SR238", "SR506", respectively) in a 40:40:20 weight ratio, or ii) propoxylated trimethylolpropane triacrylate, 1,6 hexanediol diacrylate, and isooctyl acrylate ("SR492", "SR238", "SR440", respectively) in a 40:40:20 weight ratio. In the coating solutions, the weight ratio of surface modified silica particles (5, 20, 75, 100, 115, 190, or 440 nm) to total prepolymer (particle:prepolymer weight ratio) ranged from 57.5:42.5 to 80:20. In some cases a low surface energy additive was included as well, (Tegorad 2250, Tegorad 2300, or HFPO) at a level between 0.005 and 0.1 wt %.

General Coating Process:

Examples 69-77, 79, 81-88, 89-111, 116-120, and 122-124 included the following coating process. The general process for coating and processing the solutions followed the schematic drawing in FIG. 17A. The coating solution was delivered to a 4 or 8 inch (10.2 or 20.3 cm) wide slot-type coating die and coated onto a moving 0.002, 0.003, 0.004, or 0.005 inch (50, 75, 100, or 125 µm) thick poly (ethylene terephthalate) ("PET") or polycarbonate ("PC") base film (web). For each example, the width of the die and the specific base film are given in Table 9. The web speed was set, in combination with the solution delivery rate, in order to achieve a target wet coating thickness. The web speeds and the coating solution delivery rates for each example are also given in Table 9. After the solution was coated onto the web, the coated web traveled a 10 ft (3 m) span in the room environment, and then passed through two 5 ft (1.5 m) long zones of small gap drying with plate temperatures set at a controlled temperature. For PET based films, the plate temperature was 170° F. (77° C.). For PC base films, the plate temperature was 145° F. (63° C.). Finally, the dried coating entered a UV chamber equipped with a UV light source (Model I300P from Fusion System, Gaithersburg Md.) where an H-bulb was used. The UV chamber was purged by a gas stream comprising a mixture of nitrogen and air. The composition of the gas stream was fixed by mixing controlled flows (rates) of nitrogen and air into a single gas delivery line to the UV cure chamber. The flow rate of nitrogen was fixed at 314 L/min (11 scfm), and the flow rate of air was adjusted to control the oxygen level in the UV cure chamber, as specified in Table 10.

Examples 78, 80, 112-115, and 121 included the following coating process. The coating solution was delivered to a 4 or 8 inch (10.1 or 20.3 cm) wide slot-type coating die and coated onto a moving 0.002, 0.003 inch (50, 75 µm) thick poly(ethylene terephthalate), polycarbonate, or cellulose triacetate base film (web). After the solution was coated onto the base film, the coated web then traveled approximately 3 ft (0.9 m) before entering a 30 ft (9.1 m) conventional air floatation drier with all 3 zones set at 120° F. (66° C.). The web speed was set, in combination with the solution delivery rate, in order to achieve a target wet coating thickness. The web speeds and the coating solution delivery rates for each example are given in Table 9. After the drier, the coating entered two sequential UV chambers equipped with a UV light source (Model I300P from Fusion System) with an H-bulb in both chambers. Each UV system was equipped with a variable power output supply. The first UV chamber was purged by a gas stream comprising a mixture of nitrogen and air. The composition of the gas stream was fixed by mixing controlled flows (rates) of nitrogen and air into a single gas delivery line to the UV cure chamber. The flow rate of nitrogen was fixed at 456 L/min (16 scfm), and the flow rate of air was adjusted to control the oxygen level in the UV cure chamber, as specified in Table 10. The second UV chamber was purged similarly to control the oxygen level. For examples 78 and 80, only the first chamber was used at a UV power level of 100%. For examples 112-115 and 121 the first chamber UV power level was 25% while the second chamber UV power level was 75%.

Examples 69-70

Typical Preparation of Surface Modified 20 nm Silica Particles

The 20 nm silica was surface modified (100:0 MPS:A1230) molar ratio as follows. 1-methoxy-2-propanol (450.12 grams), MPS (25.27 grams), and radical inhibitor solution (0.2 gram of a 5% solution in DI water) were mixed with a dispersion of spherical silica submicrometer particles (400 grams with a silica content of 41.05%; NALCO 2327) while stirring. The solution was sealed and heated to 80° C. and held at temperature for 16 hours in a 1 liter glass jar. The surface modified colloidal dispersion was further processed to remove water and increase the silica concentration. A 500 ml RB flask was charged with the surface modified dispersion (450 grams) and 1-methoxy-2-propanol (50 grams). Water and 1-methoxy-2-propanol were removed via rotary evaporation to give a weight of 206 grams. 1-methoxy-2-propanol (250 grams) was charged to the flask and water and 1-methoxy-2-propanol were removed via rotary evaporation to give a final weight of 176 grams. The solution was filtered with 1 micrometer filter. The resulting solids content was 50.99 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 69-70 a 1:1 mixture of 1-methoxy-2-propanol and isopropyl alcohol was used as the diluting solvent in the coating solution.

Coating the Solution:

The solution was coated as discussed above in "General coating process". The coating specifics are listed in Table 9, including the coating width, web speed, coating solution flow rate, and the concentration of oxygen present during the curing process.

Examples 71-77

Typical Preparation of Surface Modified 75 nm Silica Particles:

The 75 nm silica was surface modified (100:0 MPS:A1230 molar ratio) as follows. 1-methoxy-2-propanol (450 grams), MPS (6.04 grams), and radical inhibitor solution (0.2 gram of a 5% solution in DI water) were mixed with a dispersion of spherical silica submicrometer particles (400 grams with a silica content of 40.52%; NALCO 2329) while stirring. The solution was sealed and heated to 80° C. and held at temperature for 16 hours in a 1 liter glass jar. The surface modified colloidal dispersion was further processed to remove water and increase the silica concentration. A 500 ml RB flask was charged with the surface modified dispersion (450 grams). Water and 1-methoxy-2-propanol were removed via rotary evaporation to give a weight of 202.85 grams. 1-methoxy-2-propanol (183 grams) was charged to the flask and water and 1-methoxy-2-propanol were removed via rotary evaporation to give a final weight of 188.6 grams. The solution was filtered with 1 micrometer filter. The resulting solids content was 46.42 wt. %.

Preparation of Radiation Curable Coating Solution:

The coating solution was prepared as discussed above in "General preparation of radiation curable coating solution" and according to the specifics in Tables 9 and 10 including silica particles, surface modification of silica particles, prepolymer blend composition, weight fraction of silica particles to prepolymer blend, wt % of photoinitiator, % solids of final coating solution, and surface additive wt % (where applicable). For examples 71-77, 0.006 wt. % HFPO was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Example 78

Preparation of Surface Modified 75 nm Silica Particles:

The 75 nm silica was surface modified as described for Example 71-77, except a molar ratio of 75:25 (MPS:A1230) was used. The resulting solids content was 44.64 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For example 78, 0.1 wt. % Tegorad 2300 was added as a surface additive. A 1:1 mixture of 1-methoxy-2-propanol and isopropyl alcohol was used as the diluting solvent in the coating solution.

Coating the Solution:

The solution was coated as discussed above in "General coating process". The coating specifics are listed in Tables 9 and 10, including the coating width, web speed, coating solution flow rate, and the concentration of oxygen present during the curing process.

Example 79

Preparation of Surface Modified 75 nm Silica Particles:

The 75 nm silica was surface modified as described in Examples 71-77. The resulting solids content was from 40 to 50 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For example 79, 0.034 wt. % Tegorad 2300 was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Example 80

Preparation of Surface Modified 75 nm Silica Particles:

The 75 nm silica was surface modified as described for Example 71-77, except a molar ratio of 75:25 (MPS:A1230) was used. The resulting solids content was 44.64 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For example 80, 0.1 wt. % Tegorad 2300 was added as a surface additive. A 1:1 mixture of 1-methoxy-2-propanol and isopropyl alcohol was used as the diluting solvent in the coating solution.

Coating the Solution:

The solution was coated as discussed above in "General coating process". The coating specifics are listed in Tables 9 and 10, including the coating width, web speed, coating solution flow rate, and the concentration of oxygen present during the curing process.

Example 81

Preparation of Surface Modified 75 nm Silica Particles:

The 75 nm silica was surface modified (75:25 MPS: A1230 molar ratio) as follows. 1-methoxy-2-propanol (450 grams), MPS (4.53 grams), A1230 (3.03 grams), and radical inhibitor solution (0.2 gram of a 5% solution in DI water) were mixed with a dispersion of spherical silica submicrometer particles (400.03 grams with a silica content of 40.52%; NALCO 2329) while stirring. The solution was sealed and heated to 80° C. and held at temperature for 16 hours in a 1 liter glass jar. The water and 1-methoxy-2-propanol were removed from the mixture via rotary evaporation to obtain a powder. A portion of the powder (48.01 grams) was dispersed in 1-methoxy-2-propanol (51.61 grams) and D.I. water (7.04 grams). The mixture was charged to a 118.3 ml (4 oz.) glass jar and processed for 43 minutes (level 90, 50% power) using an ultrasonic processor (obtained from Sonic and Materials Inc., Newtown, Conn.; equipped with a probe under the trade designation "SM 07 92")). The solution was filtered with 1 micrometer filter. The resulting solids content was 42.37 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Examples 82-83

Preparation of Surface Modified 75 nm Silica Particles:
The same particle solution was used as in Example 81. The resulting solids content was 42.37 wt %.
Preparation of Radiation Curable Coating Solution:
The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 82-83, 0.094 wt % HFPO was added as a surface additive.
Coating the Solution:
The solution was coated as discussed above in "General coating process". The coating specifics are listed in Tables 9 and 10, including the coating width, web speed, coating solution flow rate, and the concentration of oxygen present during the curing process.

Example 84

Preparation of Surface Modified 75 nm Silica Particles:
The same particle solution was used as in Example 81. The resulting solids content was 42.37 wt %.
Preparation of Radiation Curable Coating Solution:
The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).
Coating the Solution:
The solution was coated as discussed above in "General coating process". The coating specifics are listed in Tables 9 and 10, including the coating width, web speed, coating solution flow rate, and the concentration of oxygen present during the curing process.

Examples 85-86

Typical Preparation of Surface Modified 100 nm Silica Particles:
The 100 nm silica was surface modified (75:25 MPS:A1230 molar ratio) as follows. 1-methoxy-2-propanol (452 grams), of MPS (4.78 grams), A1230 (3.21 grams), and radical inhibitor solution (0.06 gram of as 5% solution in DI water) were mixed with a dispersion of spherical silica submicrometer particles (399.9 grams with a silica content of 42.9; MP1040) while stirring. The solution was sealed and heated to 80° C. and held at temperature for 16 hours in a 1 liter glass jar. The water and 1-methoxy-2-propanol were removed from the mixture via rotary evaporation to obtain a powder. A portion of the powder (169.33 grams) was dispersed in 1-methoxy-2-propanol (185.10 grams), and D.I. water (21.95 grams). The mixture was charged to a 473 ml (16 oz.) glass jar and processed for 63 minutes (level 90, 50% power) using an ultrasonic processor. The solution was filtered with 1 micrometer filter. The resulting solids content was 41.69 wt %.
Preparation of Radiation Curable Coating Solution:
The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).
Coating the Solution:
The solution was coated as discussed above in "General coating process". The coating specifics are listed in Tables 9 and 10, including the coating width, web speed, coating solution flow rate, and the concentration of oxygen present during the curing process.

Examples 87-88

Preparation of Surface Modified 100 nm Silica Particles:
The same particle solution was used as in Examples 85-86. The resulting solids content was 41.69 wt. %.
Preparation of Radiation Curable Coating Solution:
The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).
Coating the Solution:
The solution was coated as discussed above in "General coating process". The coating specifics are listed in Tables 9 and 10, including the coating width, web speed, coating solution flow rate, and the concentration of oxygen present during the curing process.

Example 89-90

Preparation of Surface Modified 100 nm Silica Particles:
The 100 nm silica was surface modified as described for Examples 85-86. The resulting solids content was 42.08 wt. %.
Preparation of Radiation Curable Coating Solution:
The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 89-90, 0.057 wt. % HFPO was added as a surface additive.
Coating the Solution:
The solution was coated as discussed above in "General coating process". The coating specifics are listed in Tables 9 and 10, including the coating width, web speed, coating solution flow rate, and the concentration of oxygen present during the curing process.

Example 91-92

Preparation of Surface Modified 115 nm Silica Particles:
The 115 nm silica was surface modified (50:50 MPS:A1230 molar ratio) as follows. 1-methoxy-2-propanol (450 grams), MPS (3.51 grams), A1230 (7.23 grams), and radical inhibitor solution (0.12 gram of a 5% solution in DI water) were mixed with a dispersion of spherical silica submicrometer particles (400.03 grams with a silica content of 47.47%; NALCO 2329Plus) while stirring. The solution was sealed and heated to 80° C. and held at temperature for 16 hours in a 1 liter glass jar. The water and 1-methoxy-2-propanol were removed from the mixture via rotary evaporation to obtain a powder. A portion of the powder (100.06 grams) was dispersed in 1-methoxy-2-propanol (110.98 grams) and D.I. water (11.59 grams). The mixture was charged to a 473.2 ml (16 oz.) glass jar and processed for 63 minutes (level 90, 50% power) using an ultrasonic processor. The resulting solids content was 43.14 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Examples 93-94

Typical Preparation of Surface Modified 115 nm Silica Particles:

The same particle solution was used as in Examples 91-92. The resulting solids content was 43.14 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Example 95

Preparation of Surface Modified 115 nm Silica Particles:

The 115 nm silica was surface modified (100:0 MPS: A1230 molar ratio) as follows. 1-methoxy-2-propanol (676.17 grams), MPS (10.59 grams), and radical inhibitor solution (0.32 gram of a 5% solution in DI water) were mixed with a dispersion of spherical silica submicrometer particles (600.34 grams with a silica content of 47.47%; "Nalco 2329Plus") while stirring. The solution was sealed and heated to 94° C. and held at temperature for 16 hours in 2000 ml RB flask fitted with a reflux condenser and a mechanical stirrer. The water and 1-methoxy-2-propanol were removed from the mixture via rotary evaporation to obtain a powder. The powder (99.75 gram) was dispersed in -methoxy-2-propanol (89.22 grams) and D.I. water (12.01 grams). The mixture was charged to a liter glass jar and processed for 43 minutes (level 90, 50% power) using an ultrasonic processor. The solution was filtered with 1 micrometer filter. The resulting solids content was 39.95 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Examples 96-97

Typical Preparation of Surface Modified 190 nm Silica Particles:

The 190 nm silica was surface modified (100:0 MPS: A1230 molar ratio) as follows. 1-methoxy-2-propanol (451.56 grams), MPS (8.72 grams), and radical inhibitor solution (0.22 gram of a 5% solution in DI water) were mixed with a dispersion of spherical silica submicrometer particles (400.01 grams with a silica content of 44.15%; MP2040") while stirring. The solution was sealed and heated to 93° C. and held at temperature for 16 hours in 1000 ml RB flask fitted with a reflux condenser and a mechanical stirrer. The water and 1-methoxy-2-propanol were removed from the mixture via rotary evaporation to obtain a powder. The powder (187.21 gram) was dispersed in -methoxy-2-propanol (201.34 grams) and D.I. water (27.44 grams). The mixture was charged to a liter glass jar and processed for 43 minutes (level 90, 50% power) using an ultrasonic processor. The solution was filtered with 1 micrometer filter. The resulting solids content was 41.99 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 96-97, 0.04 wt. % Tegorad 2250 was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Example 98

Preparation of Surface Modified 190 nm Silica Particles:

The 190 nm silica was surface modified (100:0 MPS: A1230 molar ratio) as described for Examples 96-97. The resulting solids content was 41.47 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Example 99

Preparation of Surface Modified 190 nm Silica Particles:

Two batches of 190 nm silica were used that were surface modified (100:0 MPS:A1230 molar ratio) as described for Examples 96-97. The resulting solids contents were 41.02 and 41.86 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Examples 100-107

Preparation of Surface Modified 190 nm Silica Particles:

The 190 nm silica was surface modified (100:0 MPS: A1230 molar ratio) as described for Examples 96-97. The resulting solids content was 44.45 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 100-107, 0.025 wt. % HFPO was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Examples 108-111

Preparation of Surface Modified 190 nm Silica Particles:

The 190 nm silica was surface modified (100:0 MPS: A1230 molar ratio) as described for Examples 96-97. The resulting solids content was 40.92 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 108-111, 0.025 wt. % HFPO was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Examples 112-115

Preparation of Surface Modified 190 nm Silica Particles:

The 190 nm silica was surface modified (100:0 MPS: A1230 molar ratio) as described for Examples 96-97. The resulting solids content was 44.18 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For examples 112-115, 0.025 wt. % HFPO was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Examples 116-118

Preparation of Surface Modified 190 nm Silica Particles:

The 190 nm silica was surface modified (100:0 MPS: A1230 molar ratio) as described for Example 96-97. The resulting solids content was 44.45 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Example 119

Preparation of Surface Modified 190 nm Silica Particles:

The 190 nm silica was surface modified (100:0 MPS: A1230 molar ratio) as described for Examples 96-97. The resulting solids content was 44.27 wt. %.

Preparation of Radiation Curable Coating Solution:

The coating solution was prepared as discussed above in "General preparation of radiation curable coating solution" and according to the specifics in Tables 9 and 10 including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Example 120

Preparation of Surface Modified 190 nm Silica Particles:

The 190 nm silica was surface modified (100:0 MPS: A1230 molar ratio) as described for Examples 96-97. The resulting solids content was 44.27 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For example 120, 0.034 wt. % HFPO was added as a surface additive.

Coating the Solution:

The solution was coated as discussed above in "General coating process". The coating specifics are listed in Tables 9 and 10, including the coating width, web speed, coating solution flow rate, and the concentration of oxygen present during the curing process.

Example 121

Preparation of Surface Modified 190 nm Silica Particles:

The 190 nm silica was surface modified (100:0 MPS: A1230 molar ratio) as described for Examples 96-97. The resulting solids content was 45.49 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable). For example 121, 0.093 wt. % HFPO was added as a surface additive. A 1:1 mixture of 1-methoxy-2-propanol and methyl ethyl ketone was used as the diluting solvent in the coating solution.

Coating the Solution:

The solution was coated as discussed above in "General coating process". The coating specifics are listed in Tables 9 and 10, including the coating width, web speed, coating solution flow rate, and the concentration of oxygen present during the curing process.

Examples 122-124

Typical Preparation of Surface Modified 440 nm Silica Particles:

The 440 nm silica was surface modified (100:0 MPS: A1230 molar ratio) as follows. 1-methoxy-2-propanol (450 grams), MPS (3.82 grams), and radical inhibitor solution (0.36 gram of a 5% solution in DI water) were mixed with a dispersion of spherical silica submicrometer particles (401 grams with a silica content of 45.7 wt. %; MP4540) while stirring. The solution was sealed and heated to 98° C. and held at temperature for 16 hours in a 1000 ml RB flask fitted with a reflux condenser and mechanical stirrer. The water and 1-methoxy-2-propanol were removed from the mixture via rotary evaporation to obtain a dry powder. The powder (192.17 grams) was dispersed in 1-methoxy-2-propanol (206.73 grams) and D. I. water (28.19 grams). The mixture was charged to a 1 liter glass jar and processed for 63 minutes (level 90, 50% power) using an ultrasonic processor. The solution was filtered with a 5 micrometer filter. The resulting solids content was 43.84 wt. %.

Preparation of Radiation Curable Coating Solution:

The coating solution was prepared as discussed above in "General preparation of radiation curable coating solution" and according to the specifics in Tables 9 and 10, including silica particles, surface modification of silica particles, prepolymer blend composition, weight fraction of silica particles to prepolymer blend, wt % of photoinitiator, % solids of final coating solution, and surface additive wt % (where applicable).

Coating the Solution:

The solution was coated as discussed above in "General coating process". The coating specifics are listed in Tables 9 and 10, including the coating width, web speed, coating solution flow rate, and the concentration of oxygen present during the curing process.

Characterization of the Articles

Tables 10 and 11 report measured properties for substrates having a nanostructured surface, before and after metallization. In Table 10, the reflectance of the substrate front (nanostructured) surface was measured by Reflectance Test Method 1. In Table 11, the method used for determining the reflectance of the interface between the metallization and the substrate nanostructured surface was Reflectance Test Method 4. The method used for determining the reflectance of the exposed surface of a metallization on a substrate was Reflectance Test Method 6. The nanostructure depth for Examples 98-103, 110, and 111 was measured by AFM. In the AFM method for determining the nanostructure depth, elevation data over a leveled area of 5 micrometers by 5 micrometers was analyzed. In order to generate a single figure to describe the nanostructure depth, the elevation range associated with approximately 99% of the sampled area (i.e., removing outlier extremes in protrusion height and nanostructure depth) was taken as the nanostructure depth. For Examples 90, 113-115 the nanostructure depth was taken to be the depth measured by TEM of the Ag penetration into the nanostructured surface. The Ag thickness of Examples 90, 113-115 was measured by TEM. The Ag thickness of the remainder of the examples was measured by standard profilometry techniques, on the metal deposited on a witness glass slide that was present during the metallization of the nanostructured surfaces. Table 12 reports results of measurement of metal overlayer thickness and penetration by cross-sectional transmission electron microscopy, for Examples 113-115. Metal overlayer thickness is the thickness of metal that overcoats the surface asperities (e.g., protrusive particles) of the nanostructured surface. Metal penetration is the distance (measured essentially normal to the nanostructured major substrate surface; i.e., essentially a vertical distance) from a surface asperity (e.g., protrusive particle) to the deepest extent of metal that is disposed next to the asperity.

TABLE 9

Composition & experimental parameters for Structured Particle Coating substrates

| Example # | Substrate | Coating width (in) | Web Speed (ft/min) | Flow Rate (cc/min) | % Solids | Silica Particles | Surface modification |
|---|---|---|---|---|---|---|---|
| C3 | PET-6 | — | — | — | — | — | — |
| 69 | PET-2 | 4 | 10 | 5.25 | 40 | 20 nm | MPS |
| 70 | PET-2 | 4 | 10 | 5.25 | 40 | 20 nm | MPS |
| 71 | PET-3 | 4 | 10 | 5.25 | 40 | 75 nm | MPS |
| 72 | PET-3 | 4 | 10 | 5.25 | 40 | 75 nm | MPS |
| 73 | PET-3 | 4 | 10 | 5.25 | 40 | 75 nm | MPS |
| 74 | PET-3 | 4 | 10 | 5.25 | 40 | 75 nm | MPS |
| 75 | PET-3 | 4 | 10 | 5.25 | 40 | 75 nm | MPS |
| 76 | PET-3 | 4 | 10 | 5.25 | 40 | 75 nm | MPS |
| 77 | PET-3 | 4 | 10 | 5.25 | 40 | 75 nm | MPS |
| 78 | TAC | 4 | 50 | 18 | 40 | 75 nm | MPS |
| 79 | PET-4 | 4 | 20 | 5.5 | 40 | 75 nm | MPS/A1230 75:25 |
| 80 | PET-2 | 4 | 50 | 18 | 40 | 75 nm | MPS/A1230 75:25 |
| 81 | PET-5 | 4 | 10 | 5.25 | 40 | 75 nm | MPS/A1230 75:25 |
| 82 | PET-5 | 4 | 10 | 2.62 | 40 | 75 nm | MPS/A1230 75:25 |
| 83 | PET-5 | 4 | 10 | 3.00 | 40 | 75 nm | MPS/A1230 75:25 |
| 84 | PET-5 | 4 | 10 | 5.3 | 40 | 75 nm | MPS/A1230 75:25 |
| 85 | PET-5 | 4 | 10 | 5.25 | 40 | 100 nm | MPS/A1230 75:25 |
| 86 | PET-5 | 4 | 10 | 3.0 | 40 | 100 nm | MPS/A1230 75:25 |
| 87 | PET-5 | 4 | 10 | 2.65 | 40 | 100 nm | MPS/A1230 75:25 |
| 88 | PET-5 | 4 | 10 | 5.25 | 40 | 100 nm | MPS/A1230 75:25 |
| 89 | PET-6 | 8 | 10 | 5.25 | 40 | 100 nm | MPS/A1230 75:25 |
| 90 | PET-6 | 8 | 10 | 10 | 40 | 100 nm | MPS/A1230 50:50 |
| 91 | PET-5 | 4 | 10 | 2.62 | 40 | 115 nm | MPS/A1230 50:50 |
| 92 | PET-5 | 4 | 10 | 5.25 | 40 | 115 nm | MPS/A1230 50:50 |
| 93 | PET-5 | 4 | 10 | 3.00 | 40 | 115 nm | MPS/A1230 50:50 |
| 94 | PET-5 | 4 | 10 | 3.00 | 40 | 115 nm | MPS/A1230 50:50 |
| 95 | PET-5 | 4 | 10 | 2.62 | 40 | 115 nm | MPS |
| 96 | PET-2 | 4 | 10 | 5 | 40 | 190 nm | MPS |
| 97 | PET-2 | 4 | 10 | 2.5 | 40 | 190 nm | MPS |
| 98 | PET-2 | 4 | 10 | 2.625 | 40 | 190 nm | MPS |
| 99 | PET-5 | 4 | 10 | 2.65 | 40 | 190 nm | MPS |
| 100 | PET-3 | 4 | 10 | 2.625 | 40 | 190 nm | MPS |
| 101 | PET-3 | 4 | 10 | 2.625 | 40 | 190 nm | MPS |
| 102 | PET-3 | 4 | 10 | 2.625 | 40 | 190 nm | MPS |
| 103 | PET-3 | 4 | 10 | 4 | 40 | 190 nm | MPS |
| 104 | PET-3 | 4 | 10 | 2 | 40 | 190 nm | MPS |
| 105 | PET-3 | 4 | 10 | 2 | 40 | 190 nm | MPS |
| 106 | PET-3 | 4 | 10 | 2 | 40 | 190 nm | MPS |
| 107 | PET-3 | 4 | 10 | 2 | 40 | 190 nm | MPS |
| 108 | PET-3 | 4 | 10 | 5.25 | 40 | 190 nm | MPS |
| 109 | PET-3 | 4 | 10 | 4 | 40 | 190 nm | MPS |
| 110 | PET-3 | 4 | 10 | 2.625 | 40 | 190 nm | MPS |
| 111 | PET-6 | 4 | 10 | 4 | 40 | 190 nm | MPS |
| 112 | PET-6 | 8 | 25 | 14 | 40 | 190 nm | MPS |
| 113 | PET-6 | 8 | 25 | 14 | 40 | 190 nm | MPS |
| 114 | PET-6 | 8 | 25 | 14 | 40 | 190 nm | MPS |
| 115 | PET-6 | 8 | 25 | 14 | 40 | 190 nm | MPS |
| 116 | PC | 4 | 10 | 5 | 40 | 190 nm | MPS |
| 117 | PC | 4 | 10 | 4 | 40 | 190 nm | MPS |
| 118 | PC | 4 | 10 | 5 | 40 | 190 nm | MPS |
| 119 | PET-8 | 4 | 10 | 2.65 | 40 | 190 nm | MPS |
| 120 | PET-8 | 4 | 10 | 2.65 | 40 | 190 nm | MPS |
| 121 | PET-6 | 8 | 25 | 18.00 | 40 | 190 nm | MPS |
| 122 | PET-7 | 4 | 10 | 2.62 | 43.84 | 440 nm | MPS |
| 123 | PET-7 | 4 | 10 | 5.25 | 43.84 | 440 nm | MPS |
| 124 | PET-7 | 4 | 10 | 5.25 | 43.84 | 440 nm | MPS |

TABLE 10

Composition, experimental parameters and data for nanostructured Structured Particle Coating substrates

| Example # | Prepolymer blend in 40:40:20 wt. ratio | Wt % NP/ Monomer | Vol % NP/ Monomer | % Initiator (IR 184) | Additive | O$_2$ (ppm) | % R substrate front surface | % T | % H |
|---|---|---|---|---|---|---|---|---|---|
| C3 | — | — | — | — | — | — | 6.56 | 92.1 | 0.78 |
| 69 | SR295/SR238/SR506 | 80/20 | 68.8/31.3 | 3 | — | 2200 | 2.63 | 96.3 | 1.26 |
| 70 | SR295/SR238/SR506 | 80/20 | 68.8/31.3 | 3 | — | 10000 | 2.62 | 96.1 | 1.37 |
| 71 | SR295/SR238/SR506 | 75/25 | 62.3/37.7 | 3 | 0.006% HFPO | 40 | 4.06 | 90.3 | 0.72 |
| 72 | SR295/SR238/SR506 | 75/25 | 62.3/37.7 | 3 | 0.006% HFPO | 670 | 3.49 | 91.6 | 0.48 |
| 73 | SR295/SR238/SR506 | 75/25 | 62.3/37.7 | 3 | 0.006% HFPO | 1800 | 2.14 | 92.2 | 0.42 |

TABLE 10-continued

Composition, experimental parameters and data for nanostructured Structured Particle Coating substrates

| Example # | Prepolymer blend in 40:40:20 wt. ratio | Wt % NP/ Monomer | Vol % NP/ Monomer | % Initiator (IR 184) | Additive | O₂ (ppm) | % R substrate front surface | % T | % H |
|---|---|---|---|---|---|---|---|---|---|
| 74 | SR295/SR238/SR506 | 75/25 | 62.3/37.7 | 3 | 0.006% HFPO | 4050 | 2.20 | 93.3 | 0.54 |
| 75 | SR295/SR238/SR506 | 75/25 | 62.3/37.7 | 3 | 0.006% HFPO | 6100 | 2.40 | 92.9 | 1.04 |
| 76 | SR295/SR238/SR506 | 75/25 | 62.3/37.7 | 3 | 0.006% HFPO | 8500 | 2.36 | 92.7 | 1.68 |
| 77 | SR295/SR238/SR506 | 75/25 | 62.3/37.7 | 3 | 0.006% HFPO | 10000 | 2.49 | 92.7 | 2.84 |
| 78 | SR295/SR238/SR506 | 75/25 | 62.3/37.7 | 3 | 0.1% Tegorad2300 | 2000 | 1.52 | 95.8 | 0.92 |
| 79 | SR295/SR238/SR506 | 75/25 | 62.3/37.7 | 3 | 0.034% HFPO | 4150 | 1.78 | 94.5 | 0.90 |
| 80 | SR492/SR238/SR440 | 75/25 | 61.1/38.9 | 3 | 0.1% Tegorad2300 | 4400 | 1.70 | 94.0 | 0.45 |
| 81 | SR492/SR238/SR440 | 70/30 | 54.9/45.1 | 3 | — | 770 | 1.81 | 96.4 | 0.71 |
| 82 | SR492/SR238/SR440 | 70/30 | 54.9/45.1 | 3 | 0.093% HFPO | 55 | 3.18 | 95.3 | 0.91 |
| 83 | SR492/SR238/SR440 | 70/30 | 54.9/45.1 | 3 | 0.093% HFPO | 816 | 1.87 | 96.3 | 1.36 |
| 84 | SR492/SR238/SR440 | 70/30 | 54.9/45.1 | 3 | — | 9040 | 2.52 | 95.7 | 12.1 |
| 85 | SR492/SR238/SR440 | 70/30 | 54.9/45.1 | 3 | — | 700 | 2.03 | 96.1 | 0.83 |
| 86 | SR492/SR238/SR440 | 70/30 | 54.9/45.1 | 3 | — | 725 | 1.96 | 96.1 | 0.84 |
| 87 | SR492/SR238/SR440 | 67.5/32.5 | 52.1/47.9 | 3 | — | 900 | 1.84 | 96.4 | 1.17 |
| 88 | SR492/SR238/SR440 | 67.5/32.5 | 52.1/47.9 | 3 | — | 950 | 1.78 | 96.4 | 1.26 |
| 89 | SR492/SR238/SR440 | 67.5/32.5 | 52.1/47.9 | 3 | 0.057% HFPO | 730 | 1.93 | 93.8 | 0.99 |
| 90 | SR492/SR238/SR440 | 67.5/32.5 | 52.1/47.9 | 3 | 0.057% HFPO | 730 | 1.79 | 93.5 | 1.57 |
| 91 | SR492/SR238/SR440 | 70/30 | 49.3/50.7 | 1 | — | 800 | 1.68 | 96.2 | 1.59 |
| 92 | SR492/SR238/SR440 | 70/30 | 49.3/50.7 | 1 | — | 800 | 1.73 | 96.1 | 1.53 |
| 93 | SR492/SR238/SR440 | 70/30 | 49.3/50.7 | 3 | — | 780 | 1.83 | 96.0 | 1.27 |
| 94 | SR492/SR238/SR440 | 70/30 | 49.3/50.7 | 3 | — | 2030 | 1.65 | 96.2 | 1.82 |
| 95 | SR295/SR238/SR506 | 70/30 | 56.2/43.8 | 3 | — | 2150 | 2.13 | 95.9 | 1.80 |
| 96 | SR295/SR238/SR506 | 65/35 | 50.5/49.5 | 1 | 0.04% Tegorad2250 | 800 | 1.46 | 93.9 | 2.04 |
| 97 | SR295/SR238/SR506 | 57.5/42.5 | 50.5/49.5 | 1 | 0.04% Tegorad2250 | 2600 | 1.17 | 94.3 | 2.65 |
| 98 | SR295/SR238/SR506 | 65/35 | 50.5/49.5 | 1 | — | 2900 | 1.57 | 94.0 | 1.30 |
| 99 | SR295/SR238/SR506 | 65/35 | 50.5/49.5 | 1 | — | 5100 | 1.71 | 95.8 | 2.32 |
| 100 | SR295/SR238/SR506 | 65/35 | 50.5/49.5 | 1 | 0.025% HFPO | 40 | 4.07 | 91.8 | 0.71 |
| 101 | SR295/SR238/SR506 | 65/35 | 50.5/49.5 | 1 | 0.025% HFPO | 3800 | 1.57 | 93.3 | 1.75 |
| 102 | SR295/SR238/SR506 | 65/35 | 50.5/49.5 | 1 | 0.025% HFPO | 17600 | 1.33 | 92.8 | 1.91 |
| 103 | SR295/SR238/SR506 | 65/35 | 50.5/49.5 | 1 | 0.025% HFPO | 17600 | 1.38 | 93.3 | 2.79 |
| 104 | SR295/SR238/SR506 | 65/35 | 50.5/49.5 | 1 | 0.025% HFPO | 2050 | 1.66 | 93.2 | 1.32 |
| 105 | SR295/SR238/SR506 | 65/35 | 50.5/49.5 | 1 | 0.025% HFPO | 5800 | 1.38 | 93.7 | 1.71 |
| 106 | SR295/SR238/SR506 | 65/35 | 50.5/49.5 | 1 | 0.025% HFPO | 10000 | 1.52 | 93.4 | 1.76 |
| 107 | SR295/SR238/SR506 | 65/35 | 50.5/49.5 | 1 | 0.025% HFPO | 15800 | 1.29 | 93.7 | 1.80 |
| 108 | SR295/SR238/SR506 | 65/35 | 50.5/49.5 | 1 | 0.025% HFPO | 17600 | 1.56 | 94.4 | 3.07 |
| 109 | SR295/SR238/SR506 | 65/35 | 50.5/49.5 | 1 | 0.025% HFPO | 17600 | 1.55 | 94.3 | 3.24 |
| 110 | SR295/SR238/SR506 | 65/35 | 50.5/49.5 | 1 | 0.025% HFPO | 17600 | 1.52 | 94.5 | 2.66 |
| 111 | SR295/SR238/SR506 | 65/35 | 50.5/49.5 | 1 | 0.025% HFPO | 17600 | 1.44 | 94.8 | 2.31 |
| 112 | SR295/SR238/SR506 | 67.5/32.5 | 53.3/46.7 | 1 | 0.025% HFPO | 9200/6600 | 1.20 | 93.6 | 2.56 |
| 113 | SR295/SR238/SR506 | 67.5/32.5 | 53.3/46.7 | 1 | 0.025% HFPO | 9200/6600 | 1.20 | 93.6 | 2.56 |
| 114 | SR295/SR238/SR506 | 67.5/32.5 | 53.3/46.7 | 1 | 0.025% HFPO | 9200/6600 | 1.20 | 93.6 | 2.56 |
| 115 | SR295/SR238/SR506 | 67.5/32.5 | 53.3/46.7 | 1 | 0.025% HFPO | 9200/6600 | 1.20 | 93.6 | 2.56 |
| 116 | SR295/SR238/SR506 | 67.5/32.5 | 53.3/46.7 | 1 | — | 3900 | 1.30 | 95.2 | 0.90 |
| 117 | SR295/SR238/SR506 | 67.5/32.5 | 53.3/46.7 | 1 | — | 8200 | 1.11 | 95.1 | 1.04 |
| 118 | SR492/SR238/SR440 | 67.5/32.5 | 52.1/47.9 | 1 | — | 8300 | 0.90 | 95.6 | 1.35 |
| 119 | SR492/SR238/SR440 | 65/35 | 49.3/50.7 | 1 | — | 8470 | 1.67 | 94.6 | 2.08 |
| 120 | SR492/SR238/SR440 | 65/35 | 49.3/50.7 | 1 | 0.034% HFPO | 9500 | 1.47 | 94.5 | 3.06 |
| 121 | SR295/SR238/SR506 | 67.5/32.5 | 53.3/46.7 | 1 | 0.093% HFPO | 9200 | 1.30 | 93.6 | 2.89 |
| 122 | SR295/SR238/SR506 | 75/25 | 62.3/37.7 | 1 | — | 9230 | 1.37 | 91.6 | 21.9 |
| 123 | SR295/SR238/SR506 | 75/25 | 62.3/37.7 | 1 | — | 7080 | 1.40 | 91.5 | 19.0 |
| 124 | SR295/SR238/SR506 | 65/35 | 50.5/49.5 | 1 | — | 6300 | 1.66 | 90.8 | 14.0 |

TABLE 11

Measured properties for nanostructured substrates having metal disposed thereon by sputtering

| Example # | % R metal interface with substrate | % R metal exposed surface | σ (Mhos) | σ, PET (Mhos) | Fraction retained σ | Ag thickness (nm) | Nanostructure depth (nm) |
|---|---|---|---|---|---|---|---|
| C3 | 79.8 | 89.9 | — | 4.12 | — | 148 | — |
| 69 | 76.8 | 89.9 | 4.73 | 4.93 | 0.96 | 138 | — |
| 70 | 75.6 | 89.9 | 4.69 | 4.93 | 0.95 | 138 | — |
| 71 | 85.2 | 95.4 | 4.96 | 5.10 | 0.97 | 140 | — |
| 72 | 57.2 | 95.1 | 4.63 | 5.10 | 0.91 | 140 | — |
| 73 | 38.6 | 94.1 | 4.43 | 5.10 | 0.87 | 140 | — |
| 74 | 38.2 | 94.0 | 4.34 | 5.10 | 0.85 | 140 | — |
| 75 | 37.4 | 93.7 | 4.31 | 5.10 | 0.85 | 140 | — |
| 76 | 37.4 | 93.7 | 4.41 | 5.10 | 0.86 | 140 | — |
| 77 | 34.6 | 93.4 | 4.35 | 5.10 | 0.85 | 140 | — |

TABLE 11-continued

Measured properties for nanostructured substrates having metal disposed thereon by sputtering

| Example # | % R metal interface with substrate | % R metal exposed surface | σ (Mhos) | σ, PET (Mhos) | Fraction retained σ | Ag thickness (nm) | Nanostructure depth (nm) |
|---|---|---|---|---|---|---|---|
| 78 | 46.8 | 94.9 | 4.91 | 5.07 | 0.97 | 140 | — |
| 79 | 39.1 | 93.9 | 4.60 | 5.07 | 0.91 | 140 | — |
| 80 | 45.9 | 94.6 | 4.63 | 5.07 | 0.91 | 140 | — |
| 81 | 26.7 | 83.3 | 4.43 | 5.71 | 0.78 | 150 | — |
| 82 | 56.9 | 83.5 | 4.93 | 5.71 | 0.86 | 150 | — |
| 83 | 23.4 | 78.9 | 4.25 | 5.71 | 0.74 | 150 | — |
| 84 | 26.2 | 83.3 | 4.53 | 5.71 | 0.79 | 150 | — |
| 85 | 17.7 | 70.5 | 3.71 | 5.71 | 0.65 | 150 | — |
| 86 | 15.9 | 71.2 | 3.78 | 5.71 | 0.66 | 150 | — |
| 87 | 15.1 | 70.1 | 3.70 | 5.21 | 0.71 | 150 | — |
| 88 | 13.6 | 67.2 | 3.51 | 5.21 | 0.67 | 150 | — |
| 89 | 16.8 | 71.9 | 4.18 | 5.98 | 0.70 | 165 | — |
| 90 | 11.5 | 72.3 | 4.58 | 5.97 | 0.77 | 205 | — |
| 91 | 12.6 | 70.9 | 3.81 | 5.71 | 0.67 | 150 | — |
| 92 | 10.1 | 68.6 | 3.62 | 5.71 | 0.63 | 150 | — |
| 93 | 15.2 | 66.8 | 3.42 | 5.71 | 0.60 | 150 | — |
| 94 | 10.8 | 66.1 | 3.33 | 5.71 | 0.58 | 150 | — |
| 95 | 25.9 | 84.3 | 4.57 | 5.21 | 0.88 | 150 | — |
| 96 | 41.7 | 75.2 | 4.95 | 6.85 | 0.72 | 150 | — |
| 97 | 17.1 | 64.8 | 4.22 | 6.85 | 0.62 | 150 | — |
| 98 | 38.2 | 70.4 | 5.02 | 7.12 | 0.70 | 155 | 162 |
| 99 | 30.1 | 77.3 | 5.37 | 7.37 | 0.73 | 185 | 124 |
| 100 | 84.4 | 95.4 | 6.24 | 6.18 | 1.01 | 175 | 32 |
| 101 | 37.6 | 77.3 | 4.21 | 6.18 | 0.68 | 175 | 150 |
| 102 | 22.2 | 69.2 | 3.73 | 6.18 | 0.60 | 175 | 187 |
| 103 | 18.7 | 65.6 | 3.39 | 6.18 | 0.55 | 175 | 215 |
| 104 | 45.2 | 77.5 | 4.42 | 6.18 | 0.72 | 175 | — |
| 105 | 35.3 | 69.5 | 4.06 | 6.18 | 0.66 | 175 | — |
| 106 | 28.2 | 70.6 | 3.89 | 6.18 | 0.63 | 175 | — |
| 107 | 23.2 | 70.6 | 3.88 | 6.18 | 0.63 | 175 | — |
| 108 | 17.8 | 60.3 | 2.33 | 5.10 | 0.46 | 140 | — |
| 109 | 17.1 | 60.9 | 2.41 | 5.10 | 0.47 | 140 | — |
| 110 | 17.6 | 62.3 | 2.54 | 5.10 | 0.50 | 140 | 132 |
| 111 | 15.8 | 59.3 | 2.22 | 5.10 | 0.44 | 140 | 185 |
| 112 | 18.7 | 60.1 | 2.45 | 5.10 | 0.48 | 140 | — |
| 113 | 19.3 | 68.4 | 2.77 | 4.58 | 0.61 | 134 | 116 |
| 114 | 13.6 | 56.5 | 1.86 | 4.12 | 0.45 | 147 | 142 |
| 115 | 13.0 | 60.5 | 3.19 | 5.37 | 0.59 | 185 | 120 |
| 116 | 41.7 | 84.6 | 4.68 | 6.18 | 0.76 | 175 | |
| 117 | 30.9 | 84.2 | 4.65 | 6.18 | 0.75 | 175 | — |
| 118 | 17.2 | 66.7 | 3.69 | 6.18 | 0.60 | 175 | — |
| 119 | 15.9 | 68.7 | 3.62 | 5.71 | 0.63 | 152 | — |
| 120 | 13.1 | 62.6 | 2.98 | 5.71 | 0.52 | 152 | — |
| 121 | 12.0 | 68.2 | 4.27 | 6.00 | 0.71 | 205 | — |
| 122 | 19.8 | 53.6 | 1.47 | 4.93 | 0.30 | 138 | — |
| 123 | 25.6 | 59.8 | 1.98 | 4.93 | 0.40 | 138 | — |
| 124 | 56.1 | 81.3 | 3.55 | 4.93 | 0.72 | 138 | — |

TABLE 12

Dimensional data measured from cross-sectional TEM imaging performed on the metallized articles of Examples 113-115.

| | Example 114 | | Example 115 | | Example 113 | |
|---|---|---|---|---|---|---|
| | Overlayer Thickness | Penetration | Overlayer Thickness | Penetration | Overlayer Thickness | Penetration |
| Average (nm) | 147.5 | 141.5 | 184.6 | 120.1 | 133.9 | 115.9 |
| St Dev (nm) | 15.8 | 78.8 | 11.6 | 46.1 | 16.8 | 47.9 |
| Max (nm) | 212.4 | 540.9 | 206.7 | 239.6 | 164.8 | 201.2 |
| Min (nm) | 131.6 | 59.9 | 147.9 | 44.9 | 109.1 | 61.3 |
| # measurements | 33 | 47 | 46 | 59 | 19 | 12 |

Example 125

A silver-coated, nanostructured substrate was prepared according to Example 112, except that the measured conductance was 1.68 Mhos. The average thickness of the sputtered silver was estimated based upon conductance to be approximately 140 nm. The silver coating was patterned by printing an octadecylthiol self-assembled monolayer mask on its surface, followed by wet chemical etching, as described in U. S. Patent Application US 20090218310 (Ser. No. 12/393,201). The resulting pattern of conductor on the nanostructured substrate included curved traces measuring approximately 2 micrometers in width, forming a pseuodorandom arrangement of mesh cells with open area fraction of approximately 98.5 to 99.0%. The contiguous mesh was measured to have a sheet resistance of 111 ohms per square.

Example 126

Figure 25:
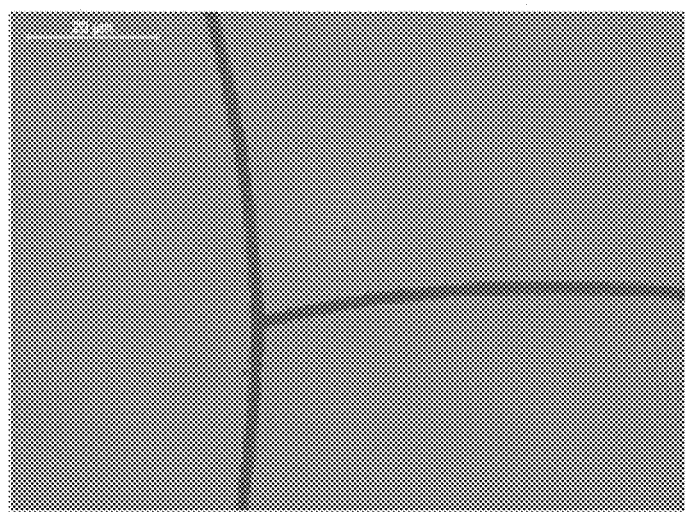
FIG. 25 is a transmission optical photomicrograph of selected traces from the mesh of Example 126.

A silver-coated, nanostructured substrate was prepared according to Example 112, except that the measured conductance was 3.89 Mhos. The average thickness of the sputtered silver was estimated based upon conductance to be approximately 205 nm. The silver coating was patterned by printing an octadecylthiol self-assembled monolayer mask on its surface, followed by wet chemical etching, as described in U.S. Patent Application US 20090218310 (Ser. No. 12/393,201). The resulting pattern of conductor on the nanostructured substrate included curved traces measuring approximately 2 micrometers in width, forming a pseuodorandom arrangement of mesh cells with open area fraction of approximately 98.5 to 99.0%. The contiguous mesh was measured to have a sheet resistance of 56 ohms per square. FIG. 25 is a transmitted light optical photomicrograph illustrating selected traces from the mesh.

Example 127

A silver-coated, nanostructured substrate was prepared according to Example 112, except that the measured conductance was 4.78 Mhos. The average thickness of the sputtered silver was estimated based upon conductance to be approximately 230 nm. The silver coating was patterned by printing an octadecylthiol self-assembled monolayer mask on its surface, followed by wet chemical etching, as described in U.S. Patent Application US 20090218310 (Ser. No. 12/393,201). The resulting pattern of conductor on the nanostructured substrate included curved traces measuring approximately 2 micrometers in width, forming a pseuodorandom arrangement of mesh cells with open area fraction of approximately 98.5 to 99.0%. The contiguous mesh was measured to have a sheet resistance of 38 ohms per square. The nanostructured substrate having a conductor micropattern disposed thereon was measured to have visible light transmittance of 89.5%, transmitted haze of 1.58%, and transmitted light clarity of 99.6%.

Example 128

A transparent sensor element was fabricated using microcontact printing and etching and combined with a touch sensor drive device. The device was integrated with a computer processing unit connected to a display to test the device. The resulting system was able to detect the positions of single or multiple finger touches (e.g., multiple simultaneous touches), which was evidenced graphically on the display.

Formation of a Transparent Sensor Element First Patterned Substrate

A first visible light substrate according to Example 121 above was coated with 205 nanometers of silver using a sputter coater to yield a first silver metalized film. The silver was deposited on the nanostructured surface of the substrate. Before silver was deposited onto the substrate, a titanium adhesion promotion deposit of less than approximately 10 angstroms average thickness was sputter deposited. A first stamp made of poly(dimethylsiloxane), referred to as PDMS and commercially available as product number Sylgard 184, Dow Chemical Co., Midland, Mich., having a thickness of 2.5 millimeters, was molded against a glass plate (sometimes referred to in the industry as a "master") that had previously been patterned with photoresist using standard photolithography techniques. The PDMS was cured on the glass plate. Thereafter, the PDMS was peeled away from the plate to yield a first stamp. The stamp relief pattern was the complement of the photoresist relief pattern. The stamp had two different types of low-density regions with patterns of raised features: a first continuous mesh pattern region type and a first discontinuous mesh pattern region type (i.e., mesh with breaks). That is, the raised features defined the edges of edge-sharing cells of meshes. To thither clarify, the edges of cells making up meshes were defined by ridges of PDMS that protruded away from the surface of the first stamp. The cells had an average size of approximately 300 microns across and were pseudorandom in shape and size. Furthermore, adjacent individual cells did not lie on a repeating array of positions. The edges of the cells, in the form of raised features on the stamp, exhibited curvature in the plane of the overall surface of the stamp. The radius of curvature of different cell edges ranged from approximately 50 microns to approximately 400 microns. The raised features of the stamp in the discontinuous regions included an approximately 5 micron gap along each raised cell edge, approximately midway between vertices at each end of the cell edge. By gap along a raised feature, what is meant is that there was a portion of the raised feature that was absent. Each raised cell edge (i.e., ridge of PDMS) had a height of approximately 2.5 microns. The density (area fraction) of raised cell edges (ridges) in both the first continuous mesh pattern regions and the first discontinuous mesh pattern regions was approximately 1.33 percent, corresponding to 98.67% open area, and the ridges defining cell edges were approximately 2 microns in width. The first stamp also included raised features defining multiple 40 micron wide traces, one each being connected to a first continuous mesh pattern region (as further clarified below in terms of the patterned substrate that results from this stamp). The first stamp had a first structured side that had the pseuodorandom mesh pattern regions and the 40 micron wide traces and an opposing second substantially flat side. The structured side of the stamp was contacted to a 10 millimolar ink solution of 1-octadecanethiol (product number C18H3CS, 97%, commercially available from TCI America, Portland Oreg.) in ethanol for 30 minutes, followed by drying for at least 1 day. For printing, the first silver metalized film was applied using a roller onto the now inked structured surface of the stamp such that the silver film was in direct contact with the structured surface. The metalized film remained on the inked stamp for 10 seconds. Then, the first metalized film was removed from the inked stamp. The removed film was floated (silver metal side down) atop a silver etchant solution for approximately 1 minute with bubbling agitation. The etchant solution contained (i) 0.030 molar thiourea (product number 18636, Sigma-Aldrich, St. Louis, Mo.) and (ii)

0.020 molar ferric nitrate (product number 216828, Sigma-Aldrich) in deionized water. After the etching step, the resulting first substrate was rinsed with deionized water and dried with compressed nitrogen gas to yield a first patterned surface. Where the inked stamp made contact with the silver of the first metalized substrate, the silver remained after etching. Thus, silver was removed from the locations where contact was not made between the inked stamp and silver surface of the metallized film.

Figure 11:
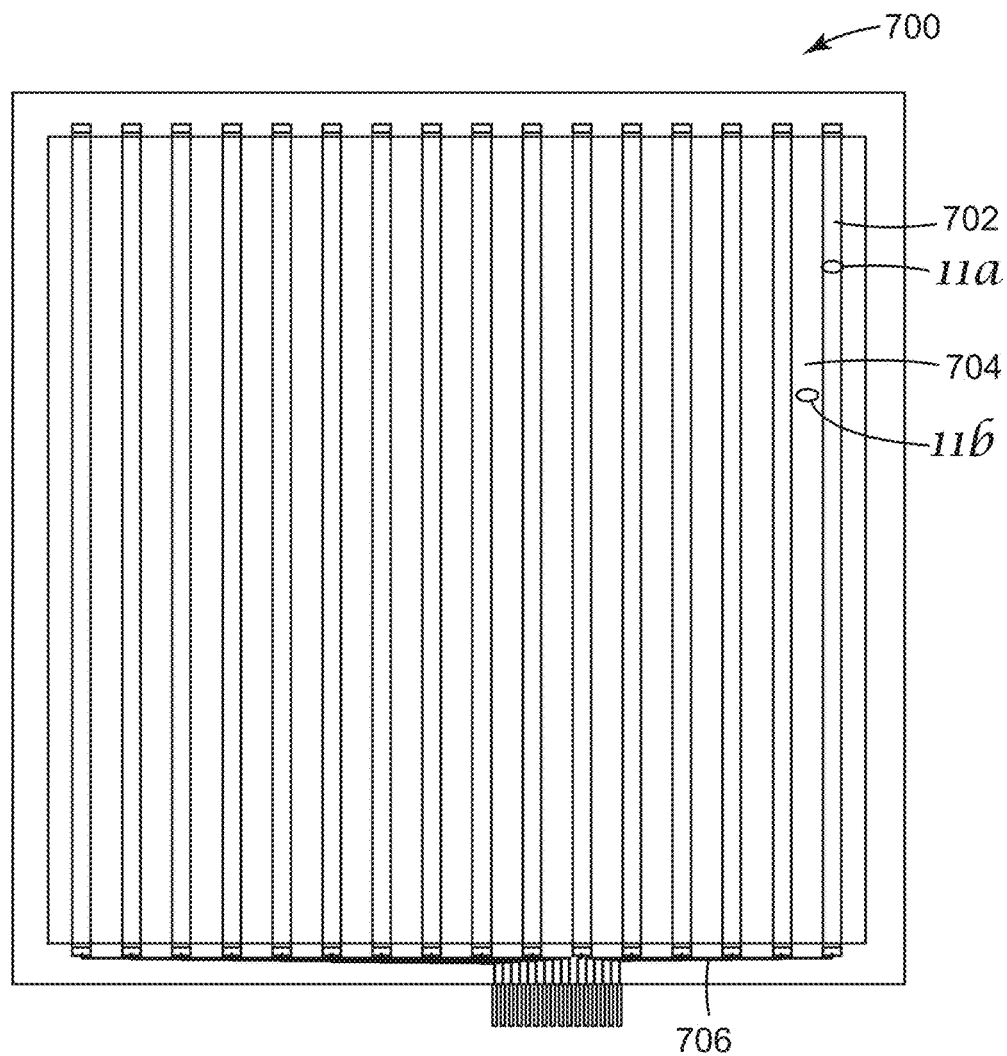
FIGS. 11, 11a and 11b show various portions of a first micropatterned substrate useful for integration into a device, such as a display.
Figure 11A:
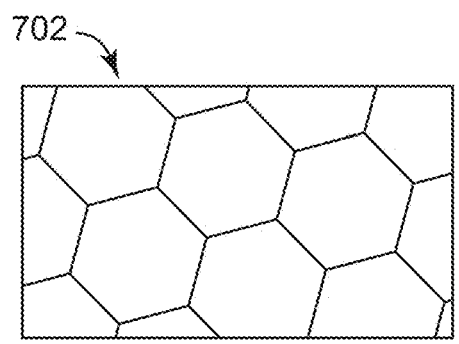
Figure 11B:
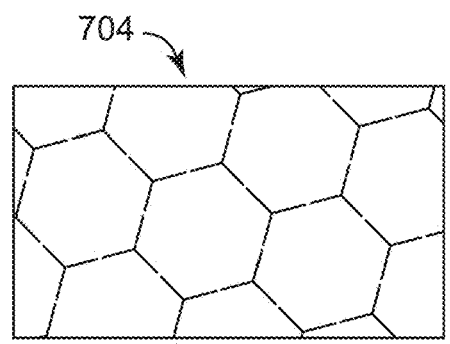

FIG. 11 shows the first patterned substrate 700 schematically (not to scale) having a plurality of first continuous regions 702 alternating between a plurality of first discontinuous regions 704 on a first side of the substrate, which is the side that contained the now etched and patterned silver metallization. The first patterned substrate actually had 11 first continuous regions 702. The first continuous regions 702 had width of approximately 2.2 millimeters, pitch of approximately 4.95 millimeters, and length of approximately 95 millimeters. The substrate had an opposing second side that was substantially bare PET film. Each of the first regions 702 has a corresponding 40 micron wide conductive trace 706 disposed at one end, for making electrical contact to each first continuous region 702. The mesh designs for the first patterned substrate were pseudorandom in shape and size, including curvature for the conductive traces making up the meshes, as noted above (in contrast to the hexagonal mesh designs depicted in FIGS. 11a and 11b).

Formation of a Transparent Sensor Element Second Patterned Substrate

The second patterned substrate was made as the first patterned substrate using a second visible light substrate to produce a second silver metalized film. A second stamp was produced having second continuous mesh pattern regions interposed between second discontinuous mesh pattern region.

Figure 12:
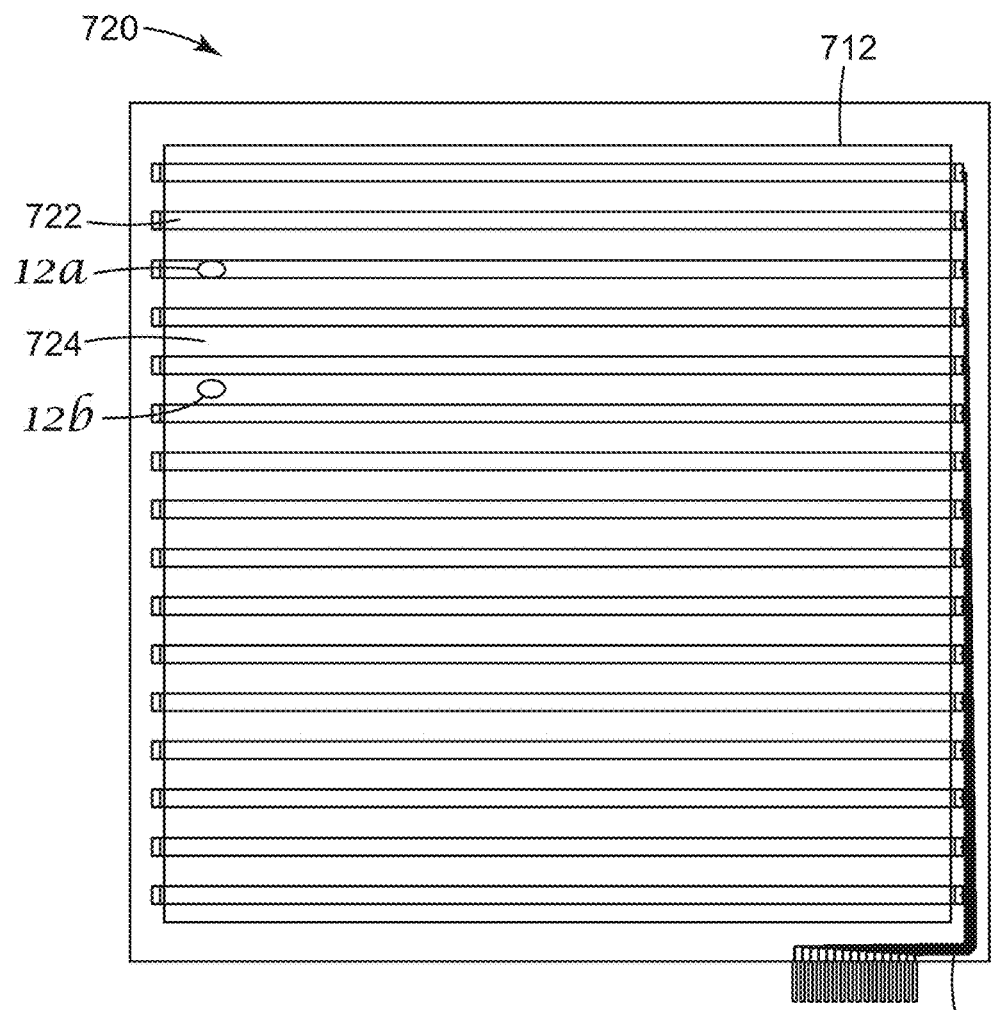
FIGS. 12, 12a and 12b show various portions of a second micropatterned substrate useful for integration into a device, such as a display.
Figure 12A:
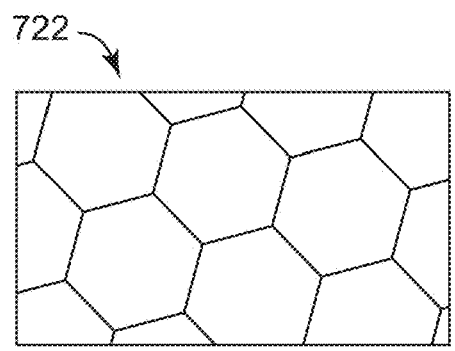
Figure 12B:
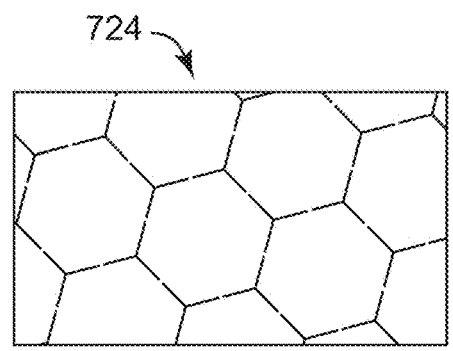

FIG. 12 shows the second patterned substrate 720 schematically (not to scale) having a plurality of second continuous regions 722 alternating between a plurality of second discontinuous regions 724 on a first side of the second substrate, which is the side that contained the now etched and patterned silver metallization. The second patterned substrate actually had 19 first continuous regions 722. The second continuous regions 722 had width of approximately 4.48 millimeters, pitch of approximately 4.93 millimeters, and length of approximately 55 millimeters. Each of the second continuous regions 722 had a corresponding 40 micron wide second conductive trace 726 disposed at one end, for making electrical contact to each second continuous region 722. The mesh designs for the first patterned substrate were pseudorandom in shape and size, including curvature for the conductive traces making up the meshes, as noted above (in contrast to the hexagonal mesh designs depicted in FIGS. 12a and 12b).

Formation of a Projected Capacitive Touch Screen Sensor Element

The first and second patterned substrates made above were used to produce a two-layer projected capacitive touch screen transparent sensor element as follows. The first and second patterned substrates were adhered together using Optically Clear Laminating Adhesive 8271 from 3M Company, St. Paul, Minn. to yield a multilayer constriction. A handheld roller was used to laminate the two patterned substrates with the regions of the first and second conductive trace regions 706 and 726 being adhesive free. The multilayer construction was laminated to a 0.7 mm thick float glass using Optically Clear Laminating Adhesive 8146-3 such that the first side of the first substrate was proximate to the float glass. The adhesive free first and second conductive trace regions 706 and 726 allowed electrical connection to be made to the first and second patterned substrates 700 and 720.

Figure 13:
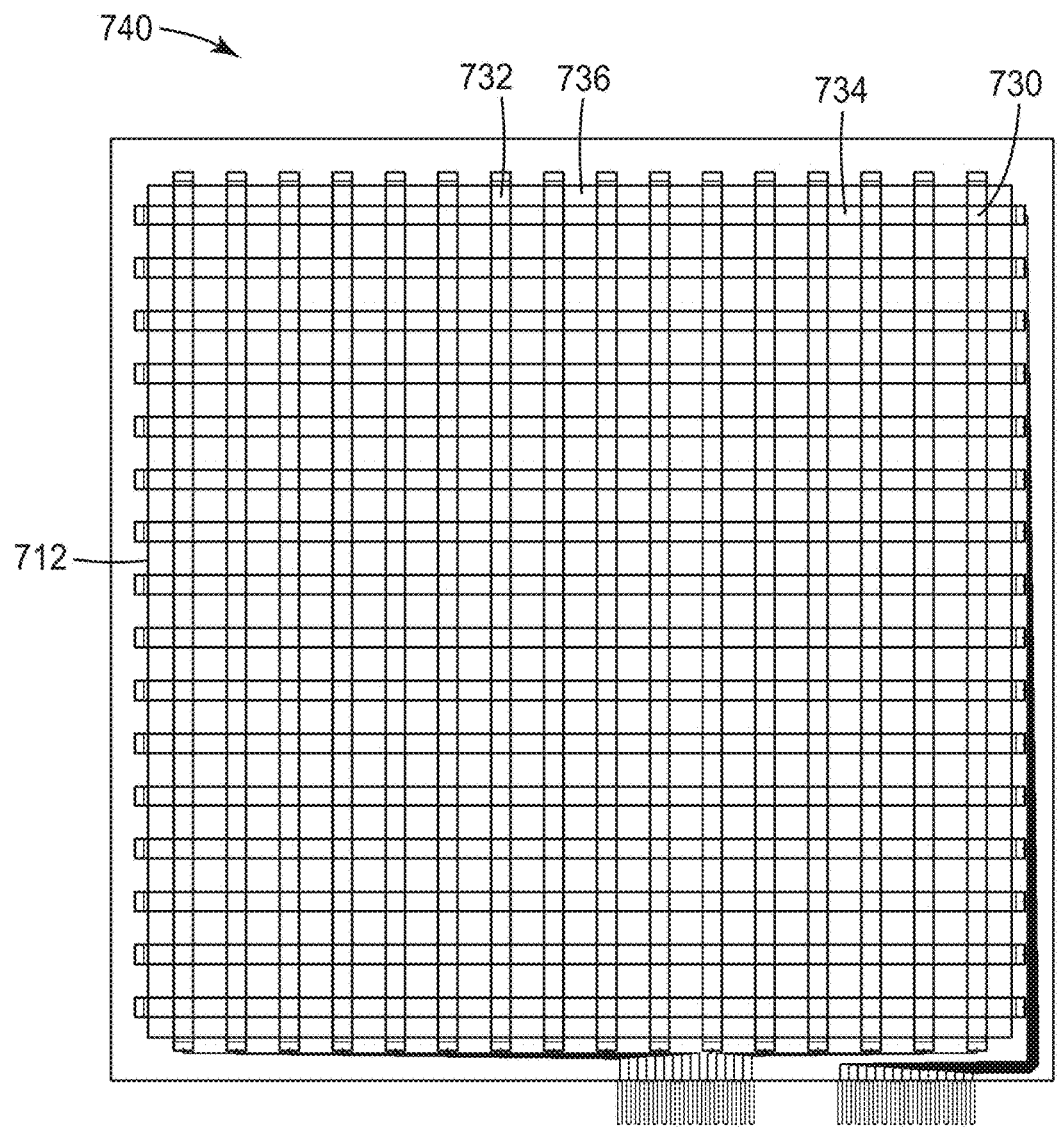
FIG. 13 shows the overlay of the first and second micropatterned substrates that can be integrated into a device.

FIG. 13 shows schematically (not to scale) a top plan view of a multilayer touch screen sensor element 740 where the first and second patterned substrate have been laminated. Region 730 represented the overlap of the first and second continuous regions. Region 732 represented the overlap of the first continuous region and the second discontinuous region. Region 734 represented the overlap of the second continuous region and the first discontinuous region, And, region 736 represented the overlap between the first and second discontinuous regions. While there was a plurality of these overlap regions, for ease of illustration, only one region of each has been depicted in the figure.

Additional Components of the Touch Sensing System

The integrated circuits used to make mutual capacitance measurements of the transparent sensor element were the CY3290-TMA300 TrueTouch™ Dev Kit with revision reference Rev *D, containing an I2C to USB converter bridge and microcontroller TMA350 (commercially available from Cypress Semiconductor, San Jose, Calif.). The TMA350 was configured for the transparent sensor element, as is known in the art. The configuration can vary from touch screen to touch screen, depending on design. in this case, the system could drive 19 different bars and measure 11 different bars. The configuration of the TMA350 included selection of the number of channels to convert, how accurately or quickly to take measurements, the noise and touch thresholds, any digital filtering to be applied and various other settings particular to the CY3290-TMA300. While the measurement from above was running, the microcontroller was also sending the data to a computer with monitor via the TrueTouch™ Bridge, which converts I2C from the TMA350 to USB for the computer interface. This USB interface allows the Cypress TrueTouch™ software to render data from the TMA350 and see how the values were changing between a touch and no touch.

Results of Testing of the Touch Sensing System

The transparent sensor element was connected to the touch sensor drive device. When a finger touch was made to the glass surface, the computer monitor rendered the position of touch that was occurring within the touch sensing region in the form of a color change (black to green) in the corresponding location of the monitor and displayed the location in an adjacent display to simulate the result of the touch screen system. When two, three, and four finger touches were made simultaneously to the glass surface, the computer monitor rendered the positions of touches that were occurring within the touch sensing region in the form of a color change (black to green) in the corresponding locations of the monitor and displayed the location in a touch screen simulation display.

What is claimed is:

1. An article comprising:
   a substrate having a nanostructured first surface and an opposing second surface; and
   a plurality of metallic traces disposed in a micropattern on the first surface of the substrate,
   wherein the metallic traces have a specular reflectance of less than 50% for light normally incident on the article in a direction through the substrate toward the first surface.

2. The article of claim 1, wherein each metallic trace has an average thickness from 0.05 micrometers to 2 micrometers.

3. The article of claim 1, wherein each metallic trace has an average thickness from 0.075 micrometers to 0.5 micrometers.

4. The article of claim 1, wherein the plurality of metallic traces defines a plurality of cells.

5. The article of claim 4, wherein the cells are discontinuous.

6. The article of claim 4, wherein the cells are continuous.

7. The article of claim 1, wherein the nanostructured first surface comprises nanofeatures having a height from 50 to 500 nanometers.

8. The article of claim 7, wherein the nanofeatures have a width from 15 to 200 nanometers, and a lateral spacing from 5 to 500 nanometers.

9. The article of claim 1, wherein the specular reflectance is less than 20%.

10. The article of claim 1, wherein the specular reflectance is less than 10%.

11. The article of claim 1, wherein the micropattern has an open area fraction greater than 80% and each of the metallic traces has a width from 0.5 to 10 micrometers.

12. An article comprising:
a transparent substrate having a nanostructured surface and a metallic conductor disposed on the nanostructured surface, the metallic conductor having an average thickness of greater than 50 nanometers, the nanostructured surface comprising nanofeatures having a height from 50 to 750 nanometers, a width from 15 to 200 nanometers, and a lateral spacing from 5 to 500 nanometers.

13. The article of claim 12, wherein the average thickness of the metallic conductor is in a range of 75 nm to 500 nm.

14. The article of claim 12, wherein the metallic conductor has a specular reflectance of less than 50% for light normally incident on the article in a direction through the transparent substrate toward the nanostructured surface.

15. The article of claim 14, wherein the specular reflectance is less than 20%.

16. The article of claim 14, wherein the specular reflectance is less than 10%.

17. The article of claim 12, wherein the metallic conductor comprises a plurality of traces disposed in a micropattern.

18. The article of claim 17, wherein the micropattern has an open area fraction greater than 80% and each of the traces has a width from 0.5 to 10 micrometers.

19. The article of claim 12, wherein the nanostructured surface comprises a matrix and a nanoscale dispersed phase that comprises nanoparticles having a particle size from 50 nm to 250 nm.

20. The article of claim 19, wherein the nanoparticles are present in the matrix from 40% to 85% by volume.

* * * * *